(12) United States Patent
Uchikoshi et al.

(10) Patent No.: US 7,303,986 B2
(45) Date of Patent: Dec. 4, 2007

(54) SEMICONDUCTOR DEVICE AND A METHOD OF MANUFACTURING THE SAME

(75) Inventors: Ken Uchikoshi, Hitachinaka (JP); Naokatsu Suwanai, Hitachinaka (JP); Atsushi Tachigami, Mito (JP); Katsuhiko Hotta, Hachioji (JP); Masashi Sahara, Hitachinaka (JP); Kazuhiko Sato, Sagamihara (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 59 days.

(21) Appl. No.: 11/602,196

(22) Filed: Nov. 21, 2006

(65) Prior Publication Data

US 2007/0066050 A1    Mar. 22, 2007

Related U.S. Application Data

(63) Continuation of application No. 10/732,518, filed on Dec. 11, 2003, now Pat. No. 7,189,637.

(30) Foreign Application Priority Data

Dec. 13, 2002  (JP)  ............................. 2002-362420

(51) Int. Cl.
H01L 21/4763  (2006.01)

(52) U.S. Cl. ................ 438/623; 438/618; 257/E21.575
(58) Field of Classification Search ................ 438/618, 438/623, 778, 758, 787; 257/E21.575
See application file for complete search history.

(56) References Cited

U.S. PATENT DOCUMENTS

2002/0100984 A1*  8/2002  Oshima et al. ............. 257/774
2004/0089924 A1    5/2004  Yuasa et al. ................ 257/673

* cited by examiner

*Primary Examiner*—Bradley K Smith
(74) *Attorney, Agent, or Firm*—Antonelli, Terry, Stout & Kraus, LLP.

(57) ABSTRACT

An insulating portion of the respective wiring layers for a semiconductor device is constituted of insulating films. The one insulating film is made of a material whose conductivity is higher than that of the other insulating film that is made of an ordinary silicon oxide film and is provided in contact with the wiring. An electric charge accumulated in the wiring generated in the course of manufacture of the semiconductor device is discharged through the one insulating film at a stage where a charge accumulation in the wiring is low. This permits the heat release value generated through the discharge to be suppressed to a low level, and the short-circuiting-failure between adjacent wirings to be suppressed or prevented.

22 Claims, 38 Drawing Sheets

1S: SEMICONDUCTOR SUBSTRATE
6a: WIRING
7a: INSULATING FILM (SECOND INSULATING FILM)
7b: INSULATING FILM (FIRST INSULATING FILM)

n=1.55
t=70nm n=1.60
t=30nm

SEMICONDUCTOR DEVICE AND A METHOD OF MANUFACTURING THE SAME

This application is a Continuation application of application Ser. No. 10/732,518, filed Dec. 11, 2003, now Pat. No. 7,189,637 the entire disclosure of which is incorporated herein by reference.

BACKGROUND OF THE INVENTION

This invention relates to a method of manufacturing a semiconductor device. More particularly, the invention relates to an effective technique for the formation of wiring in the manufacture of semiconductor devices.

The wiring structure of a semiconductor device includes wirings for passing signals or an electric current, and an insulating film is provided for insulating the wirings. It has been accepted that the wirings of a semiconductor device are provided for the purpose of lowering the resistance, and the insulating film is provided for the purpose of achieving complete insulation.

The wiring structure of a semiconductor device is described, for example, in Japanese Patent Application Laid-open No. Hei 8 (1996)-204006, which discloses a technique for covering a wiring with an etch stopper film and a technique for arranging a wiring on an etch stopper film.

[Patent Document]

Japanese Patent Application Laid-open No. Hei 8 (1996)-204006.

SUMMARY OF THE INVENTION

In this connection, we have found for the first time that the above-mentioned wiring techniques have the following problems.

When an electric charge built up in a wiring in the course of the process of manufacture of a semiconductor device exceeds a given level, a discharge takes place between adjacent wirings. A s a result, high heat energy is instantaneously generated between adjacent wirings to deform the material of the wiring, with the attendant problem that short-circuiting takes place between adjacent wirings. Especially, this problem is apt to occur in a case where, as at least one objective wiring, there is a long wiring that is likely to build up an electric charge therein, or this problem can occur at a portion where wirings having a potential difference are arranged adjacent to each other. Moreover, as wirings become more highly integrated, the space between adjacent wirings becomes narrow, thereby causing the problem to become more pronounced.

An object of the present invention is to provide a technique for suppressing or preventing a failure due to short-circuiting between wirings of a semiconductor device.

The above and other objects and novel features of the present invention will become apparent from the description provided in this specification and from the accompanying drawings.

Among those features set out in the present application, a typical feature of the present invention can be briefly summarized as follows. The invention is contemplated to provide a wiring structure for a semiconductor device wherein an insulating film used therein has the function of permitting an electric charge that has accumulated in the wiring to escape.

Figure 1:
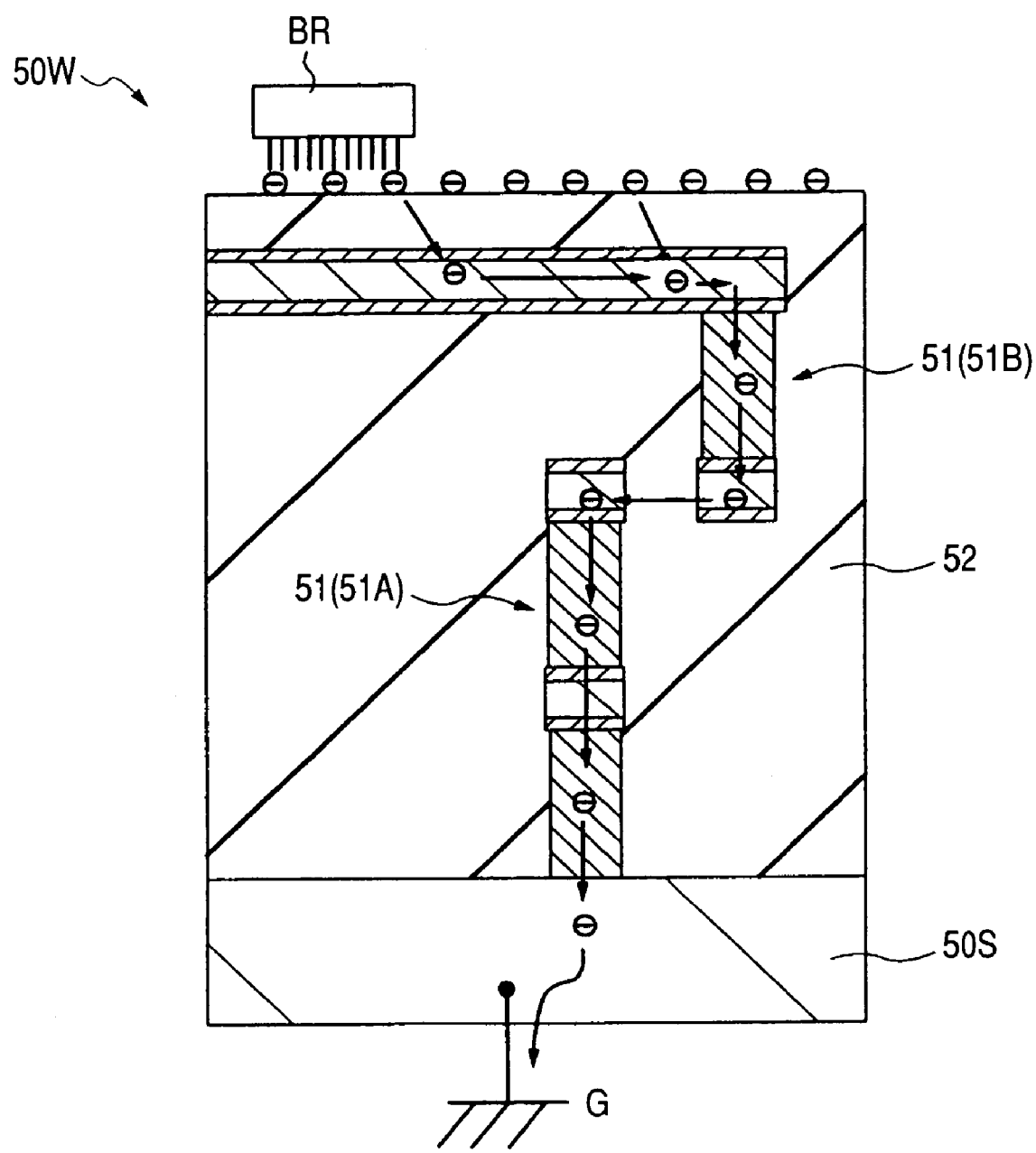
FIG. 1 is a sectional view showing, in the course of a manufacturing process, a typical portion of a semiconductor device, illustrating a conventional problem found by us for the first time.

DETAILED DESCRIPTION OF THE
PREFERRED EMBODIMENTS

In the description of the embodiments of the invention, the terms "made of copper", "copper used as a main wiring material" or "a material made mainly of copper" are intended to mean "the use of copper as a main component", for example. More particularly, it is a matter of course that impurities are usually present in copper of high purity. I n this sense, to contain additives or impurities in members made of copper is not excluded herein. Moreover, such expressions as mentioned above include those built-up structures wherein a metal layer made of a material other than copper is formed on a surface of a member made of copper. This is not limited only to copper, but is true of other types of metals, such as, for example, aluminum, titanium nitride and the like. Although, in the description of the invention, the subject matter may be divided into a plurality of sections or embodiments, if expediently necessary, these divisions are not to be considered mutually irrelevant to one another unless otherwise stated. More particularly, one may be in the relation of a modification, details, supplemental explanation and the like of part or all of the others. In the following examples, where reference is made to a number of elements (including the number, numerical value, quantity, range and the like), they should not be construed as limited to specified values or numbers, respectively, except in the case where they are specified or limited to a specific value apparently in principle. That is, those values smaller or larger than the respective specified values may also be within the scope of the invention. Moreover, it is as a matter of course that constituent elements (including steps) in the following embodiments are not always essential, except in the case where otherwise specified or where such elements are considered to be apparently essential in principle. Likewise, if reference is made to the shape, positional relation and the like of constituent elements, then substantially the like or similar shapes and the like are also within the scope of the invention, except in the case where otherwise specified or where such shapes should not be apparently included in principle. This is also true of the above-indicated numbers and ranges. Throughout the drawings, like reference numerals indicate like parts or members having the same function, and a repeated explanation thereof is omitted. In the drawings, plan views may be hatched in some cases for ease in understanding the subject matter. In the embodiments, MIS-FET (metal insulator semiconductor field effect transistor) is referred to simply as MIS, p-channel MIS-FET is referred to as pMIS, and n-channel MIS-FET is referred to as nMIS. The embodiments of the invention will be described in detail with reference to the accompanying drawings.

Embodiment 1

The problem discovered for the first time by us will be described with reference to FIG. 1. FIG. 1 is a sectional view showing a typical portion of a semiconductor device in the course of the manufacture thereof. A semiconductor substrate (hereinafter referred to simply as a substrate) 50S of a wafer 50W is made, for example, of silicon (Si) single crystal and is electrically connected to a ground potential G at the back side thereof. The figure shows a state where a four-layered wiring structure is formed on the main surface (device-forming surface) of the substrate 50S. This four-layered wiring structure has a wiring 51 and an insulating film 52. The wiring 51 is made of a metal which is mainly composed, for example, of aluminium. A wiring portion 51A of the wiring 51 is electrically connected to the substrate 50S. On the other hand, a wiring portion 51B having a great wiring length (e.g. about 500 μm or over) is in a floating state (i.e., electrically unconnected or floating wiring) because of the fact that the semiconductor device is in the course of the manufacturing process. These wirings 51A and 51B are arranged in a proximate condition as a second wiring layer. The insulating film 52 is made, for example, of silicon oxide ($SiO_2$ or the like) and has the function of insulating the wirings 51. The existing insulating film 52 is provided for complete insulation.

Under these circumstance, if the insulating film 52 is cleaned on the upper surface thereof, for example, with a brush BR, then an electric charge is generated on the upper surface of the insulating film 52 by electrostatic action, thereby causing the wiring 51 to be charged. This charging phenomenon is not limited to the cleaning with the brush BR, but is experienced through other processings as well, including, for example, spin cleaning with pure water, dry etching of wirings per se, plasma treatment for removing a photoresist film by ashing, and the like. If a charge accumulation in the wiring 51 exceeds a given level, a discharge takes place between the wirings 51A and 51B. More particularly, the electric charge accumulated in the floating wiring 51B runs, as shown by the arrows in FIG. 1, into the wiring portion 51A, which is connected to the ground potential G through the insulating film 52 and is lower in potential. At this time, a very high potential difference occurs between the wirings 51A and 51B owing to the charge accumulated in the wiring portion 51B, so that neighboring portions of the wirings 51A, 51B are instantaneously subjected to a high potential difference of several hundreds to several thousands of volts, thereby permitting a high heating temperature as high as one thousand and several hundreds of degrees centigrade to be generated. This causes the wirings 51A, 51B to be deformed at the neighboring portion thereof, with the attendant problem that the wirings 51A, 51B undergo short-circuiting at the neighboring portion. Especially, this problem is liable to be encountered in a case where, because a long wiring is apt to accumulate an electric charge, at least one of the wirings has a great wiring length. The short-circuiting is apt to occur at a neighboring portion of wirings having a high potential difference relative to each other, such as a portion between the wiring 51A connected to the ground potential G and the floating wiring 51B. Moreover, this becomes obvious when the adjacent space of the wirings 51 is rendered narrow as a result of a high degree of integration of the wirings 51 (according to our study, this has been frequently experienced when the space is at a pitch of about 0.8 μm or below). Such a problem as set out hereinabove is one that has been confirmed by us for the first time. A t present, the existence of a long wiring and such a wiring connection in the course of the manufacture of a semiconductor device as set forth above (i.e. one of the wirings is connected to a ground potential and the other is in a floating connection condition) have never been taken into account in the art.

To avoid the above-mentioned problem, according to this embodiment, a film through which a minute electric current passes is used as the insulating film between the wirings. In this way, discharge is enabled at a stage where a charge accumulation in the wirings is low. Thus, heat generation can be suppressed to a low level, thereby suppressing or preventing a failure in short-circuiting between the wirings. This can lead to improved yield and reliability of semiconductor devices. The improved yield of semiconductor device results in an expected reduction in the cost of the device. This will be more particularly described below.

Figure 2:
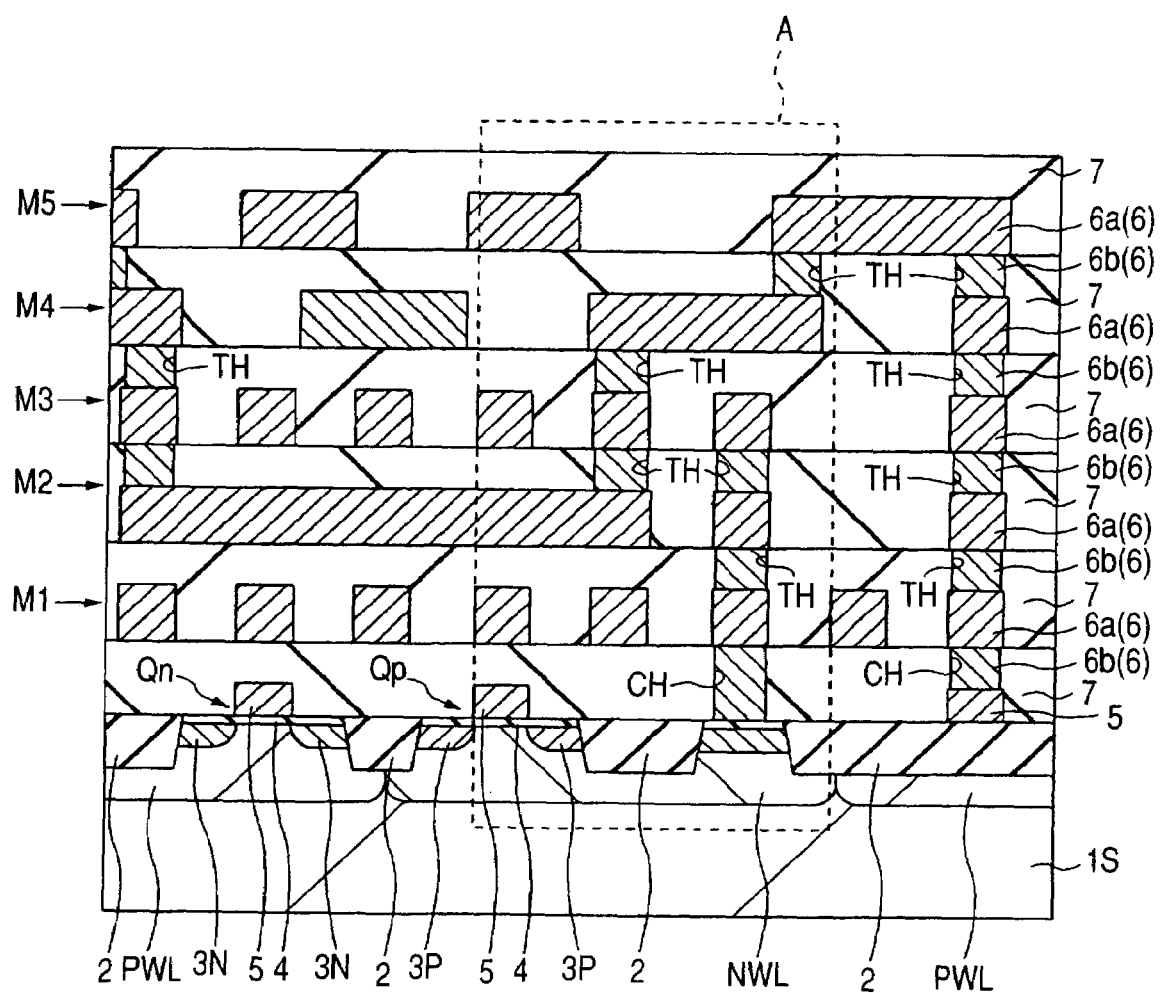
FIG. 2 is a sectional view showing an example of a typical portion of a semiconductor device according to one embodiment of the invention.
Figure 3:
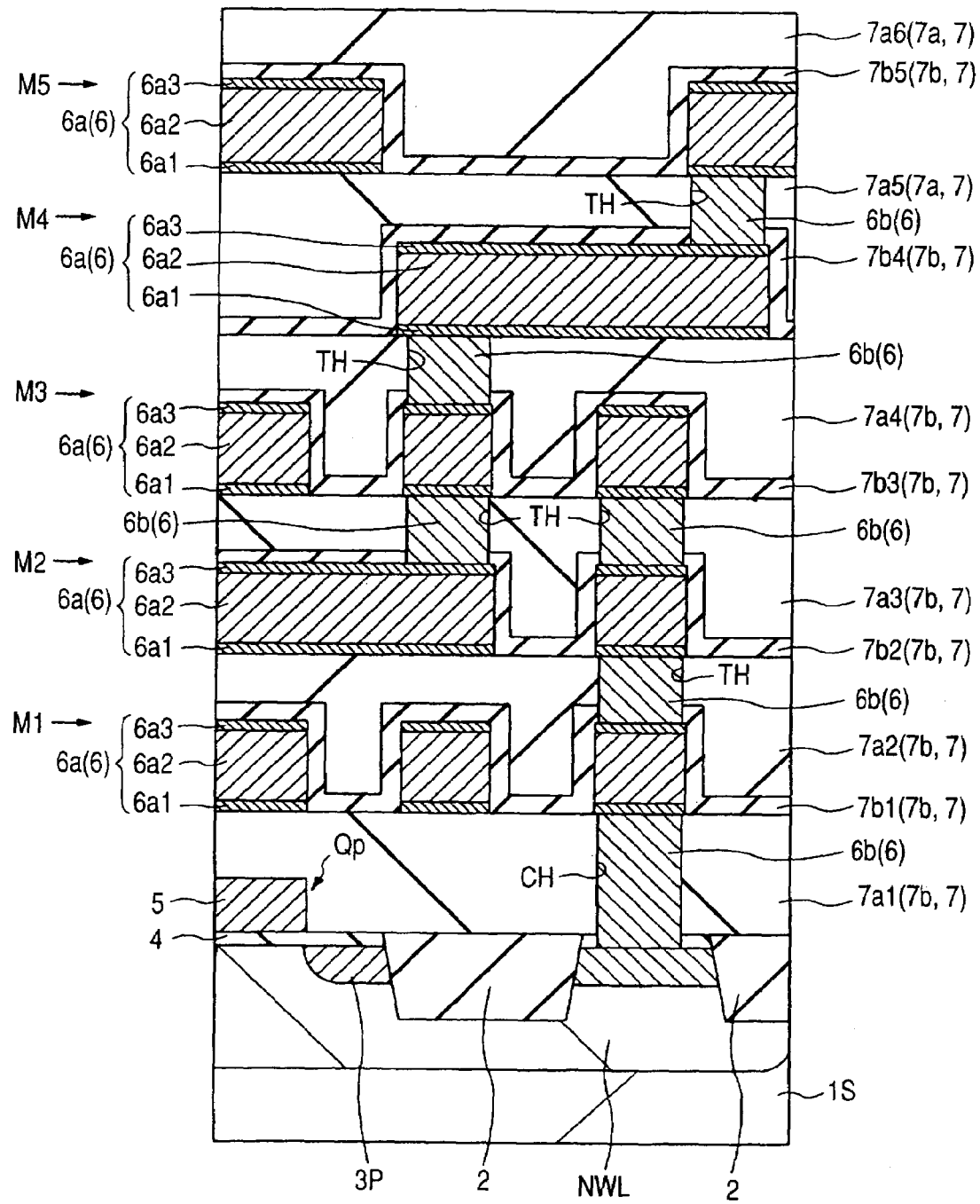
FIG. 3 is an enlarged, sectional view of region A of FIG. 2.

FIG. 2 shows an example of a semiconductor device according Embodiment 1, and FIG. 3 shows an enlarge, sectional view of the region A of FIG. 2. A substrate 1S is made, for example, of silicon (Si) single crystal. The substrate 1S has on the main surface thereof (device-forming surface) a groove isolation 2, such as SGI (shallow groove isolation) or STI (shallow trench isolation), formed therein. This isolation 2 is formed, for example, by burying a silicon oxide film in a groove formed in the main surface of the substrate 1S. Moreover, a p-well PWL and an n-well NWL, respectively, are formed at the main surface side of the substrate 1S. F or example, boron is introduced into the p well PWL and phosphorus is introduced into the n well NWL. At the active regions of the p well PWL and the n well NWL defined with the isolation 2, devices such as nMISQn and pMISQp are formed. The nMISQn has an n-type semiconductor region 3N for source and drain, a gate insulating film 4 and a gate electrode 5. The pMISQp has a p-type semiconductor region 3P, a gate insulating film 4 and a gate electrode 5. The gate insulating film 4 is made, for example, of a silicon oxide film. The gate electrode 5 is constituted, for example, of a polysilicon film alone, an arrangement of a silicide film, such as cobalt silicide or the like, formed on a polysilicon film, or a built-up arrangement wherein a metal film, such as tungsten or the like, is built up on a polysilicon film through a barrier film, such as of tungsten nitride or the like.

The substrate 1S has, for example, a five-layered wiring structure formed on the main surface thereof. The five-layered wiring structure has a wiring portion 6 and an insulating portion 7. The wiring portion 6 has a wiring 6a formed between adjacent layers of the respective wiring layers M1 to M5 and a plug 6b between adjacent wiring layers or between the wiring and the substrate. The wiring 6a may be formed, for example, of a single conductor film made of aluminium (Al), an aluminium-silicon-copper (Cu) alloy, an aluminium-silicon alloy, a aluminium-copper alloy or the like. In this embodiment, a case where a built-up film made up of conductor films 6a1, 6a2 and 6a3 is illustrated. The lowermost, relatively thin conductor film 6a1 is a functional film, which has the function of suppressing or preventing, for example, the constituent atoms of the wiring 6a and the substrate 1S from being diffused and also the function of improving the adhesion between the wiring 6a and the insulating portion 7. The film 6a1 is constituted, for example, of a single film of titanium nitride (TiN) or a built-up film of titanium formed on titanium nitride. The relatively thick conductor film 6a2 formed thereon is formed of a single film of a conductor, which is made of a main wiring material including, for example, aluminium (Al) or an aluminium-silicon-copper (Cu) alloy. The uppermost, relatively thin conductor film 6a3 is a functional film, which has, aside from the functions of the above-mentioned conductor film 6a1, the function of reducing or preventing halation upon exposure to light for the formation of wiring, and it is formed, for example, of a single film of titanium nitride or a built-up film of titanium nitride built up on titanium. The plug 6b is a wiring portion for electrical connection between adjacent wirings 6a of the wiring layers M1 to M5 or between the wiring 6a of the wiring layer M1 and the substrate 1S, and it is formed by burying a metal film, such as, for example, tungsten, in a groove, such as a contact hole CH or through-hole TH, formed in the insulating portion 7. The plug 6b may be constituted of a metal film, such as tungsten, and a conductor film, such as titanium nitride, which is formed relatively thinly around the outer periphery (side surface and bottom surface) of the metal film. Although not limitative, the adjacent pitch of the wirings 6a of the wiring layers M1 to M3 is, for example, at 0.52 μm. The adjacent pitch of the wirings of the wiring layers M4, M5 is, for example, at 1.04 μm.

The insulation portion 7 is fundamentally constituted, for example, of an insulating film (second insulating films) 7a (7a1 to 7a6), such as, for example, a silicon oxide film. A t the respective insulating portions of the wiring layers M1 to M5, an insulating film (first insulating films) 7b (7b1 to 7b5), whose conductivity is higher than that of the insulating film 7a, is provided for direct contact with the wiring 6a of the respective wiring layers M1 to M5 and the plug 6b. In the figure, a structure wherein the insulating film 7b is so deposited as to cover the surfaces (side and upper surfaces) of the wiring 6a is shown. Although not shown in the figure, the insulating film 7b is so provided as to cover and be in contact with a guard ring formed in the vicinity of an outer periphery of a semiconductor chip as extending along the outer periphery. The insulating film 7b functions to insulate the adjacent wirings 6 during the normal operation of the semiconductor device and has the function of permitting a minute electric current to pass between adjacent wiring portions 6 upon application of an overvoltage, which is higher than a working voltage of the semiconductor device. More particularly, as described hereinafter, the insulating film 7b has a low electrical conductivity sufficient to insulate the wiring portions 6, like the insulating film 7a, within a voltage range (i.e. a voltage of about 20 V or below) of the normal operation of the semiconductor device, thus functioning to insulate the wiring portions 6, like the insulating film 7a. At an overvoltage, which is higher than a working voltage of the semiconductor device, the insulating film 7b has the function of permitting a minute electric current to pass between adjacent wiring portions 6, thereby rendering the wiring portions 6 conductive. The provision of such an insulating film 7b allows the electric charge accumulated in the wiring portion in the course of the manufacture of the semiconductor device to escape to the adjacent wiring portion 6 and the substrate 1S through the insulating film 7b at a stage where the charge accumulation is low. More particularly, the charge can be discharged at a low accumulation at the wiring portion 6, so that the heat release value generated by the discharge between the adjacent wiring portions 6 can be suppressed to a low level. The thickness of the insulating film 7a is, for example, at about 30 nm. With the structure of FIG. 3, if the insulating film is formed so as to be too thick, adjacent wirings 6a, 6a along the horizontal direction, as viewed in FIG. 3, may not be buried with the insulating film 7a in some cases. If the thickness of the insulating film 7b is at about 30 nm, then such a burying failure can be avoided. According to an experiment made by us, it has been difficult from the viewpoint of film formation to form the insulating film to a thickness of 30 nm or below. Mention is made, as a material for the insulating film 7b, of a silicon-rich silicon oxide film or a silicon nitride (SiON) film, for example. The silicon-rich silicon oxide film is one wherein the composition of the silicon oxide film is represented by $Si_xO_y$, wherein $y/x<2$. It has been accepted that the conductivity of a silicon-rich silicon oxide film is ten times higher than that of an ordinary silicon oxide film ($SiO_2$). It is known that when silicon is introduced into an insulating film (silicon oxide film), the conductivity of the insulating film usually increases and the refractive index of the insulating film becomes high. Accordingly, for measurement of the electrical characteristics of insulating films, a measurement of the refractive index of these films for comparison permits the electrical characteristics for different contents of silicon in the insulating films to be measured. More particularly, according to this embodiment, an insulating film having a high refractive index means an insulating film having a high silicon content or an insulating film having a high conductivity.

Figure 4:
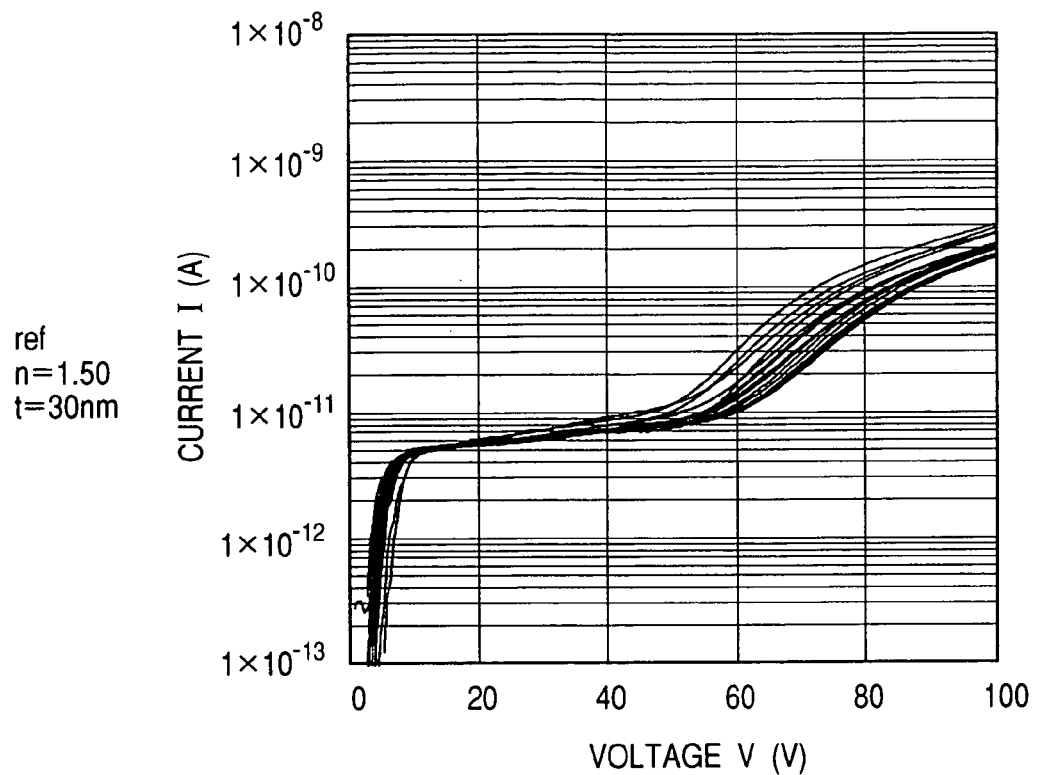
FIG. 4 is a graph showing the relation between current I and voltage V of an ordinary silicon oxide film.
Figure 6:
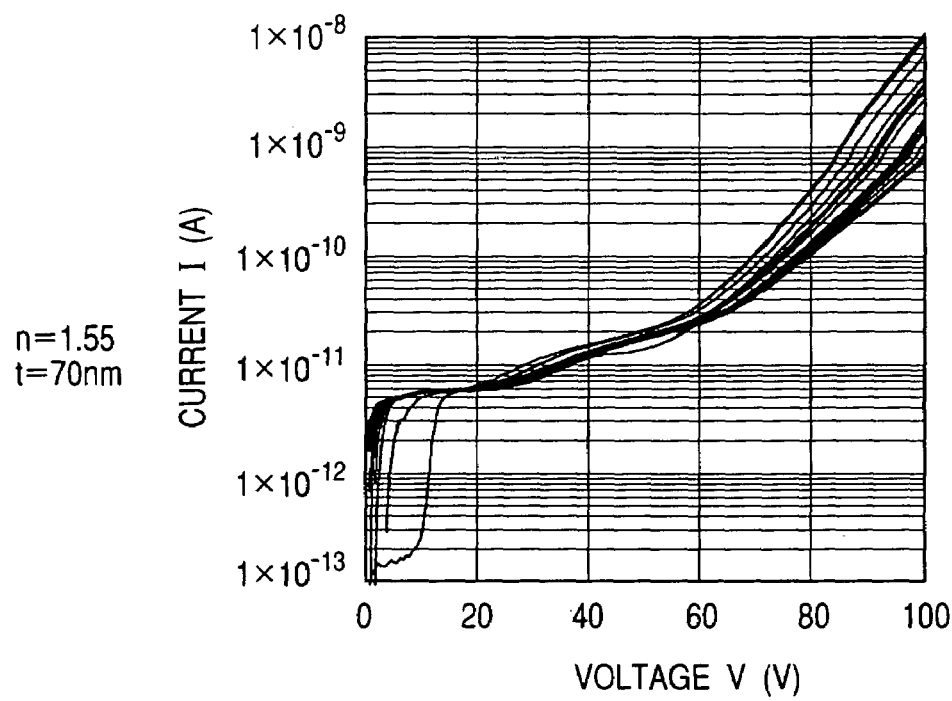
FIG. 6 is a graph showing the relation between current I and voltage V of a silicon-rich silicon oxide film.
Figure 7:
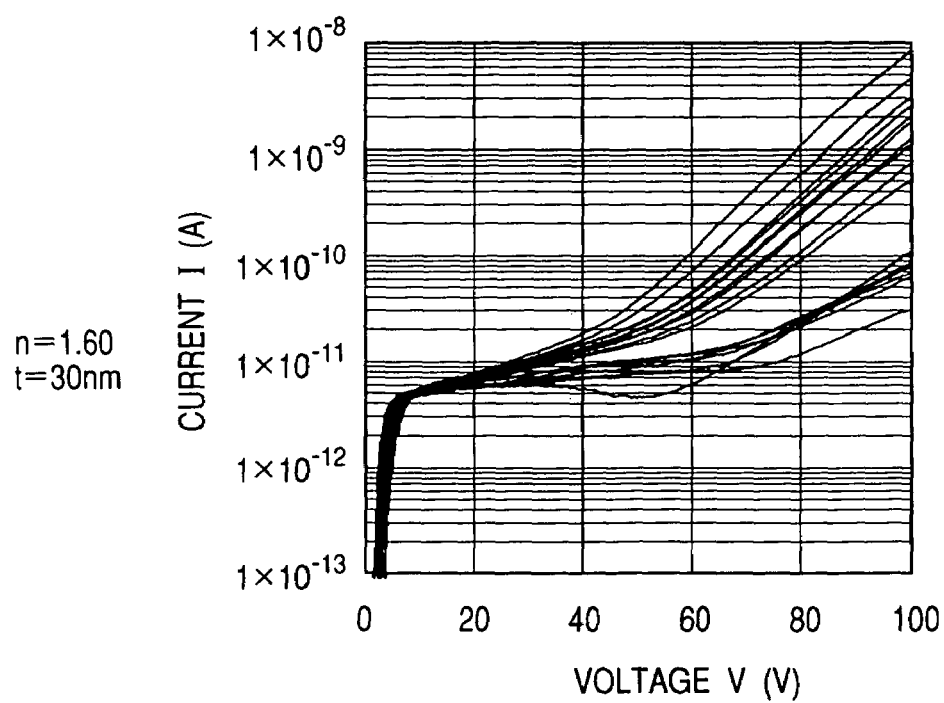
FIG. 7 is a graph showing the relation between current I and voltage V of a silicon-rich silicon oxide film.
Figure 8:
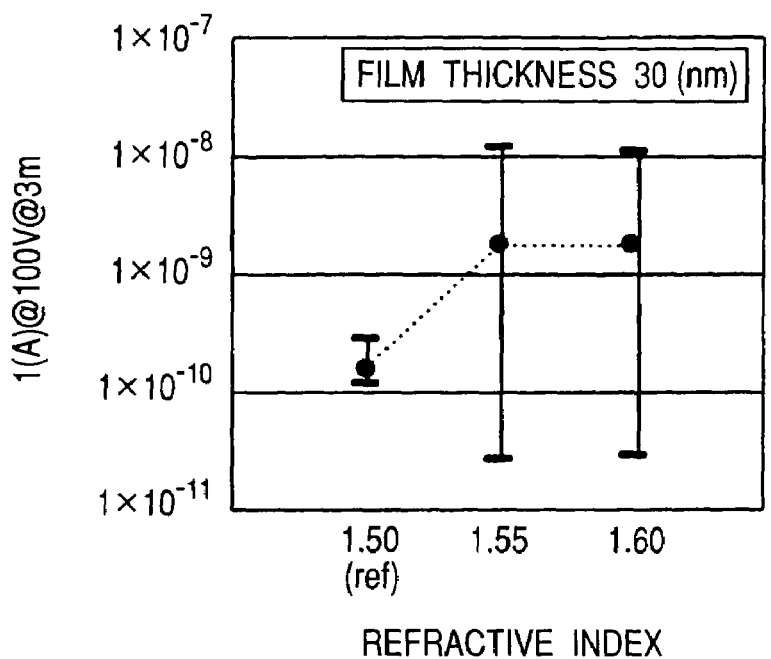
FIG. 8 is a graph showing the relation for comparison between the refractive index and the current of a silicon oxide film having a thickness of approximately 30 nm.
Figure 9:
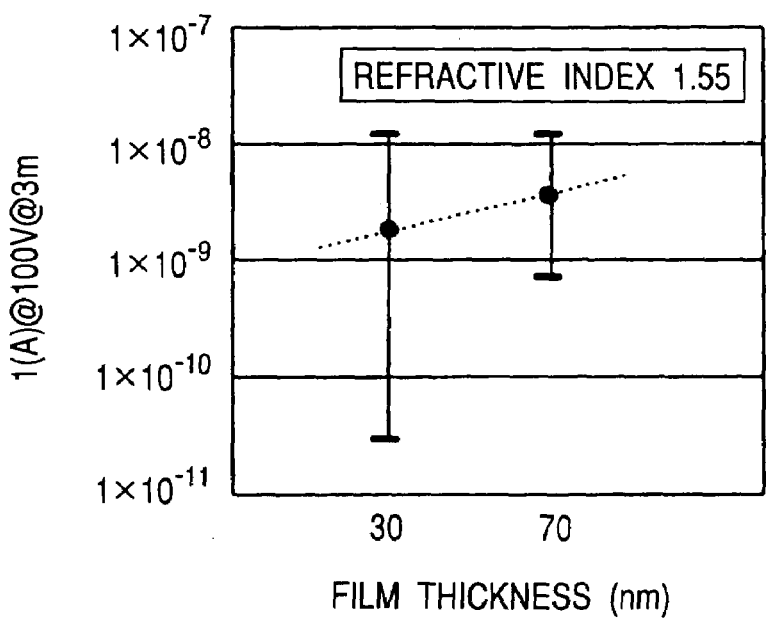
FIG. 9 is a graph showing the relation between the thickness and the current of a silicon-rich silicon oxide film having a refractive index of 1.55.

FIGS. 4 to 7 show the results of measurement of a current I-voltage V characteristic of silicon oxide films. FIG. 4 shows the I-V characteristic of ordinary silicon oxide ($SiO_2$), and FIGS. 5 to 7, respectively, show an I-V characteristic in the case where the refractive index n and film thickness t of silicon-rich silicon oxide films are changed. The reason why plural curves are depicted in each figure is that plural chips within a wafer subjected to an experiment under the same conditions are measured. FIG. 8 shows, for comparison, the relation between the refractive index and the electric current of about 30 μm thick silicon oxide films derived from the results of FIGS. 4 to 7. Moreover, FIG. 9 shows the relation between the thickness and the electric current of a silicon-rich silicon oxide film having a refractive index of 1.55. According to FIGS. 4 to 9, it will be seen that a silicon-rich silicon oxide film is more likely to pass an electric current than the ordinary silicon oxide film. It will also be seen that a greater thickness t of the silicon-rich silicon oxide film allows an electric current to be run more greatly. In addition, a higher refractive index n, i.e. a higher content of silicon on the silicon oxide film, makes the electric current pass more greatly. According to the studies made by us, where a silicon-rich silicon oxide film having a refractive index of 1.55 or over is used as a material for the insulating film 7b, good results are obtained in order to avoid the problem concerning the short-circuiting failure between the wirings.

Figure 5:
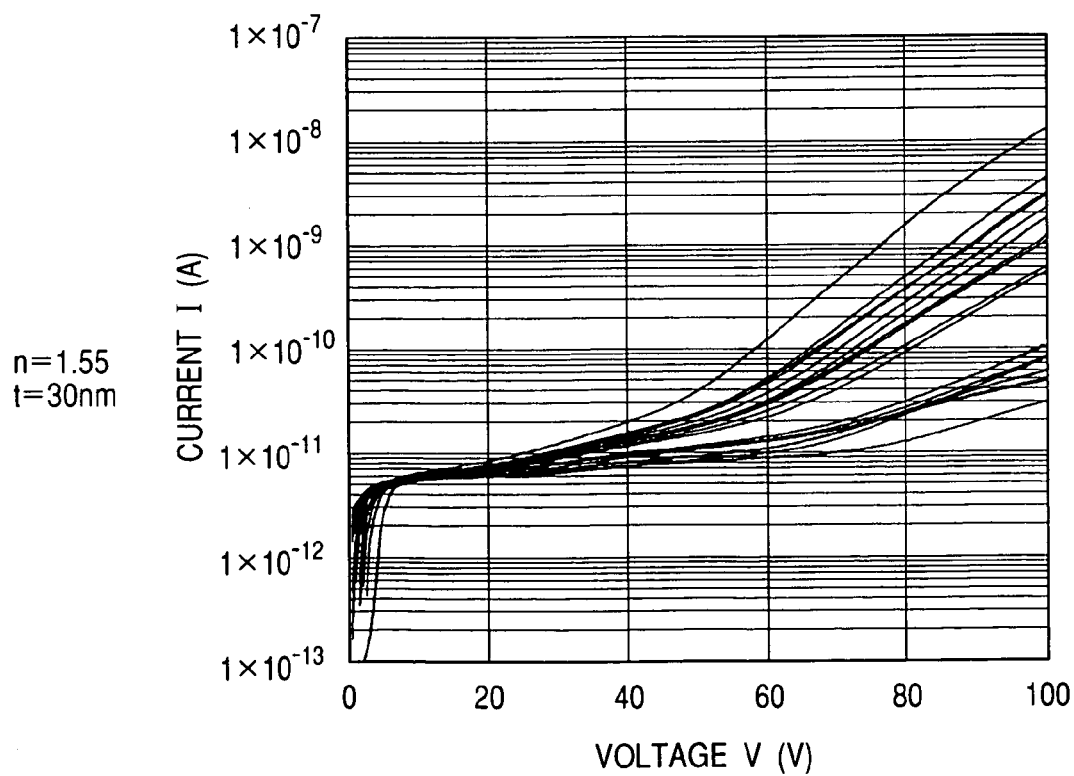
FIG. 5 is a graph showing the relation between current I and voltage V of a silicon-rich silicon oxide film.
Figure 10:
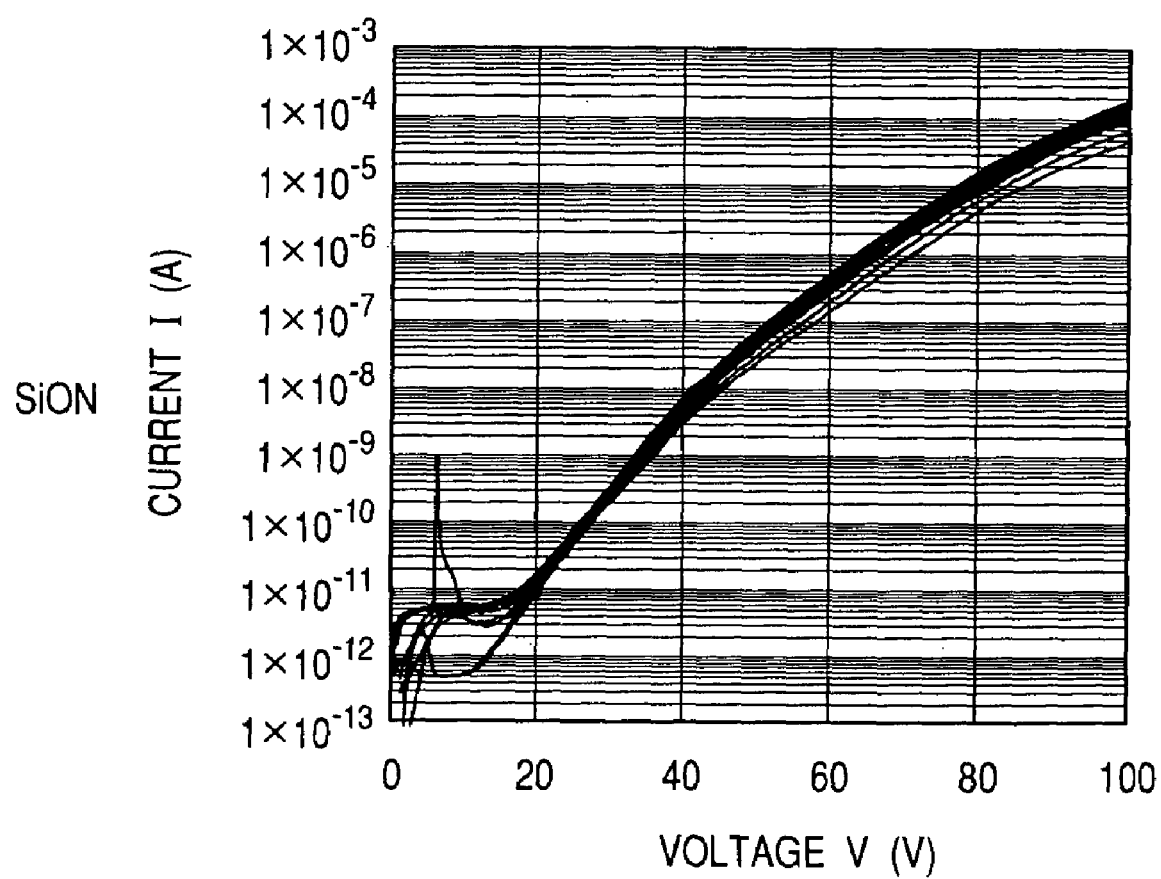
FIG. 10 is a graph showing the relation between current I and voltage V of a silicon oxynitride film.

FIG. 10 shows the results of measurement of the I-V characteristic of a silicon oxynitride film (SiON). This film is more likely to allow an electric current to pass therethrough than the ordinary silicon oxide film (FIG. 4) and the silicon-rich silicon oxide films (FIGS. 5 to 7). In this embodiment, it is possible to use such a silicon oxide film (SiON) as a material for the insulating film 7b. In this case, as shown in FIG. 10, this film is more likely to pass an electric current than the silicon-rich silicon oxide film, and it exhibits a higher conductivity. Thus, better results are obtained in order to avoid the problem concerning the failure of short-circuiting between the wirings.

Next, an example of a method of manufacturing the semiconductor device of Embodiment 1 will be described.

Figure 11:
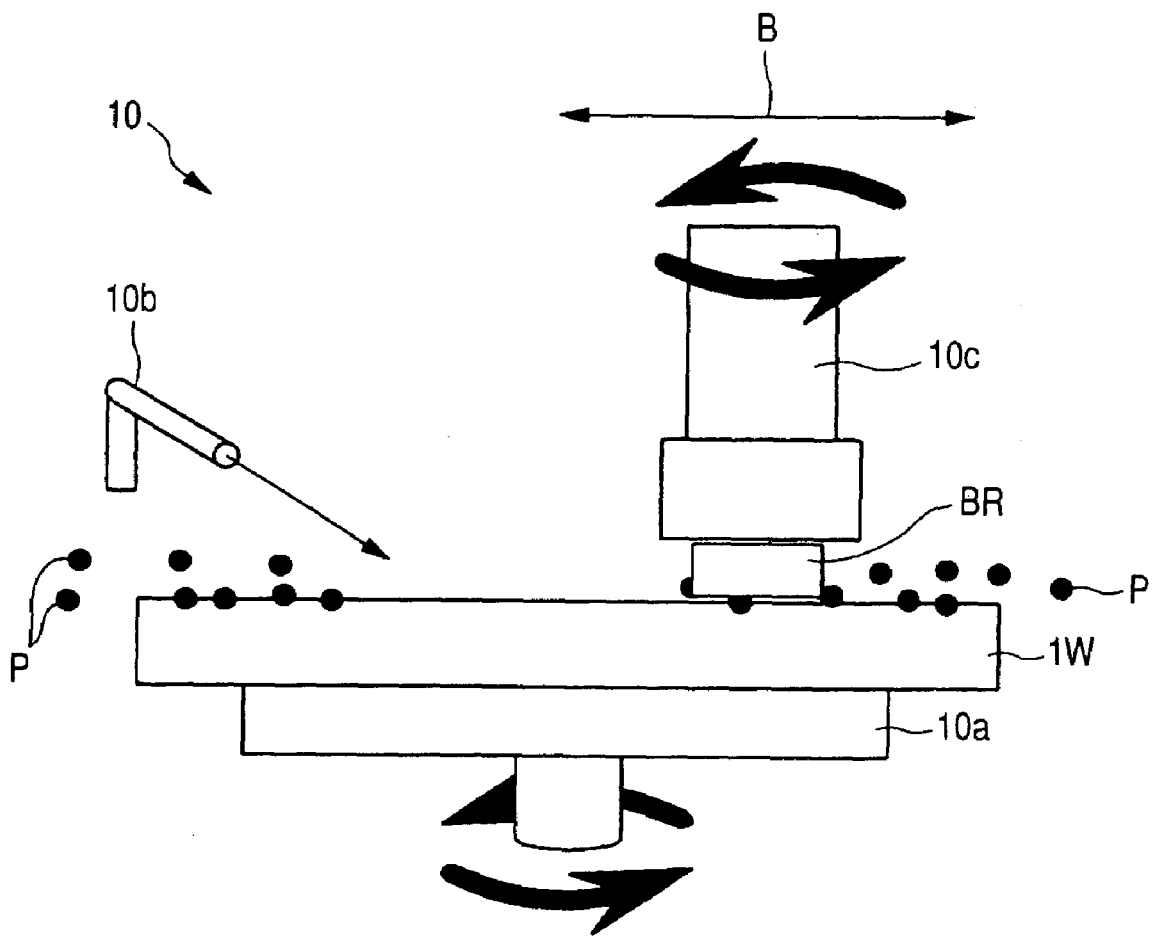
FIG. 11 is a diagram showing an example of a cleaning device used in the manufacturing process of a semiconductor device according to the embodiment of the invention.

Initially, an example of a cleaning device of the type used in the course of manufacture of the semiconductor device of Embodiment 1 is shown in FIG. 11. A cleaning device 10 is one wherein foreign matter P is removed from a cleaned surface of a wafer 1W obtained after a desired treatment and has a stage 10a, a nozzle 10b, a brush BR and a brush holder 10c. The cleaning treatment is carried out in the following manner, for example. First, the wafer 1W is mounted in a temporarily fixed state so that the surface of the wafer 1W to be cleaned is in face-to-face relation with the brush BR side. Subsequently, while rotating the stage 10a, a cleaning fluid, such as pure water, is supplied from the nozzle 10b toward the surface of the wafer 1W to be cleaned. In this condition, the brush BR is rubbed against the surface of the wafer 1W while spinning the brush BR by rotation of the brush holder 10c, and it is moved from one end to the other of the wafer 1W along the direction of arrow B in FIG. 11, thereby removing the foreign matter P from the surface of the wafer 1W.

Figure 12:
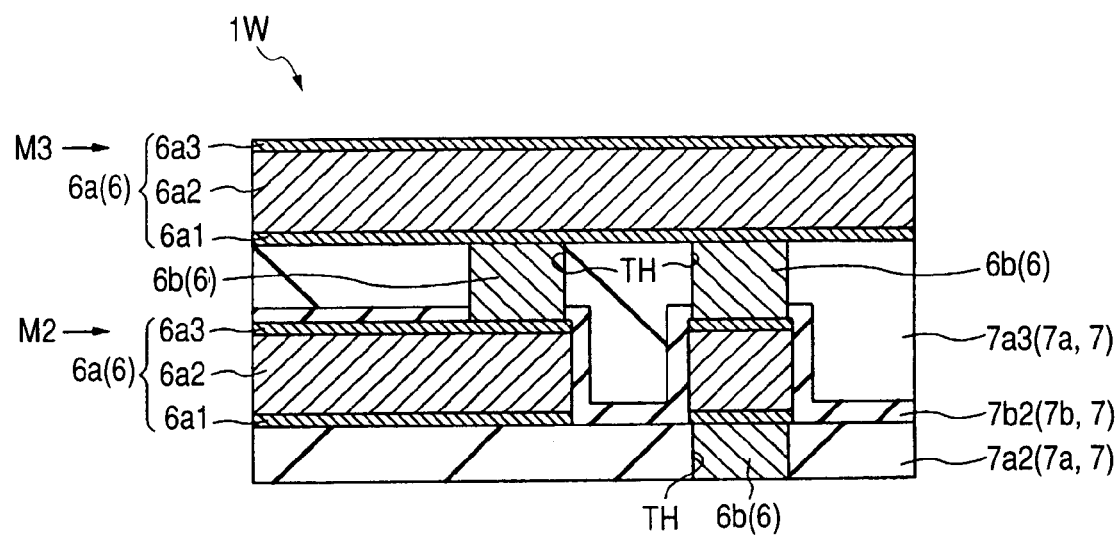
FIG. 12 is a sectional view of a typical portion of a wafer in the course of the process of manufacture of the semiconductor device of FIGS. 2 and 3.
Figure 13:
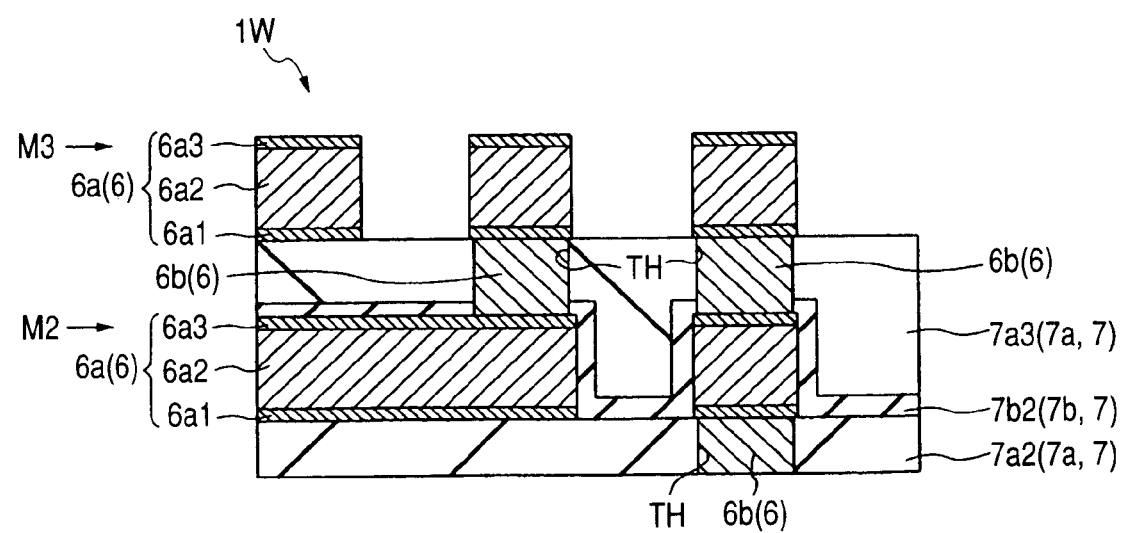
FIG. 13 is a sectional view of a typical portion in the course of manufacture of the semiconductor device subsequent to FIG. 12.

Next, an example of a manufacturing process used in the production of the semiconductor device of Embodiment 1 will be described with reference to FIGS. 12 to 16, which show a sectional view of a typical part of the wafer during steps in the manufacture of the semiconductor device, respectively. FIG. 12 is a sectional view of a typical part of the wiring layers M2, M3 in the wafer 1W during the course of manufacture of the semiconductor device. The wiring layer M2 has an insulating film 7b2 formed by a CVD (chemical vapor deposition) method to be described hereinafter so as to cover the wiring 6a therewith. An insulating film 7a3 is deposited on the insulating film 7b2 by a CVD method described hereinafter. The insulating film 7a3 of the wiring layer M2 is flattened on the upper surface thereof by a CMP (chemical mechanical polishing) method, on which conductor films 6a1, 6a2, 6a3 for the wiring formation of the wiring layer M3 are, respectively, deposited by a sputtering method or the like. These conductor films 6a1, 6a2, 6a3 are subjected to patterning by an ordinary photolithographic technique (hereinafter referred to simply as lithography) and also by a dry etching technique (hereinafter referred to simply as dry etching), thereby forming the wiring 6a at the wiring layer M3, as is particularly shown in FIG. 13.

Figure 14:
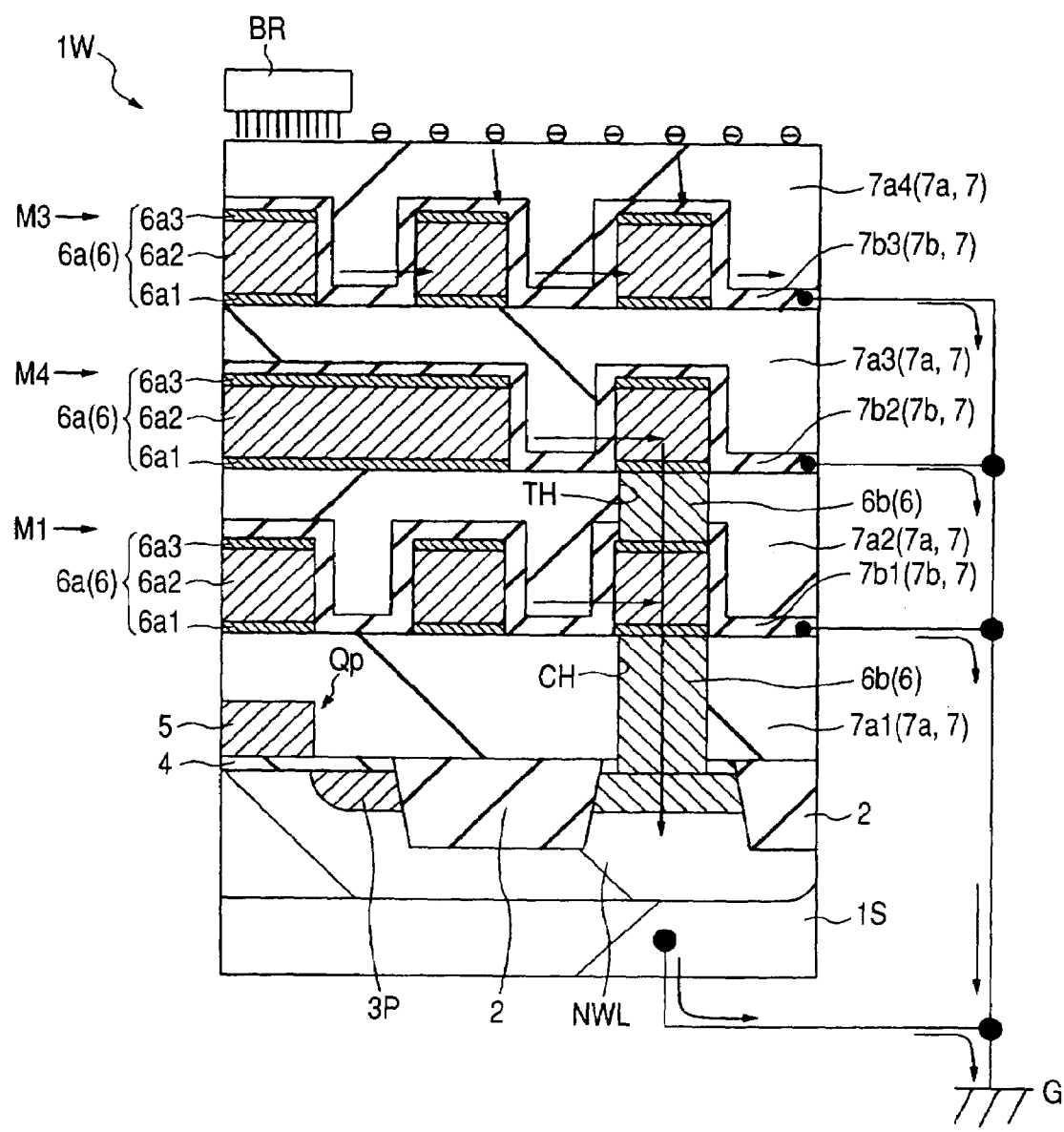
FIG. 14 is a sectional view of a typical portion in the course of manufacture of the semiconductor device subsequent to FIG. 13.

Thereafter, as shown in FIG. 14, the insulating films 7b3, 7a4 are deposited on the wiring layer M3 in this order according to a CVD method, and the upper surface of the insulating film 7a4 is flattened by a CMP method. Thereafter, the upper surface (surface to be cleaned) of the insulating film 7a4 is cleaned by means of the cleaning device 10 (see FIG. 11 ) using the brush BR, thereby removing foreign matter from the insulating film 7a4. At this stage, the charge generated in the upper surface of the insulating film 7a by the electrostatic action is accumulated in the wiring 6a of the respective wiring layers M1 to M3, so that an electric current passes from the floating wiring 6a to the wiring 6b connected to the substrate 1S. In this embodiment, however, the insulating film 7b (7b1 to 7b3) whose conductivity is higher than that of the insulating film 7a (7a1 to 7a4) is provided, so that the charge accumulated in the wiring 6a can escape through the insulating film 7b (7b1 to 7b3) to the ground potential G. Thus, the charge can be discharged at a stage where the charge accumulation in the wiring 6a is low, thereby making it possible to lower the heat release value generated by the discharge. Thus, a short-circuiting failure between the wirings 6a and 6a can be suppressed or prevented. This leads to improved yield and reliability of the semiconductor device. The improved yield of semiconductor device in turn leads to an expected cost reduction of the device.

Figure 15:
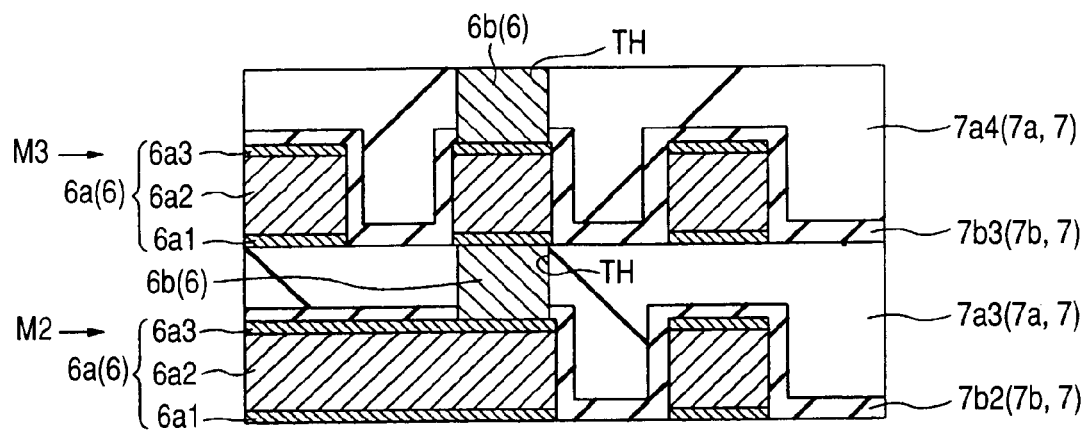
FIG. 15 is a sectional view of a typical portion in the course of manufacture of the semiconductor device subsequent to FIG. 14.

Next, as shown in FIG. 15, a through-hole TH is formed in the insulating films 7a4, 7b3 by lithography and dry etching, followed by deposition of a film of a high melting point metal, such as, for example, tungsten, on the main surface of the wafer 1W. The high melting point metal film is polished by a chemical mechanical polishing method so that the film is left only within the through-hole TH, thereby forming a plug 6b in the through-hole TH. Subsequently, the polished surface is cleaned by means of the cleaning device to remove foreign matter therefrom. In this way, a short-circuiting failure between the wirings can be suppressed or prevented by such an action as set forth hereinabove.

Figure 16:
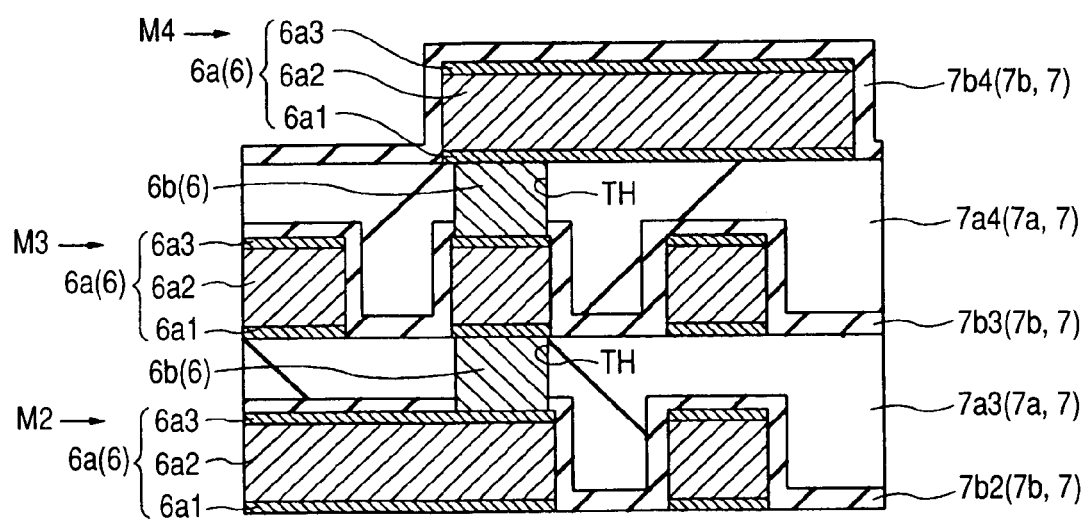
FIG. 16 is a sectional view of a typical portion in the course of the manufacture of the semiconductor device subsequent to FIG. 15.

As shown in FIG. 16, after forming the wiring 6a of the wiring layer M4 in the same way as the wiring 6a of the wiring layer M3, an insulating film 7b4 is deposited, by a CVD method to be described hereinafter, over the entire main surface of the wafer 1W so as to cover the wiring 6a of the wiring layer M4 therewith. Thereafter, the uppermost wiring layer M5 is formed in the same way as stated hereinabove, thereby completing a semiconductor device through an ordinary manufacturing process of the semiconductor device.

Figure 17:
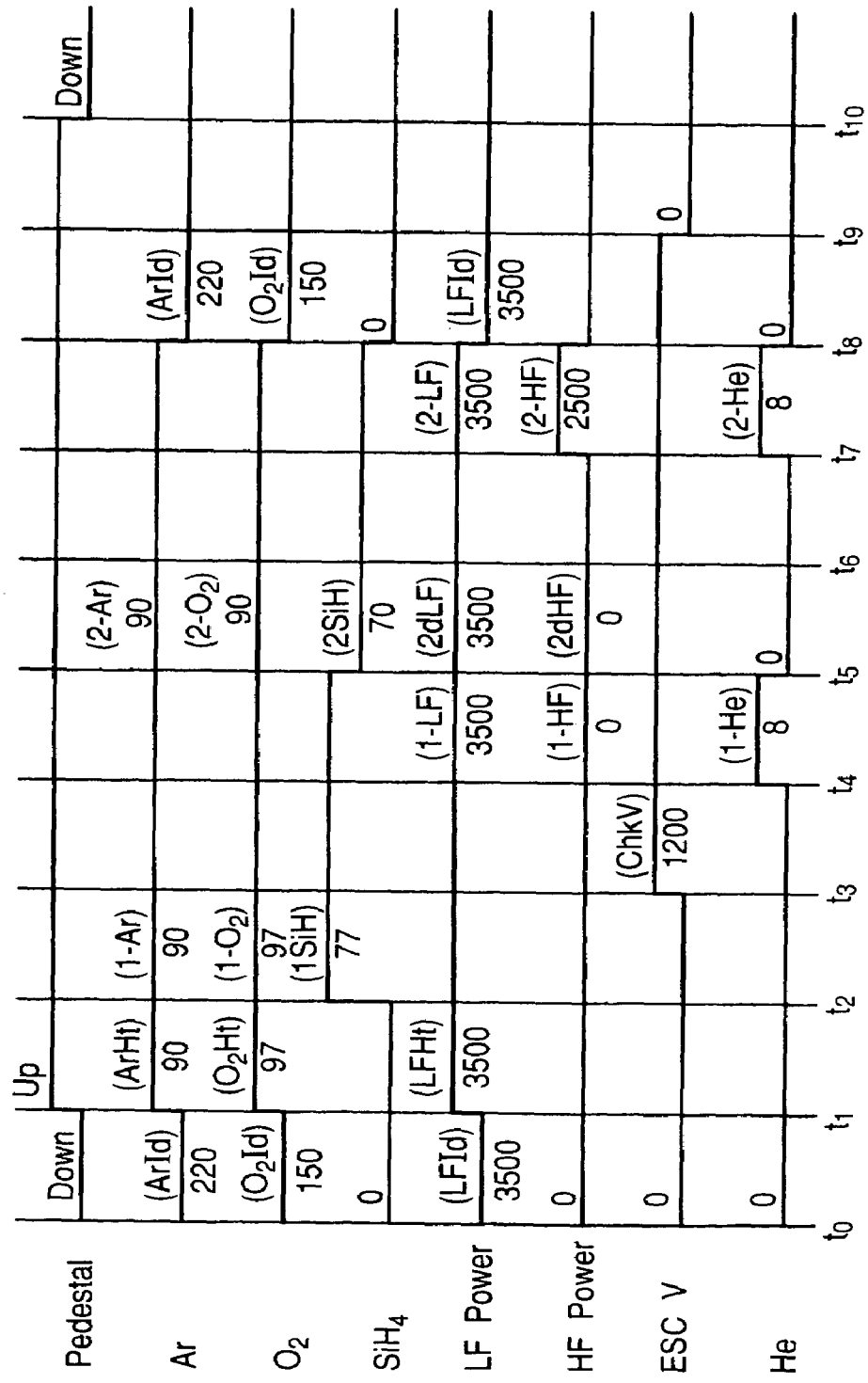
FIG. 17 is a timing chart showing a film-forming sequence in the formation of an insulating film of the semiconductor device of FIGS. 2 and 3.

Next, an example of a film-forming procedure used in formation of the insulating film 7b (7b1 to 7b5) is illustrated. A case where the insulating film 7b is formed of a silicon-rich silicon oxide film will be described. FIG. 17 shows an example of film-forming sequences of the insulating films 7a, 7b in the case where the insulating film 7b is formed of a silicon-rich silicon oxide film. It will be noted that the figures in the sequences of gases in FIG. 17, respectively, indicate feeds of gases (unit: sccm=cm$^3$/minute), and the figures in the sequences of "upper electrode HF power and lower electrode LF power" indicate high frequency power (unit: W), respectively.

In this embodiment, the insulating film 7b is formed by a plasma CVD method using, for example, a silane gas. The plasma CVD apparatus being used is, for example, of a parallel plate type. F or a treating gas, a mixture of a silane gas, such as, for example, monosilane ($SiH_4$) or the like, oxygen ($O_2$) and a diluent gas, such as Ar or the like, is used. Other types of silane gas, such as disilane ($Si_2H_6$), TEOS (tetraethoxysilane) or the like, may be used in place of monosilane. Likewise, an oxygen-containing gas, such as nitrous oxide ($N_2O$), ozone ($O_3$) or the like, may be used instead of oxygen. The time period of t0 to t1 indicates an idling time, the time period of t2 to t5 indicates a film-forming time for the insulating film 7b, and the time period of t5 to t8 indicates a film-forming time for the insulating time 7a. Along with the wafer 1W starting to be heated from time t1, argon and oxygen begin to be fed into the treating chamber. From time t2, the feed of monosilane into the chamber is started. In this embodiment, in order to render the insulating film 7b rich in silicon, the flow rate of monosilane during the course of film formation of the insulating film 7b is larger than that used for the insulating film 7a. The flow rate of monosilane for the formation of the insulating film 7b is, for example, at about 77 sccm (=77 $cm^3$/minute), that of oxygen is, for example, at about 97 sccm, and that of argon is, for example, at about 90 sccm. On the other hand, the flow rate of monosilane for the formation of the insulating film 7a is, for example, at about 70 sccm, that of oxygen is, for example, at about 90 sccm, and that of argon is, for example, at about 90 sccm. In this way, where the insulating film 7b is formed of a silicon-rich silicon oxide film, the insulating films 7a, 7b can be formed within the treating chamber of the same plasma CVD apparatus. Thus, the time required for film formation can be reduced. In addition, the insulating films 7a, 7b can be formed in a continuous, stable state, and occasions of contamination with foreign matter can be reduced in number, thereby improving the reliability of the film formation.

Where the insulating film 7b is formed of silicon oxynitride (SiOX), a plasma CVD method using, for example, a silane gas is also used. For a treating gas, a mixed gas consisting of a silane gas, such as monosilane ($SiH_4$) or the like, nitrous oxide ($N_2O$) and a diluent gas, such as helium (He) or the like, is used. Other types of silane gas, such as disilane ($Si_2H_6$), TEOS (tetraethoxysilane) or the like, may be used in place of monosilane. Ammonia or ammonia and nitrogen may be further added to the above-mentioned mixed gas. If ammonia or nitrogen is added, oxygen ($O_2$) or ozone ($O_3$) may be used in place of nitrous oxide. The flow rate of monosilane for the film formation is, for example, at about 50 sccm, that of nitrous oxide is, for example, at about 66 sccm, and that of helium is, for example, at about 1500 sccm. The temperature of the wafer 1W during the film formation is, for example, at about 350° C., and the pressure within the chamber is, for example, at about 5 Torr. (=666.612 Pa).

Embodiment 2

Figure 18:
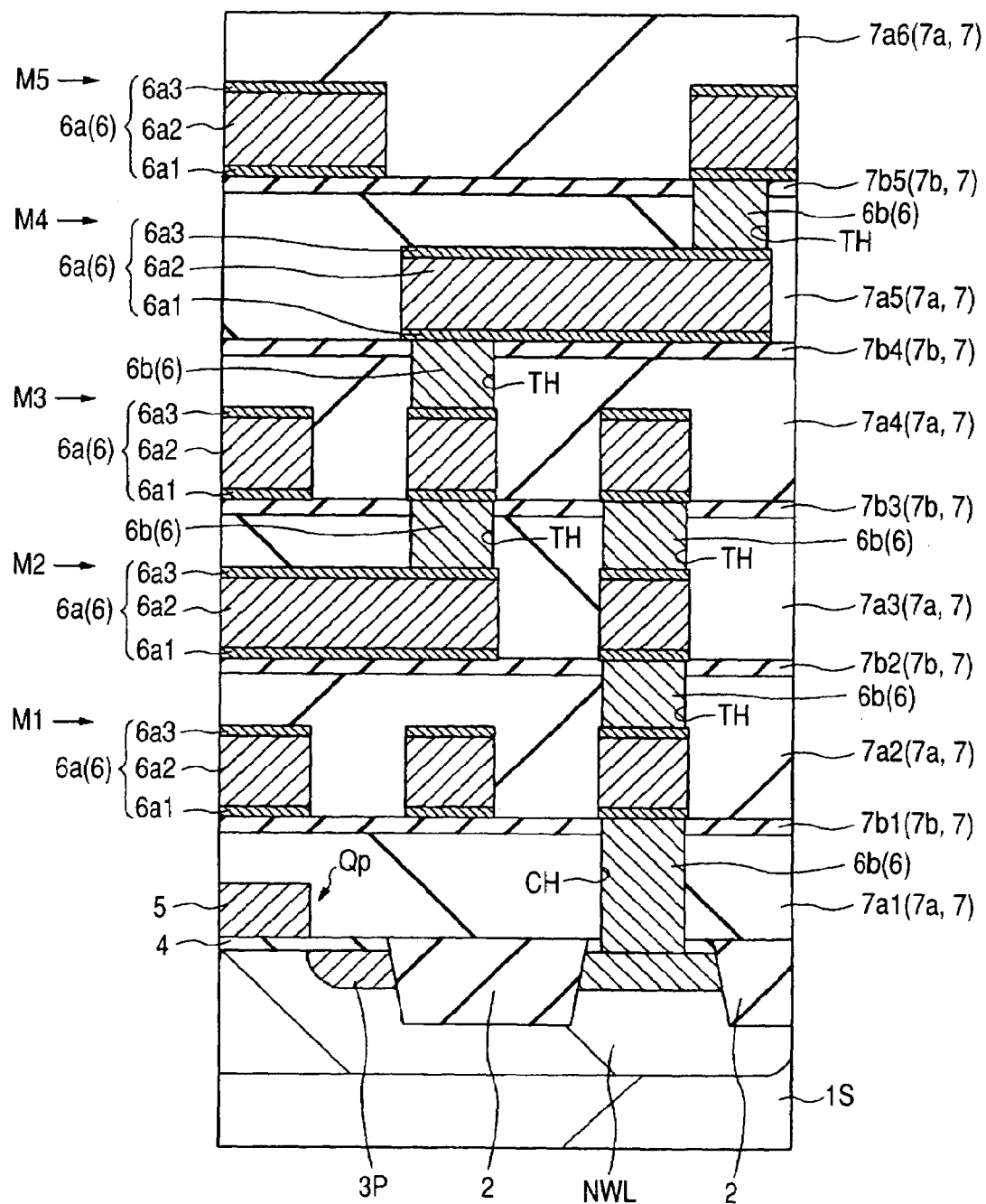
FIG. 18 is a sectional view of a typical portion of a semiconductor device according to another embodiment of the invention.

In Embodiment 2, there is a modification of the wiring structure. FIG. 18 shows a sectional view of an essential part of a semiconductor device representing Embodiment 2 at the same portion as region A of FIG. 3. In Embodiment 2, the insulating film 7b (7ba to 7b5) of the respective wiring layers M1 to M5 are formed as an underlying layer of the wiring 6a. More particularly, the wiring 6a is formed on the insulating film 7b(7b1 to 7b5) in the respective wiring layers M1 to M5. In Embodiment 2, the lower surface of the wiring 6a and the upper side surface of the plug 6b are in contact with the insulating film 7b(7b1 to 7b5), respectively. Accordingly, similar results as described in Embodiment 1 can be obtained in Embodiment 2. With this structure, it is not necessary to take into account the burying properties when an insulating film is buried between adjacent wirings 6a, 6a of the same wiring layer, and, thus, the insulating film 7b can be made thicker than in the case of Embodiment 1. This eventually leads to an increased conductivity of the insulating film 7b, thereby ensuring improved static elimination.

Figure 19:
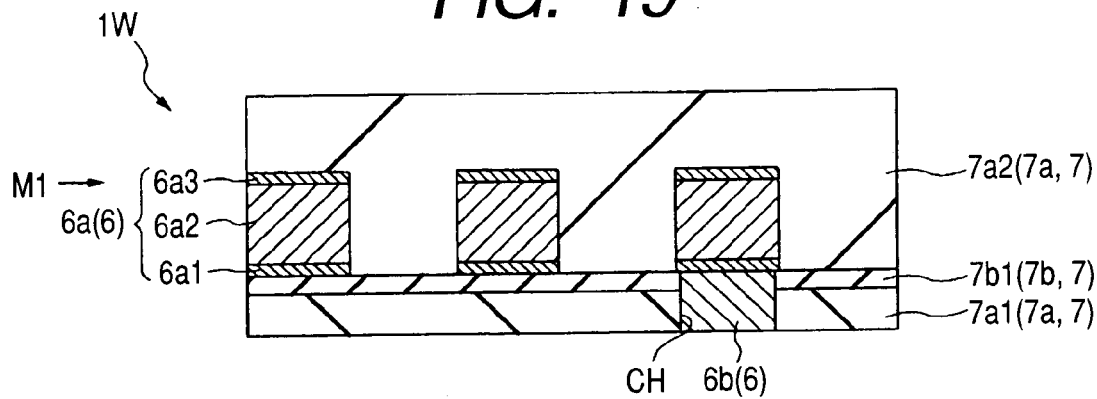
FIG. 19 is a sectional view of a typical portion of a wafer in the course of manufacture of the semiconductor device of FIG. 18.
Figure 20:
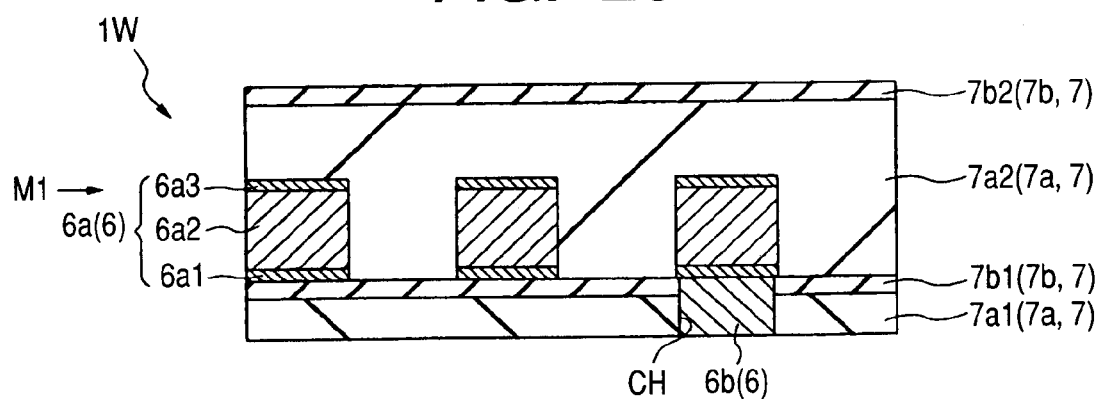
FIG. 20 is a sectional view of a typical portion of the wafer in the course of manufacture of the semiconductor device subsequent to FIG. 19.
Figure 21:
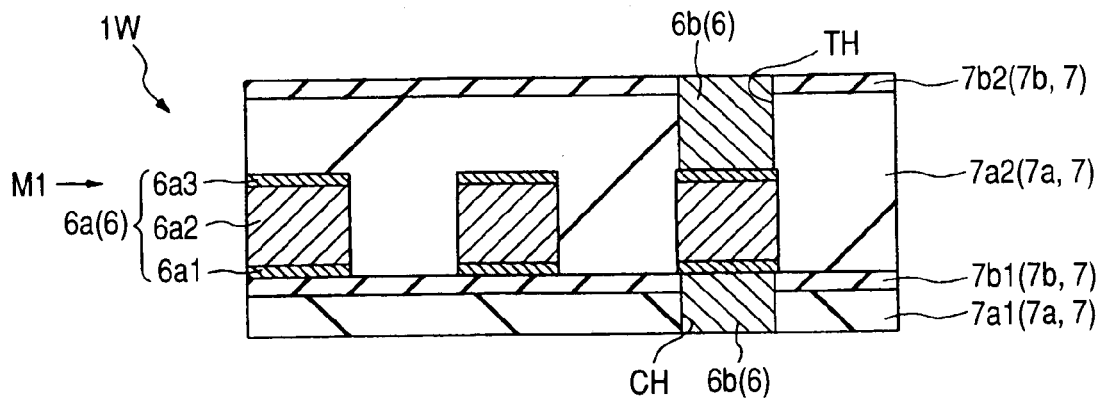
FIG. 21 is a sectional view of a typical portion of the wafer in the course of manufacture of the semiconductor device subsequent to FIG. 20.
Figure 22:
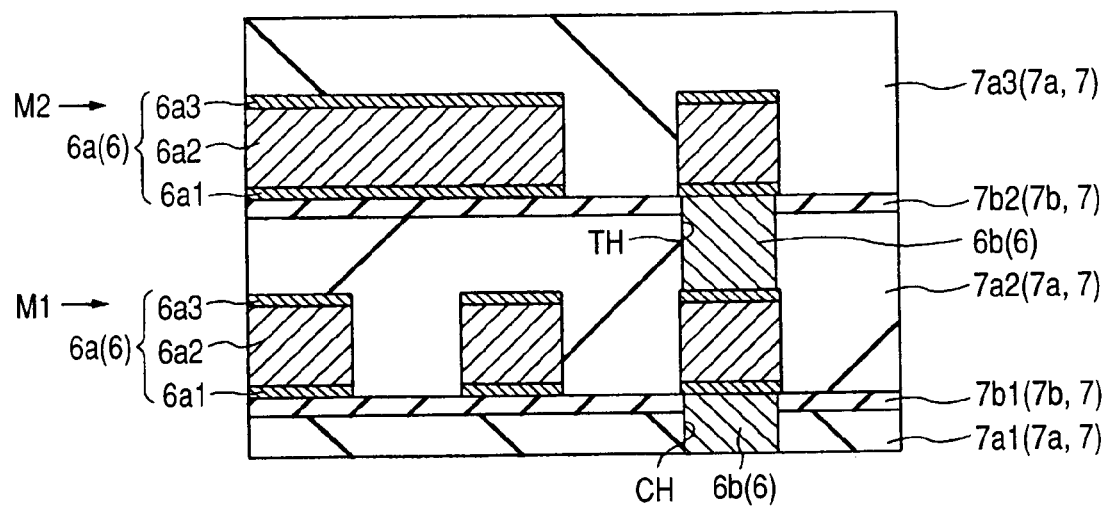
FIG. 22 is a sectional view of a typical portion of the wafer in the course of manufacture of the semiconductor device subsequent to FIG. 21.
Figure 23:
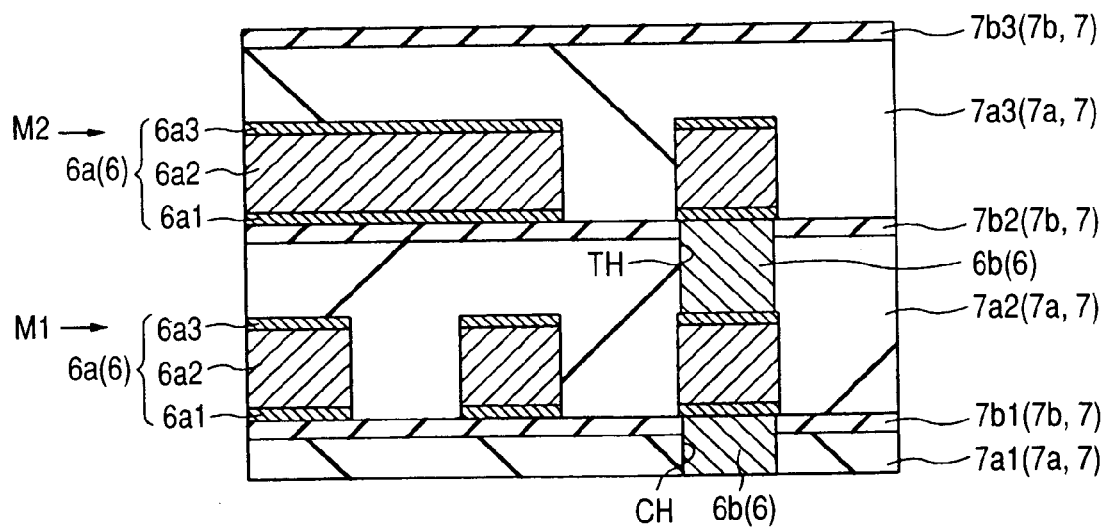
FIG. 23 is a sectional view of a typical portion of the wafer in the course of manufacture of the semiconductor device subsequent to FIG. 22.

An example of the manufacturing process used in the formation of a semiconductor device according to Embodiment 2 is illustrated with reference to FIGS. 19 to 23, which are, respectively, sectional views of a wafer during steps in the manufacture of a semiconductor device. FIG. 19 is a sectional view of the wiring layer M1 in the wafer 1W in the course of manufacture of the semiconductor device of FIG. 18. The first-layer wiring 6a is formed on the insulating film 7b1 of the wiring layer M1. This wiring 6a is covered with the insulating film 7a2. Next, the insulating film 7b2 is deposited, as shown in FIG. 20, on the insulating film 7a2 of the wiring layer M1 in the same manner as in the foregoing Embodiment 1. Subsequently, as shown in FIG. 21, a through-hole TH is formed in the insulating films 7b2 and 7a2 by lithography and dry etching, followed by formation of the plug 6b in the through-hole TH in the same manner as in Embodiment 1. Thereafter, as shown in FIG. 22, the wiring 6a for wiring layer M2 is formed over the insulating film 7b2 as similar to the first embodiment; and, thereafter, the insulating later 7a3 is deposited so as to cover the wiring 6a, and, further, the insulating film 7b3 is deposited as shown in FIG. 23. With respect to the wiring layers M4, M5, a similar procedure is repeated to complete a semiconductor device using an ordinary process of manufacture of a semiconductor device. In the case of this structure, cleaning is carried out by means of the cleaning device 10 (see FIG. 11) using the brush BR after the step of forming the plug 6b or after the deposition of the insulating films 7a, 7b. As stated hereinbefore, a charge is accumulated in the wiring layer 6a of the respective wiring layers M1 to M3 by electrostatic action, and it will run from the floating wiring 6a to the wiring 6a that is connected to the substrate 1S. In this Embodiment 2, the insulating film 7b is provided, so that the charge accumulated in the wiring 6a is able to escape via the insulating film 7b to the ground potential G. Thus, the charge can be discharged when its accumulation is low, so that the heat release value generated by the discharge can be suppressed to a low level. Thus, short-circuiting failure between the wirings is suppressed or prevented. Accordingly, the yield and reliability of the resulting semiconductor device can be improved. The improved yield of the semiconductor device leads to an expected cost reduction of the semiconductor device.

Embodiment 3

In Embodiments 1 and 2, the case where the insulating film 7b is provided in all the wiring layers M1 to M5, respectively, has been illustrated, but the invention is not limited to this case, since the insulating film 7b may be provided only in selected wiring layers. For instance, the wiring short-circuiting failure is liable to occur when a long wiring (of about 500 μm or over) exists. In this sense, the insulating film 7b may be provided only in the uppermost wiring layer and a wiring layer provided therebeneath (e.g. all or selected layers of the wiring layers M4, M5), where a long wiring exists relatively frequently. Moreover, because the wiring short-circuiting failure is apt to occur at a portion where the space between adjacent wirings is narrow (e.g. at a portion where the adjacent wiring pitch is at 0.8 μm or below), the insulating film 7b may be provided only in the wiring layers having a portion wherein the space between adjacent wirings is narrow (e.g. all or selected layers of the wiring layers M1, M2 and M3). In addition, the insulating film 7b may be arranged, for example, only in the odd or even wiring layers. For instance, taking into account both a long wiring and the adjacent wiring space, the insulating film 7b may be provided only in the wiring layers M2, M4. Where a wiring layer made mainly of aluminium and a wiring layer made mainly a high melting metal exists among the wiring layers, the insulating film 7b is provided in the aluminum-based wiring layer, but it is not provided in the high melting metal-based wiring layer. In this case, the insulating film 7b may be provided in all layers of the aluminium-based wiring layer. Alternatively, the insulating film 7b may be formed at selected wiring layers alone among plural wiring layers made mainly of aluminium.

According to Embodiment 3, the deposition steps used in formation of the insulating film 7b can be reduced in number, so that the wiring short-circuiting failure is suppressed or prevented from occurring because of the reduced number of processing steps.

Embodiment 4

Figure 24:
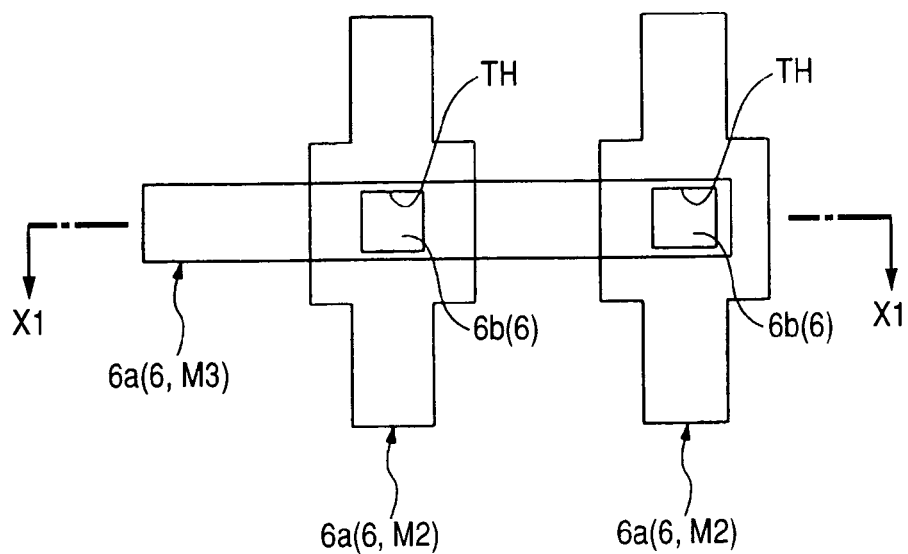
FIG. 24 is a diagrammatic plan view of a typical portion of a semiconductor device according to a further embodiment of the invention.
Figure 25:
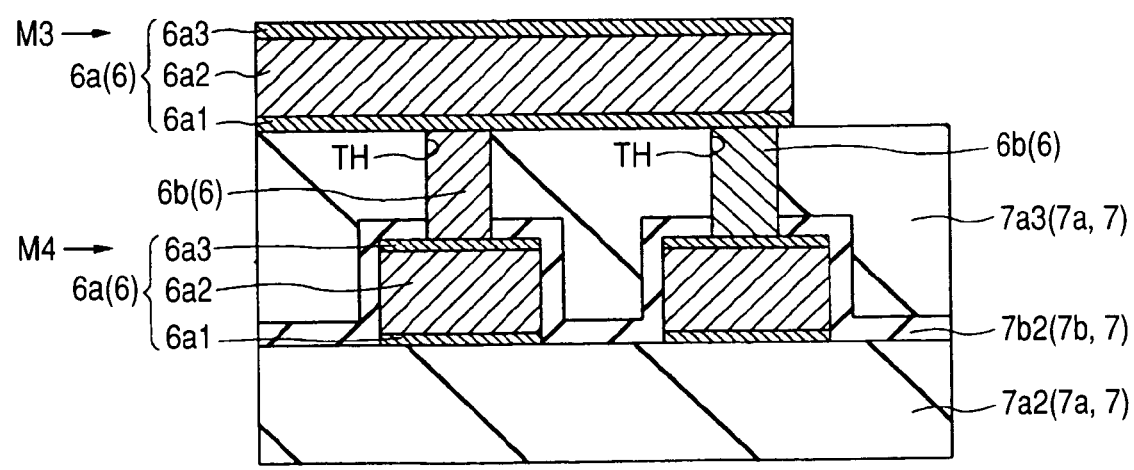
FIG. 25 is a sectional view, taken along the line X1-X1 in FIG. 24.

In Embodiment 4, there is a modification of the wiring structure. FIG. 24 is a plan view of the wiring 6a of the wiring layers M2, M3, and FIG. 25 is a sectional view, taken along line X1-X1 in FIG. 24. The wiring 6a of the wiring layer M2 is formed so as to be wider (in a dog-bone shape), at a portion which is connected with the wiring 6a of the wiring layer M3, than other portions thereof, while taking a discrepancy in alignment of the through-hole TH into account. In a conventional wiring forming technique, an insulating film serving as an etching stopper is provided, in some cases, so as to cover the wiring therewith while taking discrepancy in alignment into consideration. With the dog bone shape, no discrepancy of the alignment takes place, so that it is not necessary to provide any insulating film used for an etching stopper. In this embodiment, the insulating film 7b which is provided so as to cover the wiring 6a of the wiring layer M2, as shown in FIG. 25, is provided only for the discharge described hereinbefore.

Figure 26:
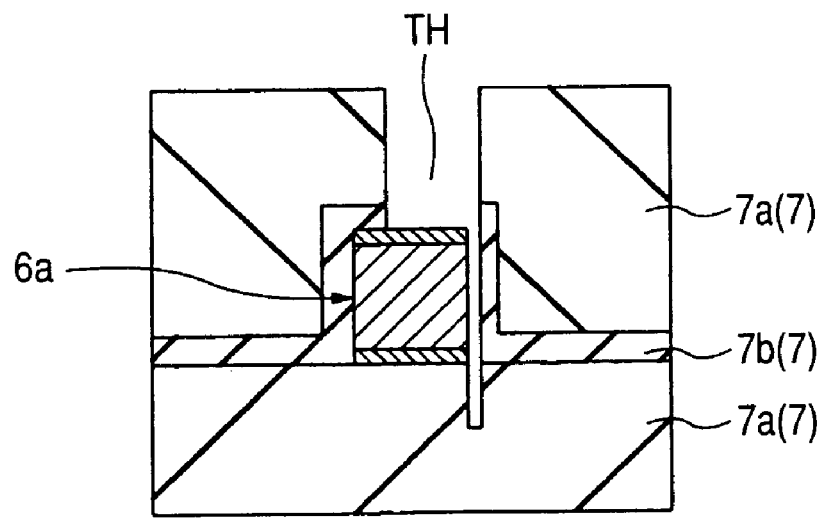
FIG. 26 is a sectional view of a structure illustrating the defect which we have studied.
Figure 27:
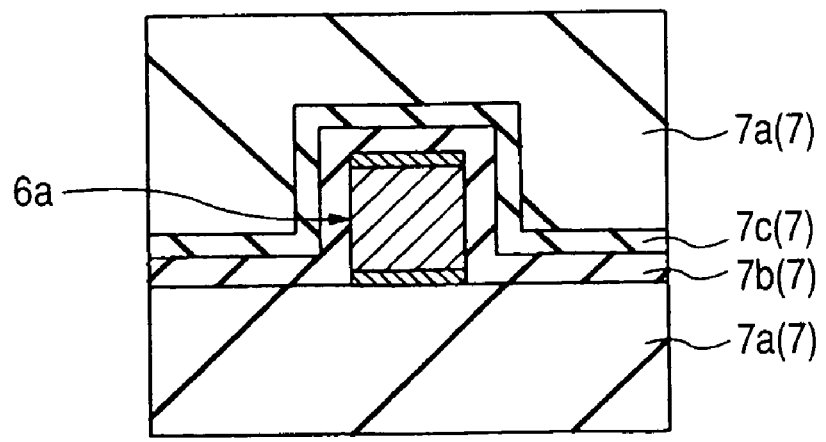
FIG. 27 is a sectional view of a typical portion of a semiconductor device according to a still further embodiment of the invention.

On the other hand, as shown in the sectional view of FIG. 26, with the width of the wiring 6a being substantially as narrow as the through-hole TH, when the position of the through-hole TH is formed so as to be shifted relative to the wiring 6a, it may be, in some case, that the insulating film 7b exposed from the bottom of the through-hole TH and the underlying insulating film 7a are etched. To avoid this, an insulating film 7c for use as an etching stopper is provided so as to be superposed on the insulating film 7b, as shown in FIG. 27. The insulating film is provided so as to escape the charge accumulated in the wiring 6a and should preferably be in contact with the wring 6a. The procedure used in forming the through-hole in this case is illustrated with reference to FIGS. 28 to 30.

Figure 28:
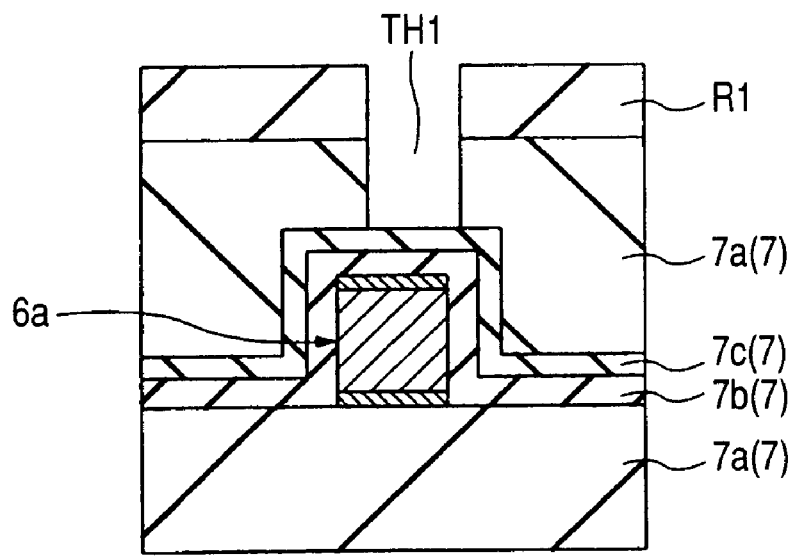
FIG. 28 is a sectional view of a typical portion in the course of manufacture of a semiconductor device for illustrating the problem checked by us.
Figure 29:
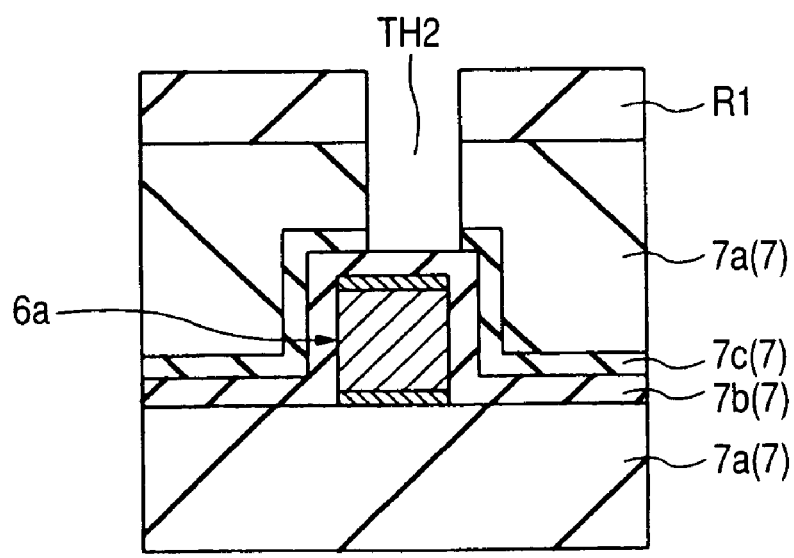
FIG. 29 is a sectional view of a typical portion of a wafer in the course of manufacture of the semiconductor device subsequent to FIG. 28.
Figure 30:
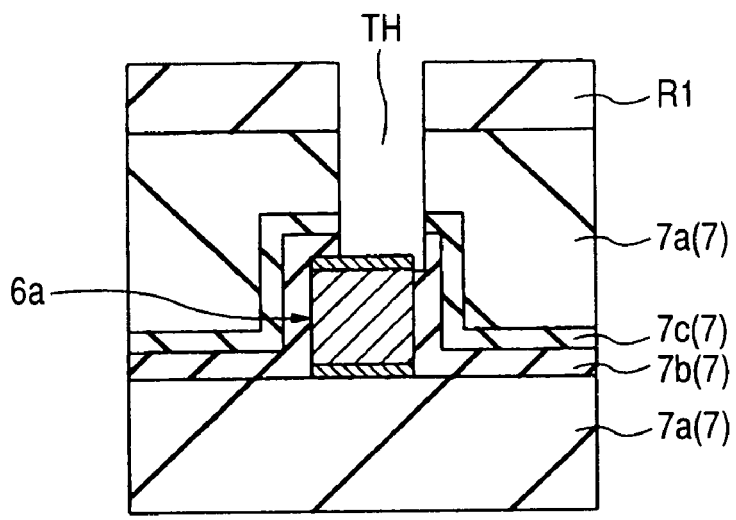
FIG. 30 is a sectional view of a typical portion of the wafer in the course of manufacture of the semiconductor device subsequent to FIG. 29.

First, as shown in FIG. 28, a through-hole TH1 is formed using a photoresist pattern (hereinafter referred to simply as a resist pattern) R1 as an etching mask. A t this time, the etching selection ratio of the insulating films 7a and 7c is so great that the insulating film 7a is removed under conditions where the insulating film 7a is more likely to be etched. Subsequently, as shown in FIG. 29, when the insulating film is exposed, the insulating film 7c is removed under conditions where the insulating film 7c is more likely to be etched than the insulating film 7a, thereby forming a through-hole TH2. Finally, the insulating film 7b, which is exposed from the bottom of the through-hole TH2, is etched, thereby forming a through-hole TH, wherein part of the wiring 6a is exposed, as shown in FIG. 30. In this case, the insulating film 7b may be etched more deeply than the upper surface of the wiring 6a at a discrepancy portion of alignment between the through-hole TH and the wiring 6a.

Figure 31:
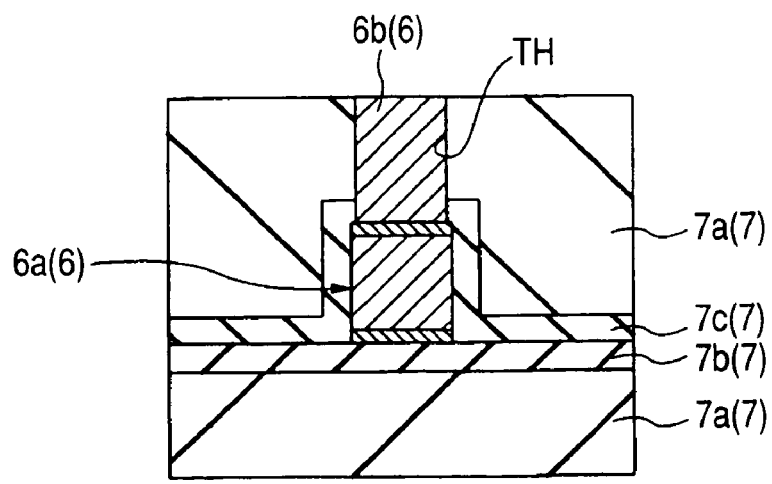
FIG. 31 is a sectional view of a typical portion of a semiconductor device according to another embodiment of the invention.
Figure 32:
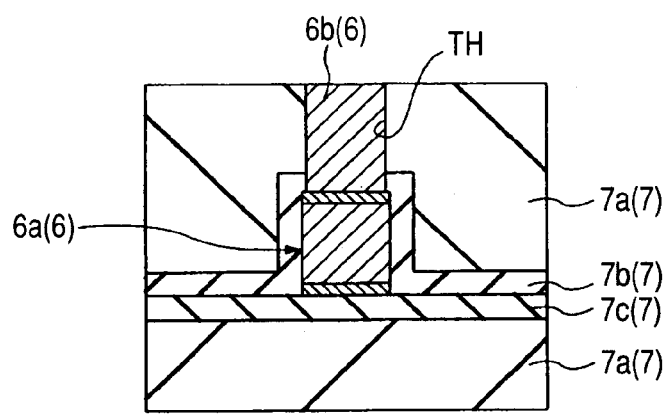
FIG. 32 is a sectional view of a typical portion of a semiconductor device according to still another embodiment of the invention.

Next, FIG. 31 shows an example of the case where Embodiment 4 is applied to the wiring structure of Embodiment 2. In this case, the insulating film 7a for use as an etching stopper is deposited so as to cover the wiring 6a therewith, on which the insulating film 7a is further deposited. If the alignment discrepancy between the through-hole TH and the wiring 6a takes place, excess etching does not occur. Next, FIG. 32 shows a modification of the wiring structure of Embodiment 4. In this case, the insulating film 7c for use as an etching stopper is formed as an underlying layer of the wiring 6a. More particularly, the insulating film 7c is formed on the insulating film 7a, on which the wiring 6a is formed, on which the insulating film 7b for discharge is further deposited so as to cover the wiring 6a therewith. In this connection, when an alignment discrepancy arises between the through-hole TH and the wiring 6a, the insulating film 7b at the discrepancy may be etched. Nevertheless, the existence of the underlying insulating film 7c prevents the underlying insulating film 7a from being etched.

Embodiment 5

Figure 33:
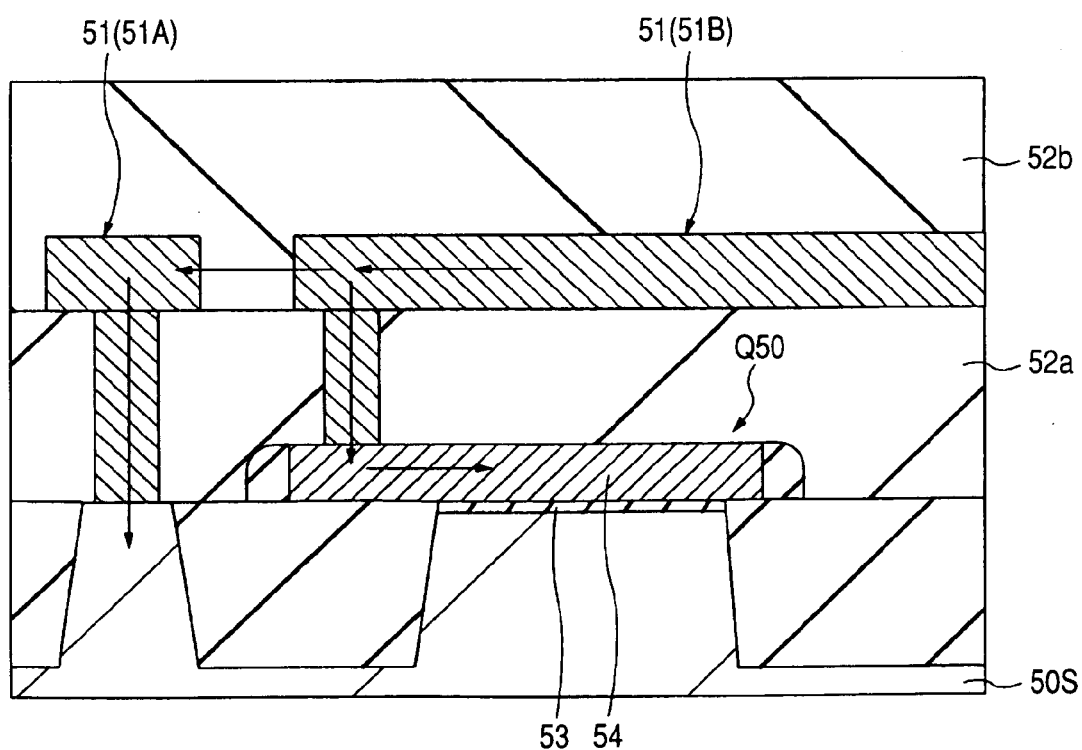
FIG. 33 is a sectional view of a typical portion in the course of manufacture of a semiconductor device for illustrating the problem checked by us.

In connection with Embodiment 5, application to an element layer will be described. FIG. 33 is a sectional view of a typical portion in the course of manufacture of a semiconductor device for illustrating the problem checked by us. Reference numeral 52a indicates an insulating film, reference numeral Q50 indicates a MIS, reference numeral 53 indicates a gate insulating film, and reference numeral 54 indicates a gate electrode. The charge and discharge phenomena of such a wiring arrangement as mentioned above involve, aside from the problem of short-circuiting failure between the wirings, a problem of inducing breakage of the gate insulating film 53 provided beneath the gate electrode 54 connected to a long wiring 51B. To avoid this, it is necessary to design the wiring connected to the gate electrode 54 so as to be short. This undesirably requires a larger number of connection wirings, with the attendant problem that the area of wirings increases, thereby leading to an increasing chip size. It is to be noted that the arrow in FIG. 33 indicates the path escape of an electric charge.

In such a case as set out above, when using the arrangements illustrated for the foregoing Embodiments 1 to 4, discharge is caused to take place between adjacent wirings prior to the breakage of the gate insulating film, so that the breakage of the gate insulating film can be reduced or prevented. In this connection, however, the following arrangement is also possible. More particularly, a structure may be used wherein an electric charge is allowed to escape from the gate electrode to the substrate.

Figure 34:
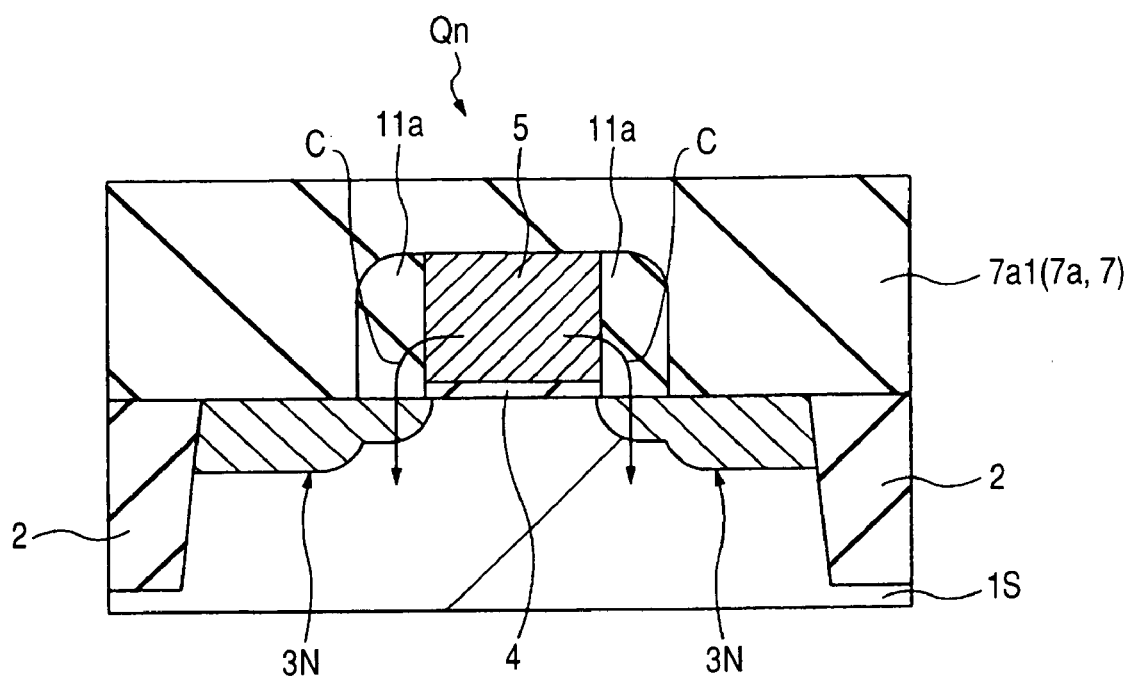
FIG. 34 is a sectional view of a typical portion of a semiconductor device according to yet another embodiment of the invention.

FIG. 34 indicates a specific arrangement for this. A sidewall 11a is formed on the side surfaces of the gate electrode 5. The side surface of the sidewall 11a is in direct contact with the gate electrode 5, and the bottom of the sidewall 11a is also in direct contact with the substrate 1S. The sidewall 11a is formed of an insulating film similar to the insulating film 7b. In this way, according to Embodiment 5, the electric charge passing through the wiring to the gate electrode 5 is allowed to escape, as shown by arrow C, from the side surface of the gate electrode 5 through the sidewall 11a to the substrate 1S. Accordingly, the breakage of the gate insulating film ascribed to the charging phenomenon in the wiring can be suppressed or prevented. As a consequence, the wiring connected to the gate electrode 5 can be elongated, thereby reducing the number of connection wirings with the possibility of reducing the chip size. This sidewall 11a is formed by forming the gate electrode 5, depositing an insulating film for forming the side wall 11a on a wafer, and etching back the insulating film using an anisotropic dry etching technique.

Figure 35:
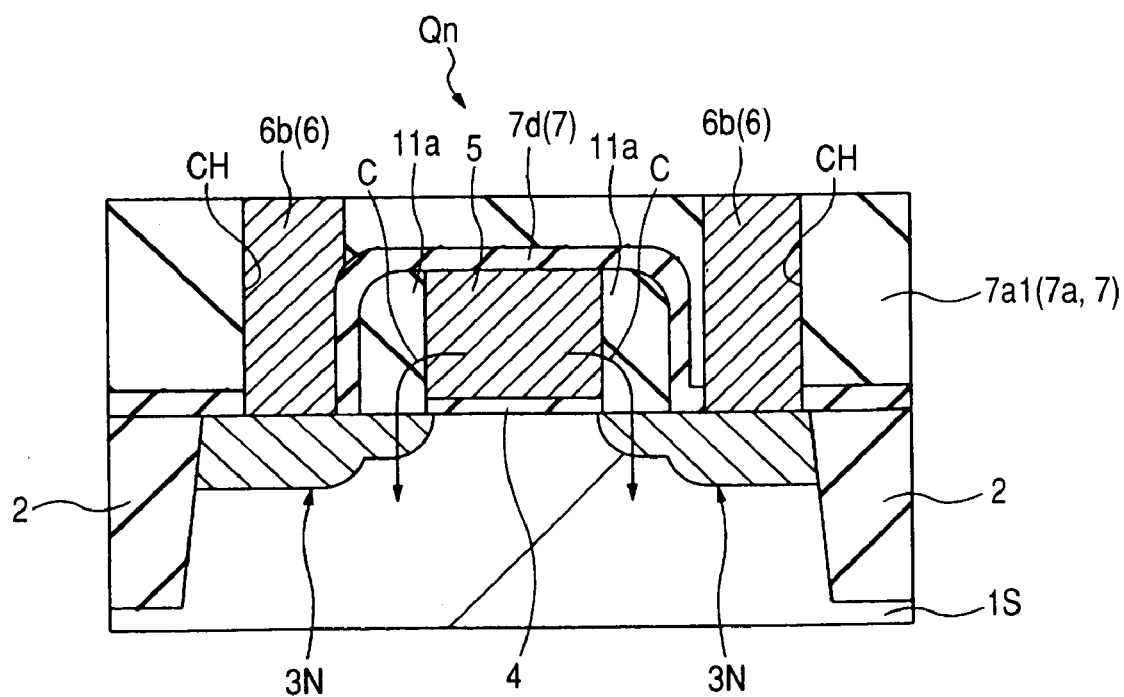
FIG. 35 is a sectional view of a typical portion of a semiconductor device according to a further embodiment of the invention.

FIG. 35 shows a modification of FIG. 34. In this instance, the insulating film 7d for use as an etching stopper is deposited on the main surface of the substrate 1S so as to cover the gate electrode 5 and the sidewall 11a. The insulating film 7d is made, for example, of a silicon nitride film. In doing so, not only will such effects as obtained in FIG. 34 be obtained, but also the problem ascribed to the alignment discrepancy of the contact hole CH can be mitigated or avoided. More particularly, if the position of the contact hole CH is shifted, the gate electrode is prevented from being exposed therefrom. This ensures an improved yield of the semiconductor device.

Figure 36:
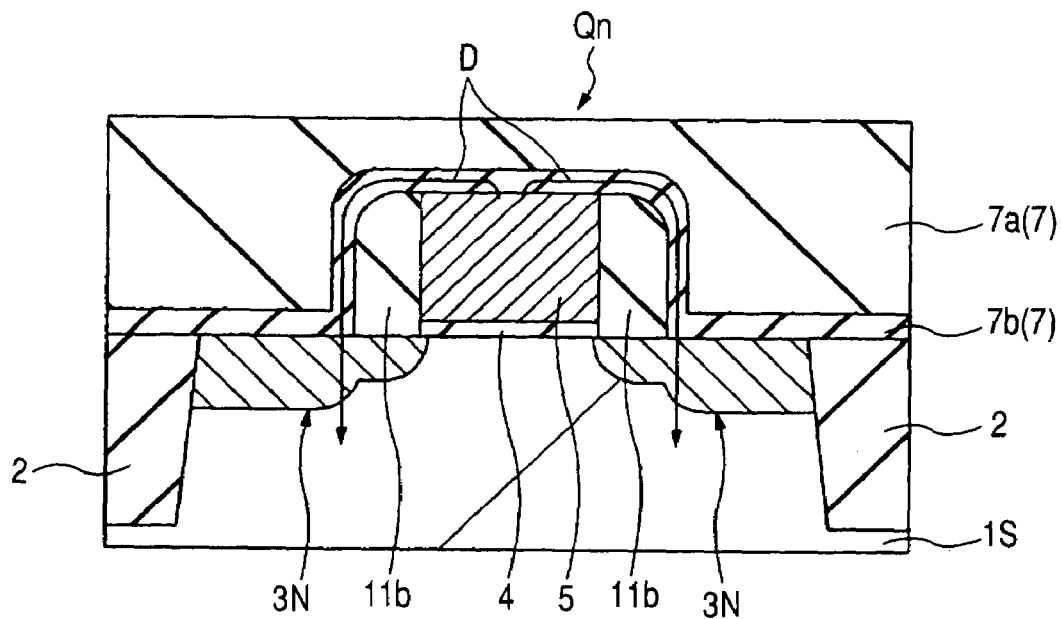
FIG. 36 is a sectional view of a typical portion of a semiconductor device according to another embodiment of the invention.
Figure 37:
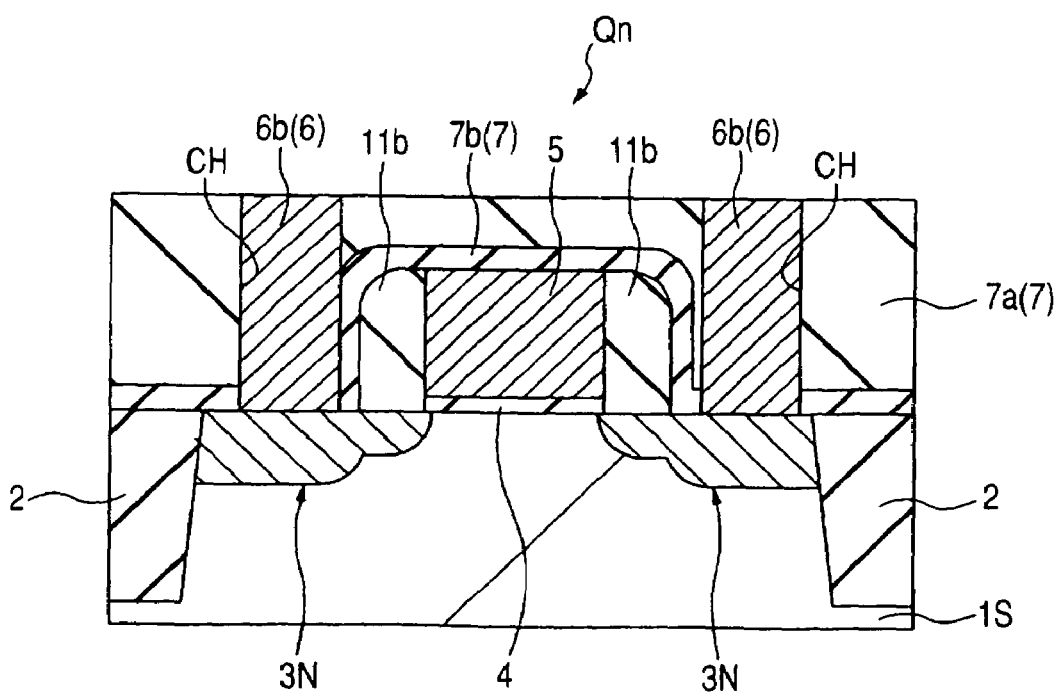
FIG. 37 is a sectional view of a typical portion showing the state where contact holes and plugs are provided at the semiconductor device of FIG. 36.

FIGS. 36 and 37 show another modification of FIG. 34. FIG. 37 shows the case where the contact hole CH and the plug 6b are, respectively, formed in FIG. 36. In this case, the sidewall 11b at the side surface of the gate electrode 5 is made, for example of a silicon nitride film or silicon oxide film. The insulating film 7b for discharge is deposited on the main surface of the substrate 1S so as to cover the gate electrode 5 and the sidewall 11b therewith. In this case, the charge flowing through the wiring to the gate electrode 5 can escape, as shown by arrow D, from the upper surface of the gate electrode 5 through the insulating film 7b to the substrate 1S. The formation of the sidewall 11b with a silicon nitride film can mitigate or avoid the problem caused by the alignment discrepancy at the contact hole CH. In this case, the sidewall is formed by etching back, after which the insulating film 7b is deposited as stated hereinabove.

Figure 38:
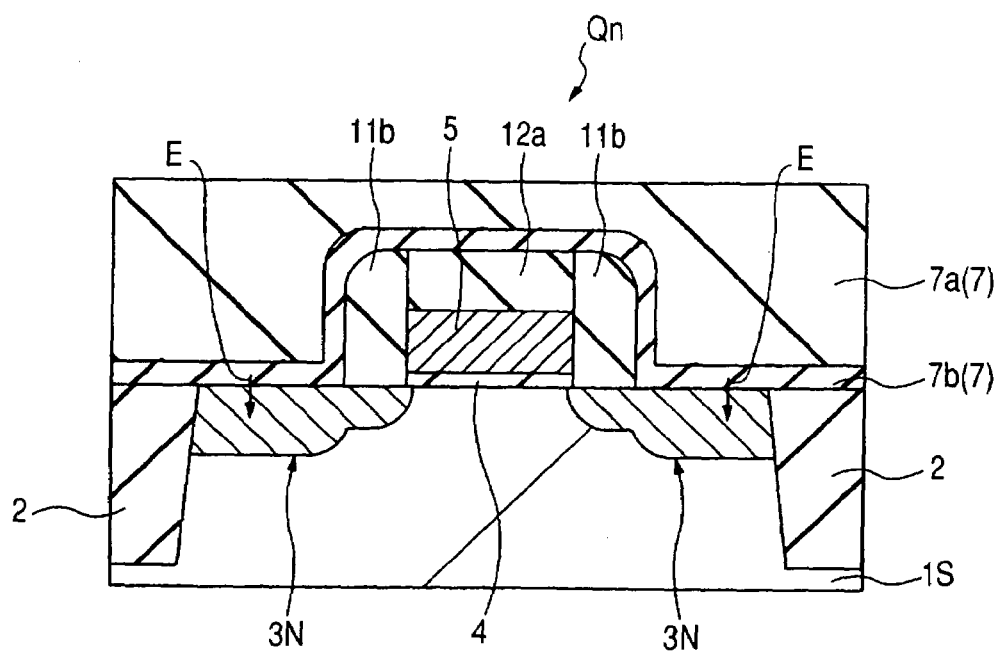
FIG. 38 is a sectional view of a typical portion of a semiconductor device according to another embodiment of the invention.
Figure 39:
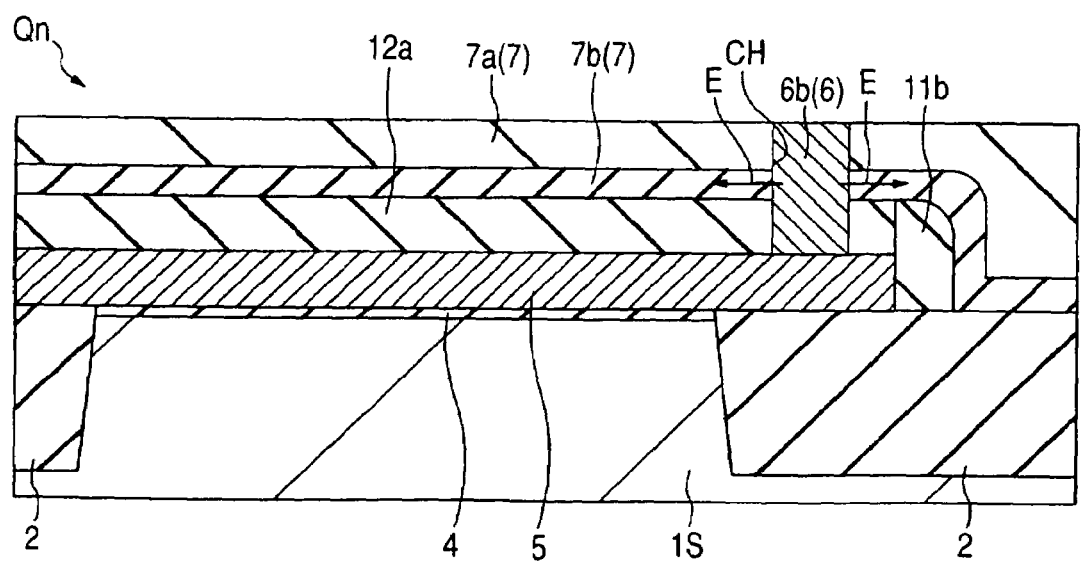
FIG. 39 is a sectional view of a typical portion at a face vertical to the section of FIG. 38.

FIGS. 38 and 39 show a further modification of FIG. 34. FIG. 39 shows a section transverse to the section of FIG. 38. In this modification, a cap insulating film 12a, that is made, for example, of a silicon oxide film or silicon nitride film, is formed on the gate electrode 5. The insulating film 7b for discharge is deposited on the main surface of the substrate 1S so as to cover the sidewall 11b and the cap insulating film 12 therewith. In this case, the charge passing through the wiring to the gate electrode 5 can escape, as shown by arrow E, from a portion in contact with the insulating film 7b of the plug 6b within the contact hole CH to the substrate 1S. If the sidewall 11b and the cap insulating film 12a, respectively, are formed of a silicon nitride film, or if the insulating film 7d for use as an etching stopper is formed as in FIG. 35, the problem ascribed to the alignment discrepancy at the contact hole CH can be mitigated or avoided.

Figure 40:
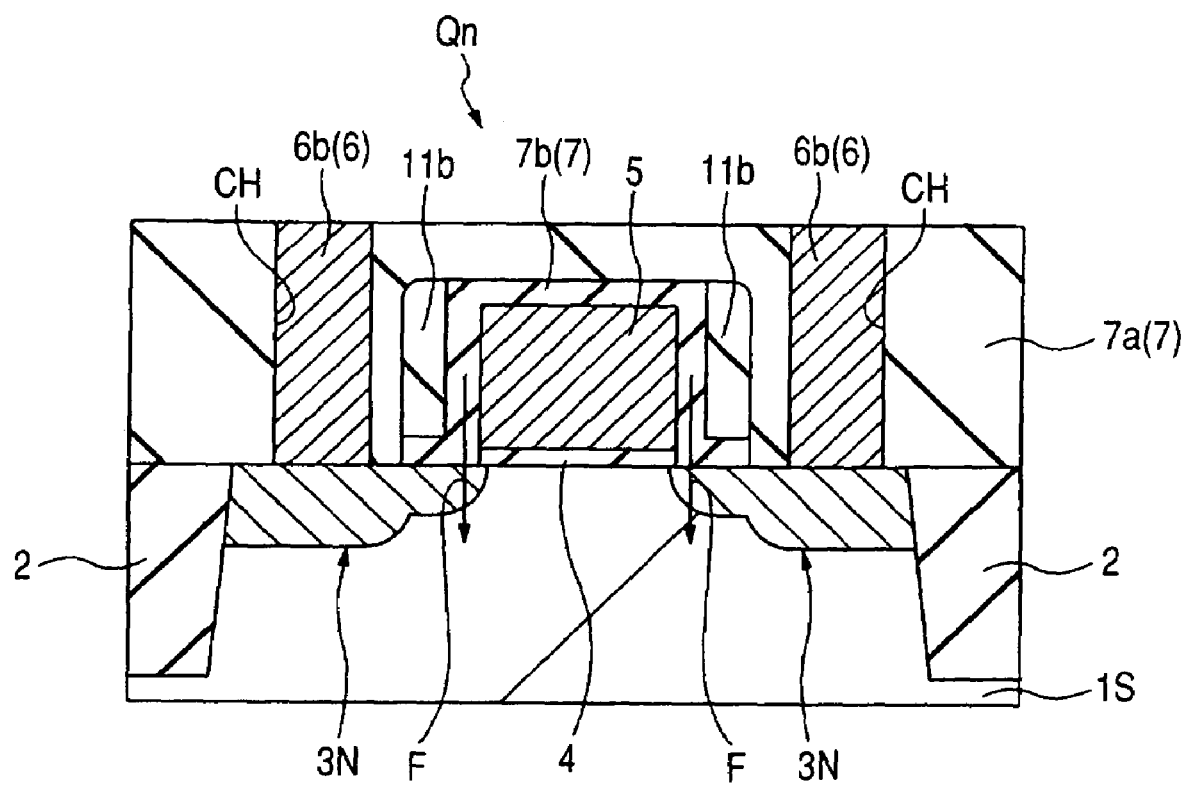
FIG. 40 is a sectional view of a typical portion of a semiconductor device according to another embodiment of the invention.

FIG. 40 shows a still further modification of FIG. 34. In this modification, the insulating film 7b for discharge is formed so as to cover the gate electrode 5 at side and upper surfaces thereof. This insulating film 7b is in contact with the side and upper surfaces of the gate electrode 5, and it is also in contact with the main surface of the substrate 1S. The gate electrode 5 has the sidewall 11b formed through the insulating film 7b at the side surfaces thereof. In this case, the charge passing through the wiring to the gate electrode 5 can escape, as shown by arrow F, from the side and upper surfaces of the gate electrode 5 through the insulating film 7b to the substrate 1S. If the sidewall 11b is formed of a silicon nitride film, or if the insulating film 7d is formed as shown in FIG. 35, then the problem ascribed to the alignment discrepancy of the contact hole CH can be mitigated or avoided. For the formation of such an arrangement as set out above, after formation of the gate electrode 5, the insulating 7d is deposited on the wafer, followed by further deposition of an insulating film for the formation of the sidewall 11b and etching back the insulating film for the formation of the sidewall 11b using a dry etching technique.

It will be noted that, although applications to nMISQn have been illustrated in Embodiment 5, this embodiment may be applied as well to a pMISQp. The arrangement of Embodiment 5 exhibits good effects by itself, and when combined with the foregoing Embodiments 1 to 4, good results are also obtained from the standpoint of mitigating and preventing the short-circuiting failure between wirings and the gate insulation breakage.

Embodiment 6

Figure 41:
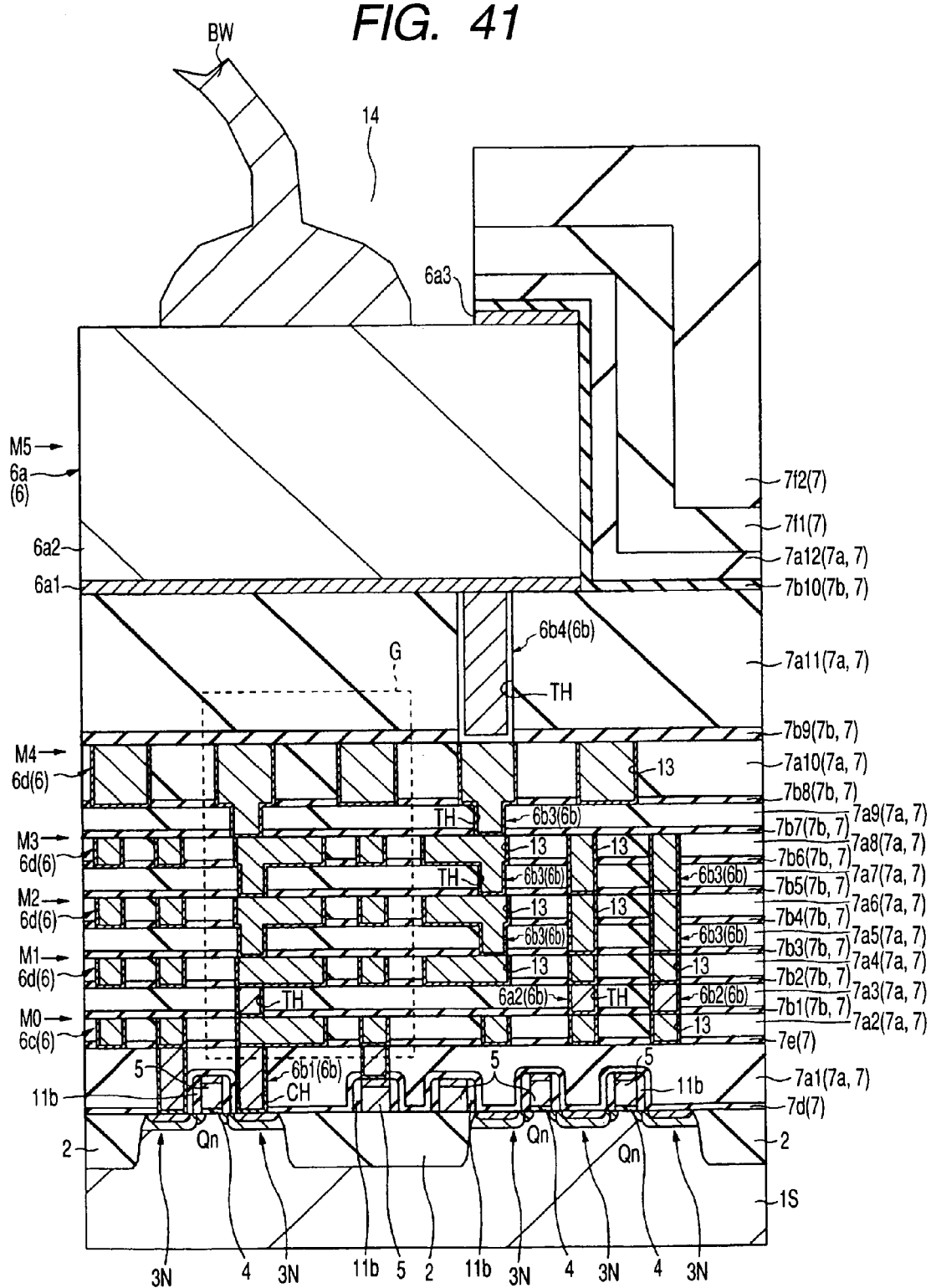
FIG. 41 is a sectional view of a typical portion of a semiconductor device according to still another embodiment of the invention.
Figure 42:
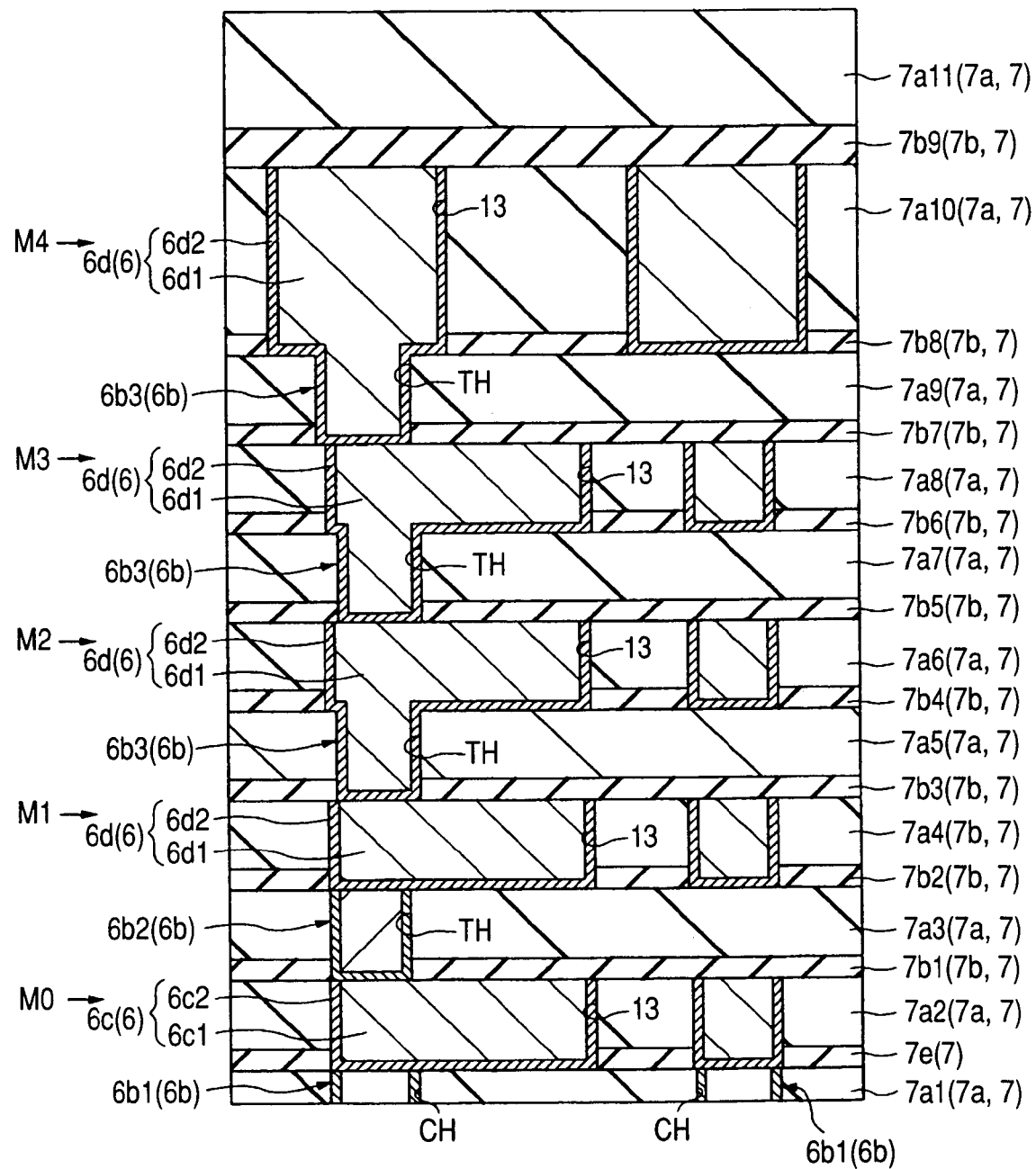
FIG. 42 is an enlarged sectional view of the region G of FIG. 40.

In Embodiment 6, there is application of the invention to a Damascene wiring structure. FIG. 41 is a sectional view of an essential part of a semiconductor device according to Embodiment 6, and FIG. 42 is an enlarged, sectional view of a region G of FIG. 41.

A wiring portion 6 of a wiring structure in the semiconductor device of Embodiment 6 has a wiring 6c of an undermost wiring layer M0, a wiring 6d provided in the respective intermediate wiring layers M1 to M4, a wiring 6a provided in an uppermost wiring layer M5, and a plug 6b (6b1 to 6b4) provided between adjacent wirings or a wiring and a substrate. The wiring layers M0 to M4 are provided as a Damascene wiring structure, respectively, and the uppermost wiring layer M5 is formed as such an ordinary wiring structure as illustrated by the foregoing Embodiments 1 and 2. The wiring 6c of the undermost wiring layer M0 is formed so as to be buried within a wiring groove (i.e. an opening for wiring) 13, and it has a conductor film 6c1 for a main wiring material, such as, for example, tungsten or the like, and a conductor film 6c2 for a barrier, such as titanium nitride (TiN) or the like, arranged to side and bottom surfaces of the conductor film for the main wiring material. The wiring 6d in the intermediate wiring layers M1 to M4 is formed so as to be buried within the wiring groove 13, and it has a conductor film 6d1 for a main wiring material, such as of copper (Cu) or the like, and a conductor film 6d2 for a barrier that is provided at the side and bottom surfaces of the conductor film for the main wiring material and is made of a single film or builtup film of titanium nitride (TiN), tantalum (Ta) or tantalum nitride (TaN). The plugs 6b1, 6b4 are, respectively, those illustrated in connection with the foregoing Embodiments 1 to 5. The plug 6b2 has a conductor film for main wiring material, such as, for example, copper, and a conductor for a barrier that is formed on the side and bottom surfaces of the conductor film for main wiring material and is made, for example, of a single film or built-up film of titanium nitride, tantalum or tantalum nitride. The plug 6b3 is formed integrally with the just above wiring 6d.

The insulating portion 7 has an insulating film 7a (7a1 to 7a12), an insulating film 7b(7b1 to 7b10) and insulating films 7d, 7e, 7f1 and 7f2. The insulating films 7a1 to 7a11 may be made, aside from the materials exemplified in the foregoing Embodiment 1, of a single film consisting of an insulating film of low dielectric constant (low-K insulating film), such as, for example, of SiOF, or a builtup structure wherein a silicon oxide film or the like is deposited on the single film. The low-K insulating film is one which has a dielectric constant that is lower than a silicon oxide film and is constituted by an insulating film of low dielectric constant having a dielectric constant similar to a specific inductive capacity of ⊔=4.1 to 4.3 of the TEOS oxide film. Using the arrangement having the low-K insulating film, the dielectric constant of the insulating film 7a can be lower as compared to the case where the insulating film 7a is formed of a silicon oxide film. For the low-K insulating film, an organic polymer material such as, for example, SILK (made by Dow Chemical Co., with specific inductive capacity=2.7, heat-resistant temperature=490° C. or over, and dielectric breakdown voltage=4.0 to 5.0 MV/Vm) or FLARE (made by Honeywell electric Materials, with specific inductive capacity=2.8 and heat-resistant temperature=400° C. or over) of a polyallyl ether (PAE) material, or an organic silica glass (SiOC) material, such as HSG-R7 (made by Hitachi Chemical Co., Ltd., with specific inductive capacity=2.8 and heat-resistant temperature=650° C.), Black Diamond (made by Applied Materials, Inc., with specific inductive capacity=3.0 to 2.4 and heat resistant temperature=450° C.), p-MTES (made by Hitachi Development Co., Ltd., with specific inductive capacity=3.2) or the like may be used. In this case, the dielectric constant can be lowered in a similar way to that mentioned above.

The insulating film 7e is a film which functions mainly as an etching stopper and is made, for example, of silicon nitride ($Si_3N_4$ or the like), silicon carbide (SiC) or silicon carbide nitride (SiCN). The reason why the insulating film 7e is used in the wiring layer M0 without use of the insulating film 7b for discharge is that the main wiring material for the wiring 6c of the wiring layer M0 is mainly made of a high melting point metal, such as tungsten, so that no problem of short-circuiting failure between adjacent wirings ascribed to the discharge arises. From this point of view, although the insulating film 7b1 may be formed of the insulating film 7e, the insulating film 7b1 is connected via the plug 6b2 to the wiring 6d made of copper in the wiring layer M1 used as a main wiring material, and, thus, it is formed of the insulating film 7b for discharge. The insulating film 7b (7b1 to 7b10) is so arranged as to be in contact with the wirings 6d, 6a and the plugs 6b2 to 6b4. In this manner, Embodiment 6 ensures similar effects as those achieved in the foregoing Embodiments 1, 2. The insulating films 7a12, 7f1, 7f2 are those films serving as a surface protecting film, wherein the insulating film 7a12 is made, for example, of a silicon oxide film or the like, the insulating film 7f1 is made, for example, of a silicon nitride film or the like, and the insulating film 7f2 is made, for example, a polyimide resin film or the like. The insulating films 7a12, 7f1, 7f2 are, respectively, formed at part thereof with an opening 14 through which part of the fifth-layer wiring 6a is exposed. The portion (bonding pad hereinafter referred to as pad) of the wiring 6a exposed from the opening 14 is bonded with a bonding wire BW. In Embodiment 6, the insulating film 7b may be selectively formed in the wiring layers M1 to M4 using copper as a main wiring material, like Embodiment 3. This ensures similar effects as in the foregoing Embodiment 3.

Figure 43:
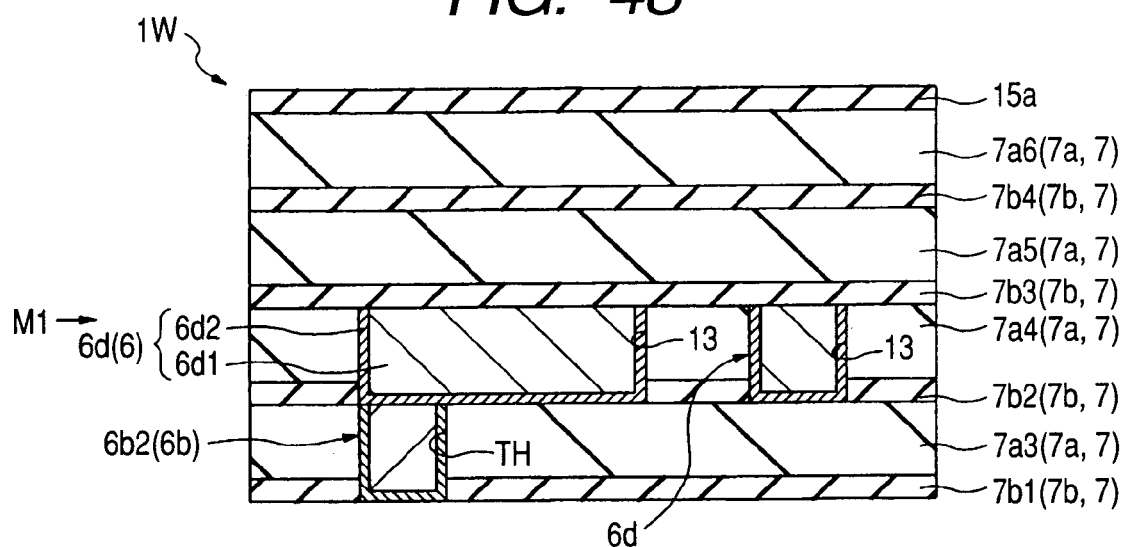
FIG. 43 is a sectional view of a typical portion of a wafer in the course of manufacture of the semiconductor device of FIG. 41.

Next, an example of a method of manufacturing the semiconductor device according to Embodiment 6 will be described. FIG. 43 is a sectional view of a typical part of the wafer 1W in the course of the manufacture of semiconductor device of Embodiment 6. In this figure, a case where the wiring 6d in the first-layer wiring layer M1 has been formed by a single Damascene method is shown. The insulating film 7b is made, for example, of silicon oxynitride (SiON) or the like. A n insulating film 15a is made, for example, of a silicon oxynitride deposited on the insulating 7a6. In this case, if, after deposition of the insulting film 15a, the film is subjected to cleaning with a cleaning device 10 (see FIG. 11) using the afore-indicated brush BR, an electric charge is accumulated in the wiring 6d of the wiring layer M1 by electrostatic action, and the charge escapes from the upper surface side of the wiring 6d via the insulating films 7b2, 7b1 to the ground potential GP, thereby permitting the charge to be discharged at a stage where the charge accumulation in the wiring 6d is low. Thus, the heat release value caused by the discharge can be suppressed to a low level. Accordingly, a short-circuiting failure between the wirings 6d and 6d using copper as a main wiring material can be suppressed or prevented.

Figure 44:
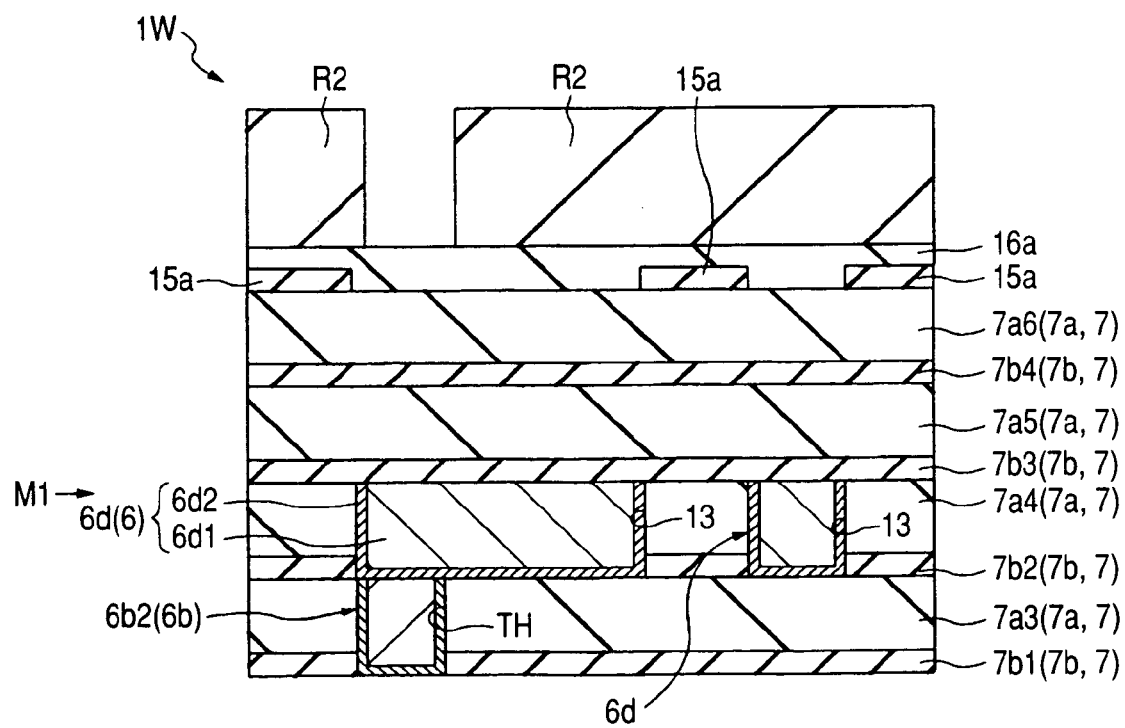
FIG. 44 is a sectional view of a typical portion of the wafer in the course of manufacture of the semiconductor device subsequent to FIG. 43.
Figure 45:
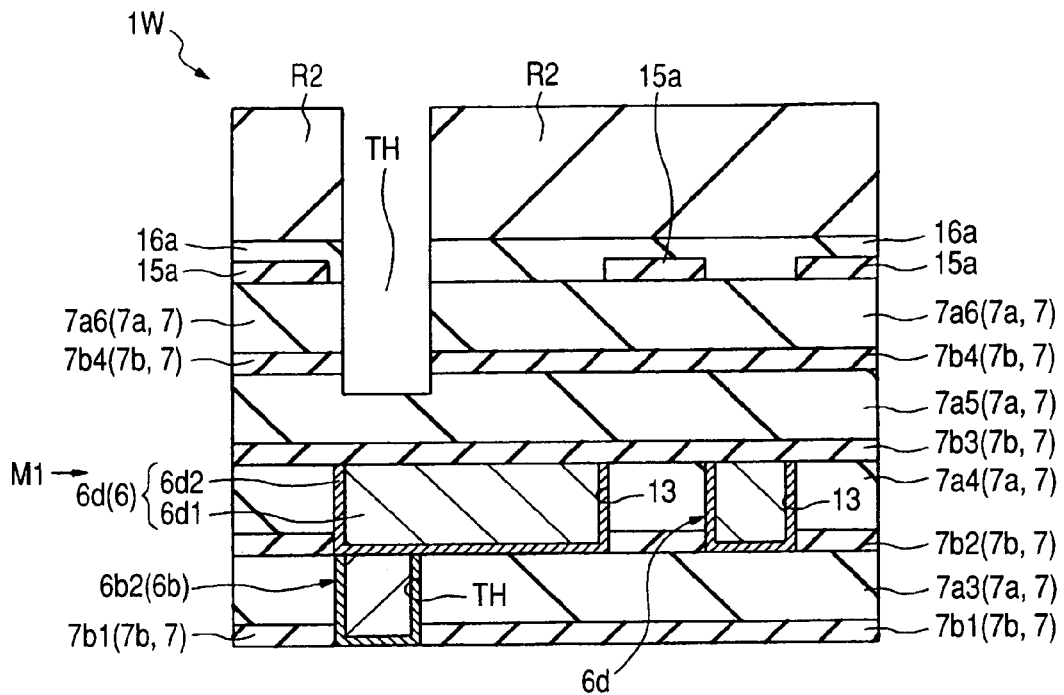
FIG. 45 is a sectional view of a typical portion of the wafer in the course of manufacture of the semiconductor device subsequent to FIG. 44.
Figure 46:
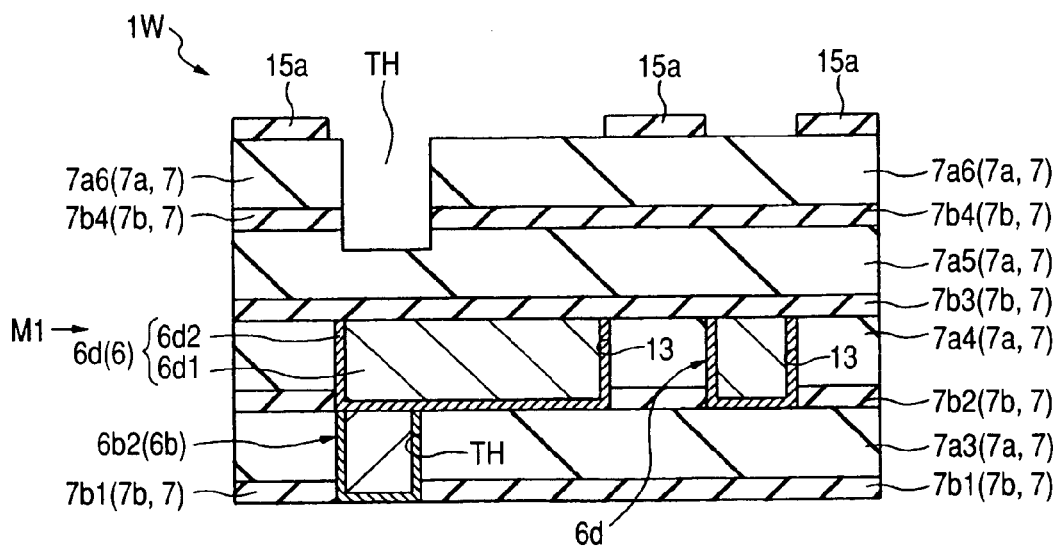
FIG. 46 is a sectional view of a typical portion of the wafer in the course of manufacture of the semiconductor device subsequent to FIG. 45.
Figure 47:
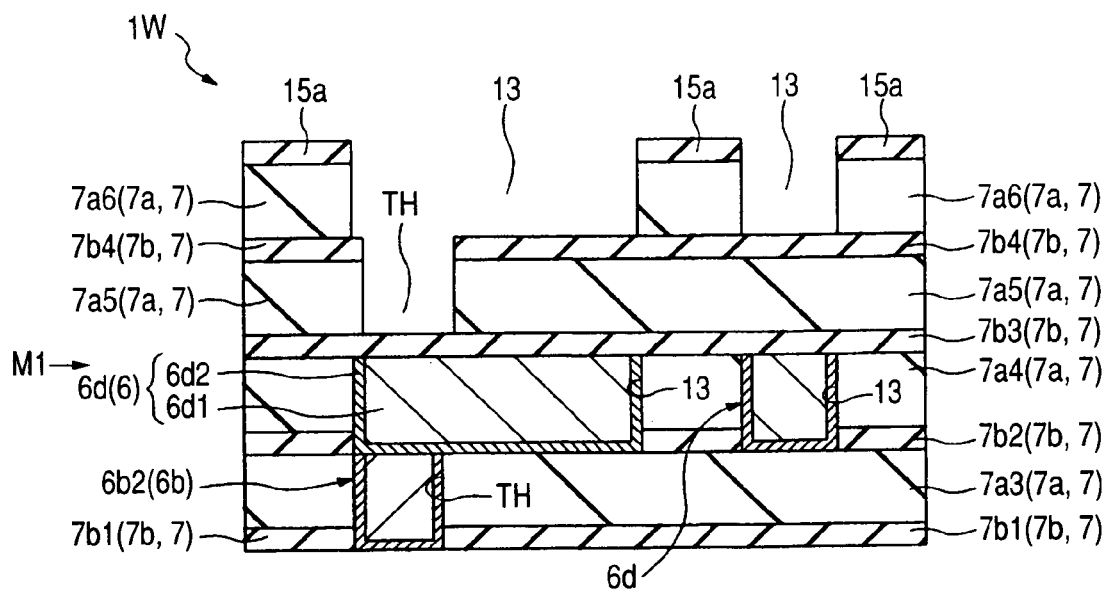
FIG. 47 is a sectional view of a typical portion of the wafer in the course of manufacture of the semiconductor device subsequent to FIG. 46.
Figure 48:
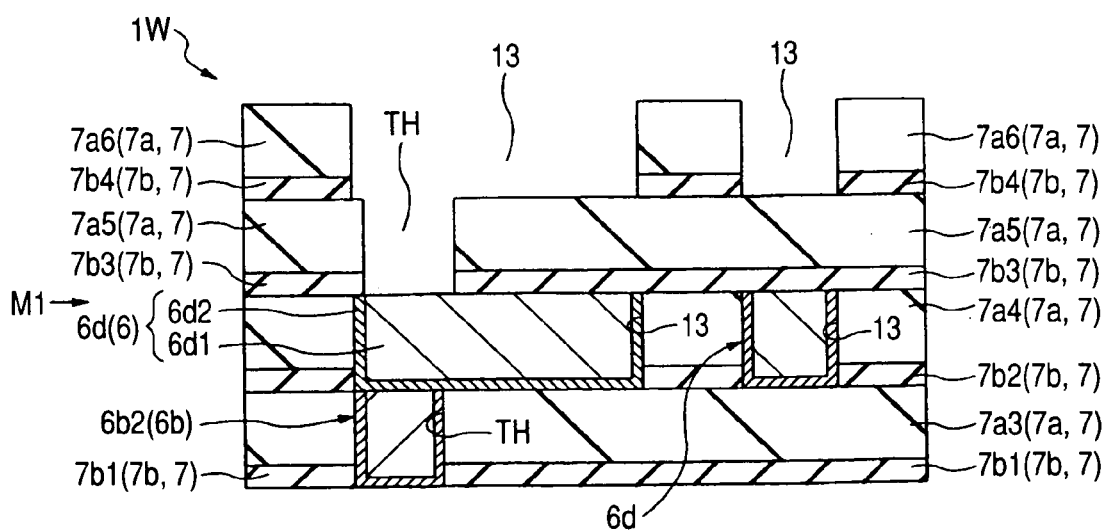
FIG. 48 is a sectional view of a typical portion of the wafer in the course of manufacture of the semiconductor device subsequent to FIG. 47.
Figure 49:
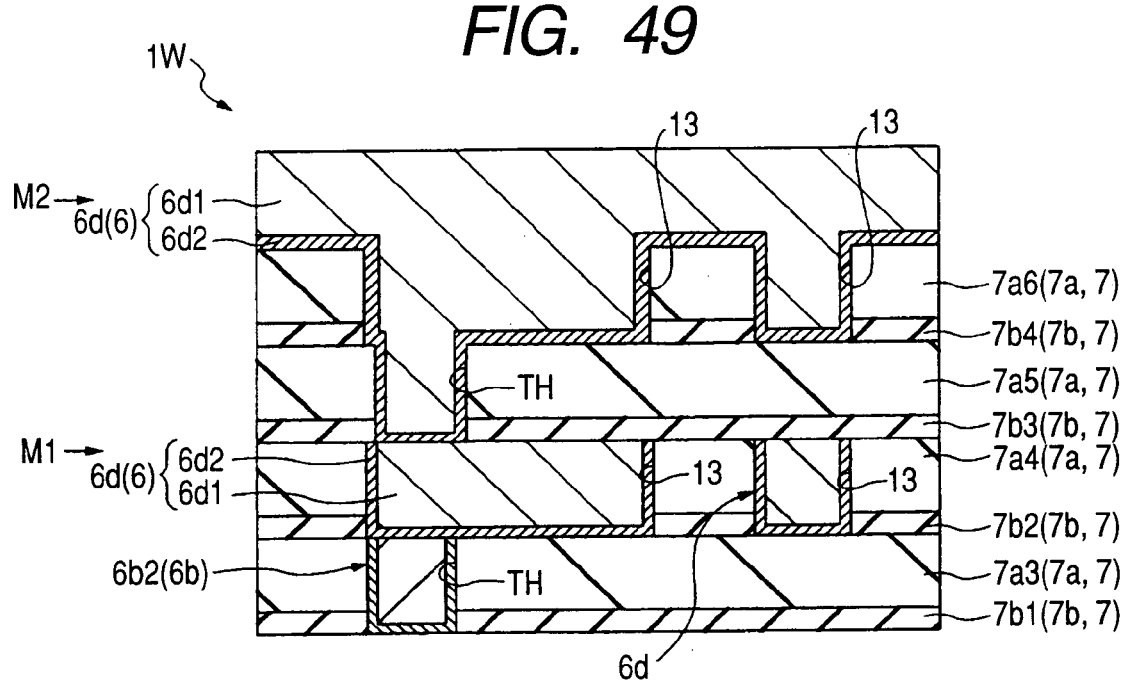
FIG. 49 is a sectional view of a typical portion of the wafer in the course of manufacture of the semiconductor device subsequent to FIG. 48.
Figure 50:
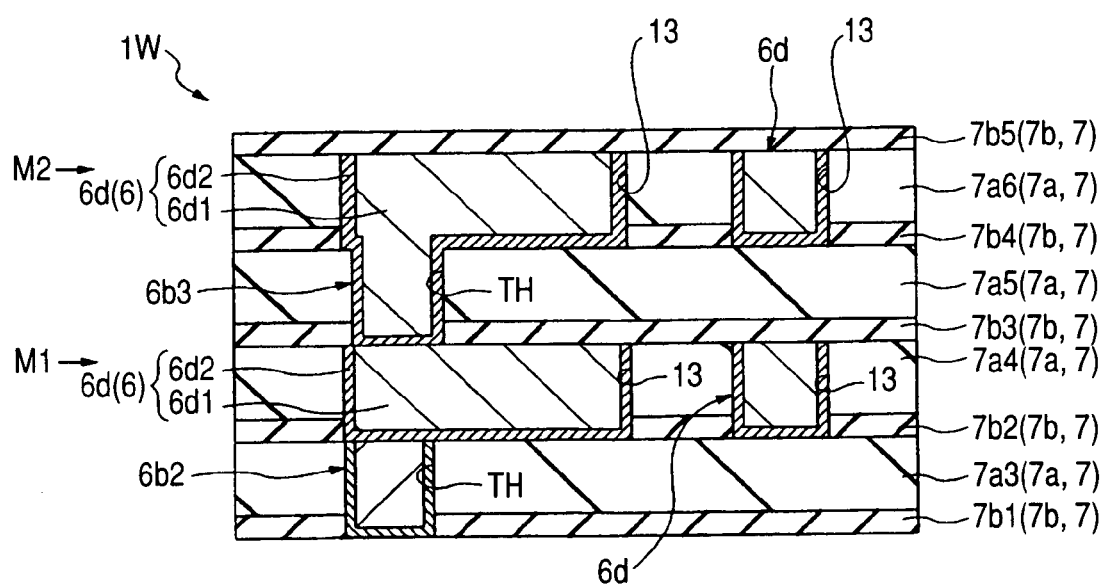
FIG. 50 is a sectional view of a typical portion of the wafer in the course of manufacture of the semiconductor device subsequent to FIG. 49.

Subsequently, the insulating film 15a is subjected to patterning by lithography and dry etching, as shown in FIG. 44, after which an antireflective film 16a is deposited on the main surface of the wafer 1W, followed by further formation of a resist pattern R2 for forming a through-hole. Thereafter, the antireflective film 16a and the insulating films 7a6, 7b4, 7a5 are etched by use of the resist pattern R2 as an etching mask, thereby forming a through-hole TH, which is substantially circular in plane view, as shown in FIG. 45. The through-hole TH at this stage is not fully opened, with its bottom being stopped at an intermediate portion of the insulating film 7a5 along the thickness direction thereof. Thereafter, the resist pattern R2 and the antireflective film 16a are removed, as shown in FIG. 46, after which the insulating films 7a6, 7a5 are selectively etched using the insulating film 15 as a mask in a condition where the insulating films 7b4, 7b3 function as an etching stopper, thereby forming a wiring groove 13 and the through-hole TH, as shown in FIG. 47. The through-hole TH at this stage is not yet fully opened, with its bottom being stopped at the insulating film 7b3. Thereafter, the insulating films 15a, 7b3, 7b4 are selectively etched, respectively, thereby fully forming the wiring groove 13 and the through-hole (an opening for wiring) TH. Part of the upper surface of the wiring in the wiring layer M1 is exposed from the bottom of the through-hole TH. Next, a conductor 6d2 for a barrier, which is made, for example, of a single film of titanium nitride or tantalum nitride or a builtup film thereof, is deposited by sputtering, as shown in FIG. 49, followed by further formation of a conductor film 6d1, which is made, for example, of copper or the like by a plating method or CVD method. Thereafter, the conductor films 6d1, 6d2 are polished by a CMP method to form a buried structure of the wiring 6d in the second-layer wiring layer M2, as show in FIG. 50. After the CPM treatment, cleaning is carried out by use of the cleaning device 10 using the brush BR (FIG. 11). If an electric charge is accumulated in the wiring 6d of the wiring layers M1, M2 by electrostatic action, the charge can escape through the insulating films 7b1 to 7b4 to the ground potential GP, so that discharge is allowed at a stage where the charge accumulation in the wiring 6d is low and it is possible to suppress the heat release value caused by the discharge to a low level. Thus, a short-circuiting failure between the wirings 6d, 6d of the wiring layers M1, M2 made mainly of copper as a main wiring material can be suppressed or prevented. Thereafter, for the main purpose of suppressing and preventing copper from diffusing, the CMP surface is subjected to plasma treatment in an atmosphere of ammonia or hydrogen gas, after which the insulating film 7b5 is deposited on the main surface of the wafer 1W so as to be in contact with the upper surface of the wiring 6d of the wiring layer M2. Thereafter, the insulating film 7b5 is cleaned. In this case, the short-circuiting failure of wirings ascribed to the discharge phenomenon between adjacent wirings can be suppressed or prevented in the same manner as set out hereinbefore.

Embodiment 7

Figure 51:
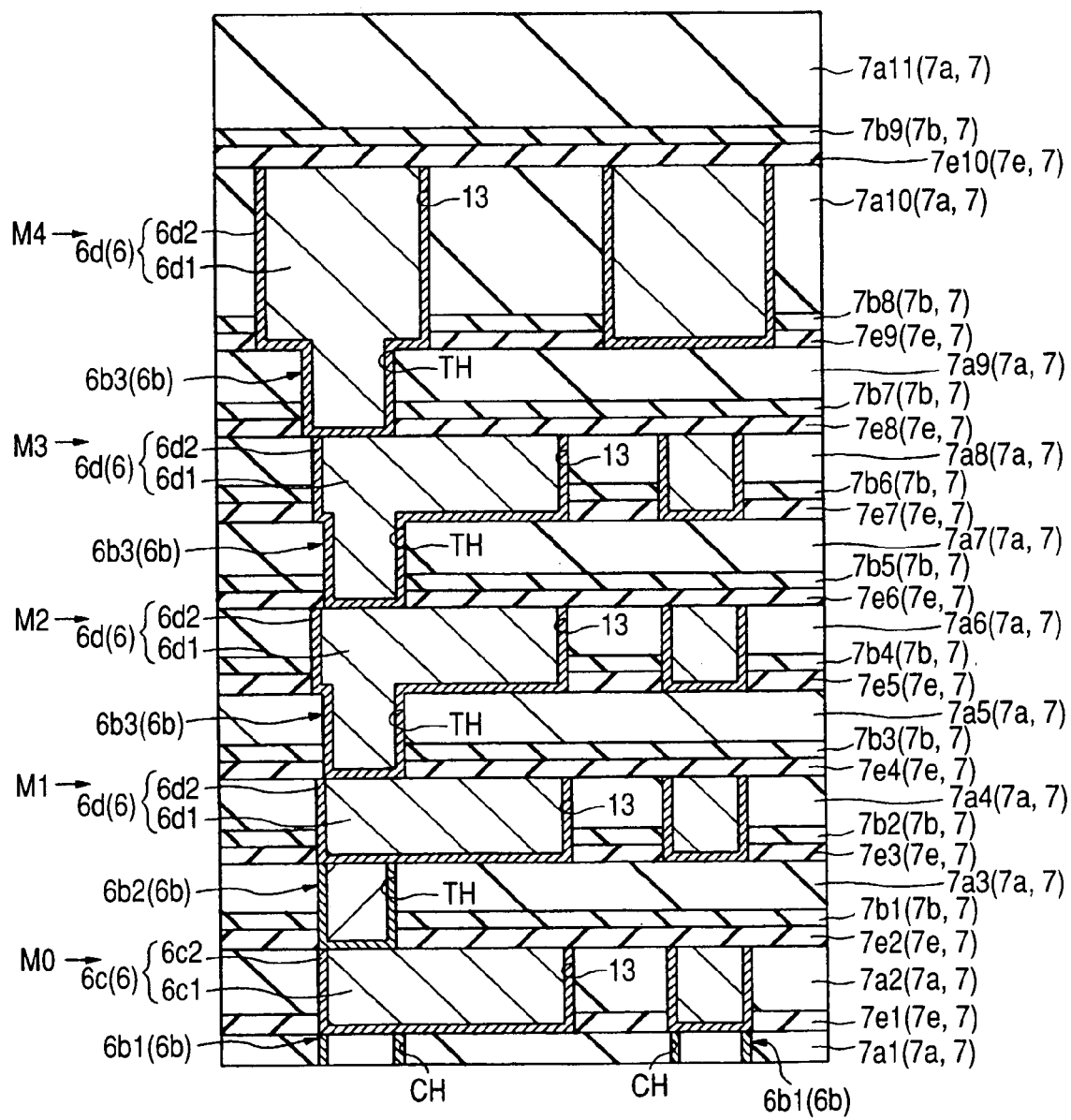
FIG. 51 is a sectional view of a typical portion of a semiconductor device according to another embodiment of the invention.

In Embodiment 7, a modification in the case of application of the invention to a Damascene wiring structure is considered. FIG. 51 is a sectional view of an essential part at the same portion as region G of FIG. 41 of a semiconductor device of Embodiment 7.

In Embodiment 7, a plurality of insulating films 7e (7e1 to 7e10) are provided in the insulating portion 7 of a wiring structure. The insulating film 7e in this embodiment has, aside from the function as an etching stopper, as set forth hereinbefore, the function of suppressing or preventing copper diffusion, and it is made, for example, of silicon nitride, silicon carbide, silicon carbide nitride or the like, as mentioned hereinbefore. First, the insulating films 7e2, 7e4, 7e6, 7e8, 7e10, respectively, are provided in contact with the wirings 6c, 6d of the respective wiring layers M0 to M4. This ensures an improved capability of suppressing or preventing diffusion of copper in the wiring 6d of the respective wiring layers M1 to M4. The insulating films 7e2, 7e4, 7e6, 7e8, 7e10 are provided thereon in contact with such insulating films 7b1, 7b3, 7b5, 7b7, 7b9 for discharge, as shown in connection with Embodiment 1, and they are made, for example, of a silicon-rich silicon oxide film or a silicon oxynitride (SiON) film. The insulating films 7b1, 7b3, 7b5, 7b7, 7b9 are in contact with the plugs 6b2, 6b3 at the side surfaces thereof. On the other hand, the insulating films 7e3, 7e5, 7e7, 7e9 are provided on the insulating films 7a3, 7a5, 7a7, 7a9, respectively. Moreover, the insulating films for discharge 7b2, 7b4, 7b6, 7b8 are provided on and in contact with the insulating films 7e3, 7e5, 7e7, 7e9, and they are formed of a silicon-rich silicon oxide film or a silicon oxynitride (SiON) film, respectively. The insulating films 7b2, 7b4, 7b6, 7b8 are in contact with the side surfaces of the wiring 6d of the respective wiring layers M1 to M4. In Embodiment 7, similar effects as those achieved in the foregoing Embodiments 1, 2 can be obtained by the provision of the insulating film 7b. Likewise, in Embodiment 7, similar effects as attained in Embodiment 3 can be obtained by selective provision of the insulating film 7b in the wiring layers M1 to M4 using copper as a main wiring material, like the foregoing Embodiment 3. It will be noted that the element layer and the wiring layer 5, respectively, are the same as those of the foregoing Embodiment 6 and are not repeatedly explained here.

Figure 52:
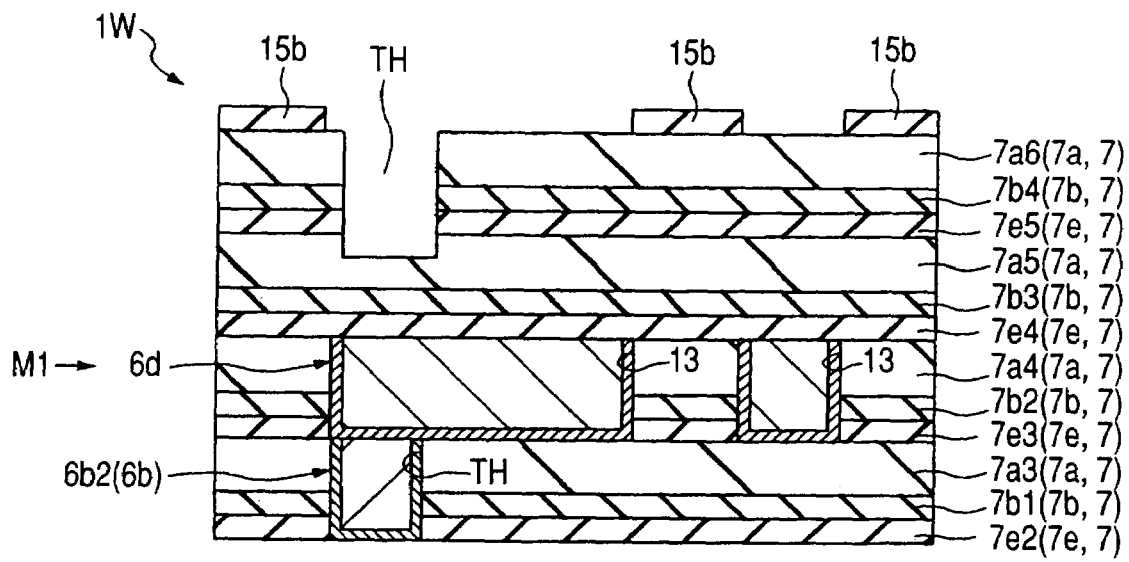
FIG. 52 is a sectional view of a typical portion of a wafer in the course of manufacture of the semiconductor device of FIG. 51.
Figure 53:
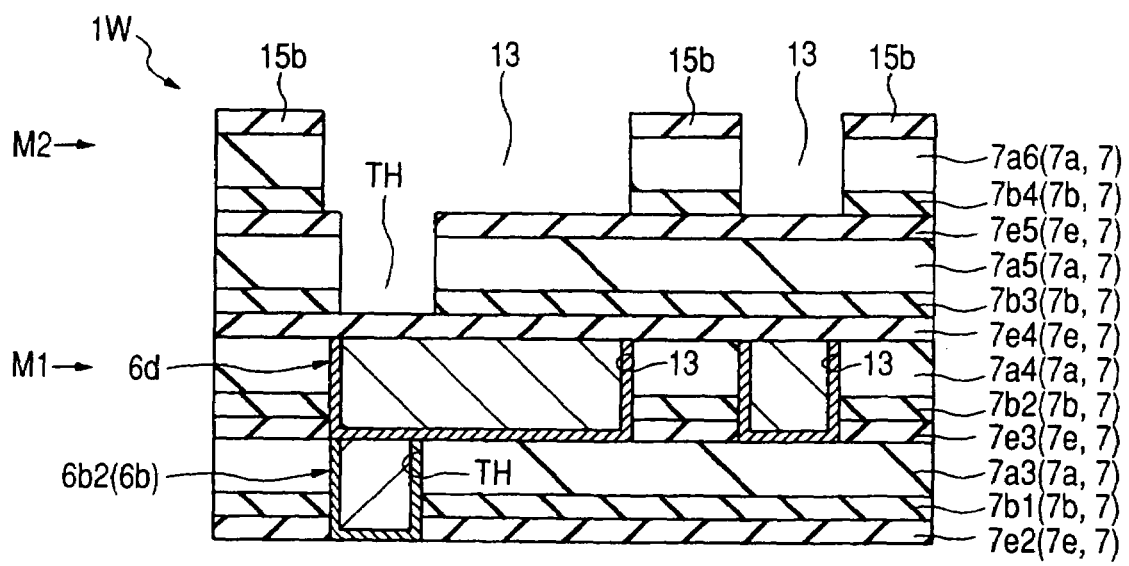
FIG. 53 is a sectional view of a typical portion of the wafer in the source of manufacture of the semiconductor device subsequent to FIG. 52.
Figure 54:
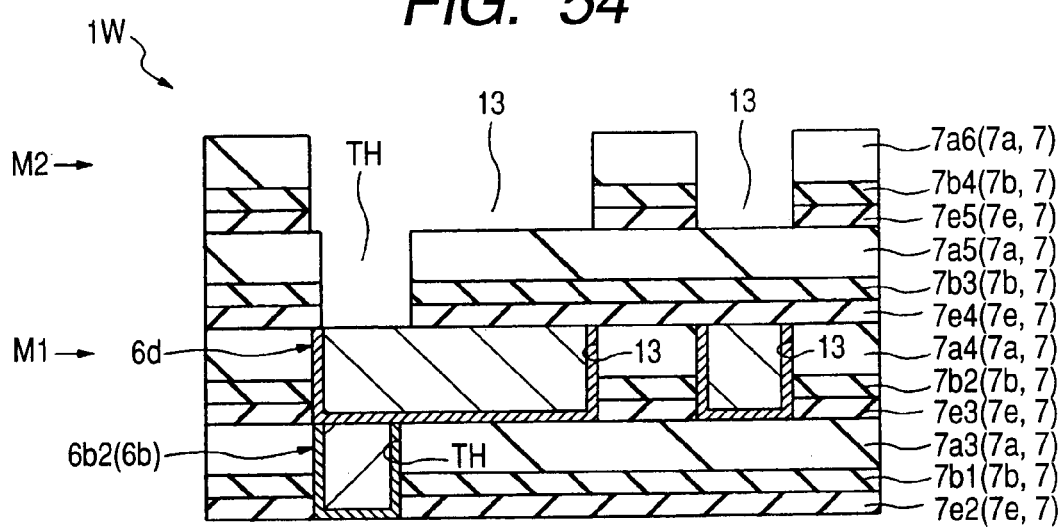
FIG. 54 is a sectional view of a typical portion of the wafer in the course of manufacture of the semiconductor device subsequent to FIG. 53.
Figure 55:
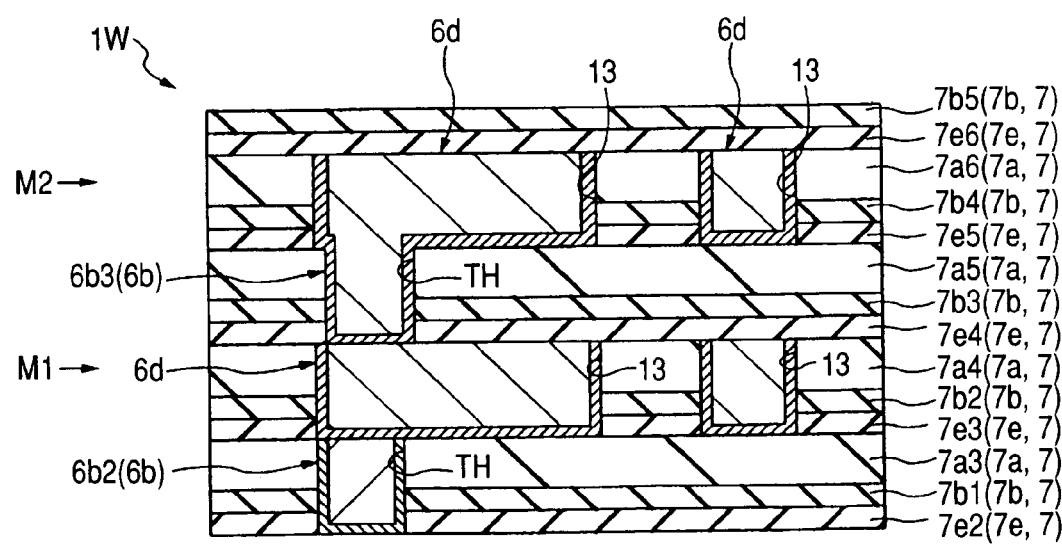
FIG. 55 is a sectional view of a typical portion of the wafer in the course of manufacture of the semiconductor device subsequent to FIG. 54.

Next, an example of a method of manufacturing the semiconductor device according to Embodiment 7 will be described. FIG. 52 is a sectional view of the wafer 1W obtained after completion of similar steps illustrated with reference to FIGS. 43 to 46 in connection with Embodiment 6. The material selected for an insulating film 15b is the same as that used, for example, as the insulating film 7e (7e2 to 7e5) and includes, for example, silicon nitride, silicon carbide, silicon carbide nitride, or the like. The through-hole TH at this stage passes through the insulating films 7b4, 7e5 but is not fully opened. The bottom of the through-hole TH is stopped at an intermediate portion of the insulating film 7a5 along the thickness direction thereof. Subsequently, the insulating films 7a6, 7a5 are selectively etched under such conditions that the insulating film 15b is used as a mask and the insulating films 7e4, 7e5 function as an etching stopper, thereby forming the wiring groove 13 and the through-hole TH, as shown in FIG. 53. The through-hole TH of this stage is not fully opened as well, with its bottom being stopped at the insulating film 7e4. Thereafter, the insulating films 15b, 7e5, 7e4 are selectively etched to complete the wiring groove (an opening for wiring) 13 and the through-hole (an opening for wiring) TH. Part of the upper surface of the wiring 6d of the wiring layer M1 is exposed from the bottom of the through-hole TH. Next, like the foregoing Embodiment 6, the wiring 6d of a buried structure is formed in the wiring layer M2, as shown in FIG. 55. Then, as main purpose for suppressing and preventing copper from being diffused, after plasma treatment of the CMP surface in an atmosphere of ammonia or hydrogen gas, the insulating film 7e6 is deposited on the main surface of the wafer 1W by a CVD method, while being in contact with the upper surface of the wiring layer M2, followed by further deposition of the insulating film 7b5 by a CVD method.

In Embodiment 7, if an electric charge is accumulated such as in the wiring 6d or the like during various processing procedures (including, for example, cleaning, plasma treatment and the like) in the course of the manufacture, the charge can escape from the side surfaces of the plug 6d or the side surfaces of the plug 6b connected thereto via the insulating film 7b to the ground potential, thereby permitting the charge to be discharged at a stage of low accumulation in the wiring 6d. Thus, the heat release value caused by the discharge can be suppressed to a low level. This results in suppression or prevention of the short-circuiting failure between the wirings 6d, 6d, made of copper for a main wiring material, in the wiring layers M1, M2.

Embodiment 8

Figure 56:
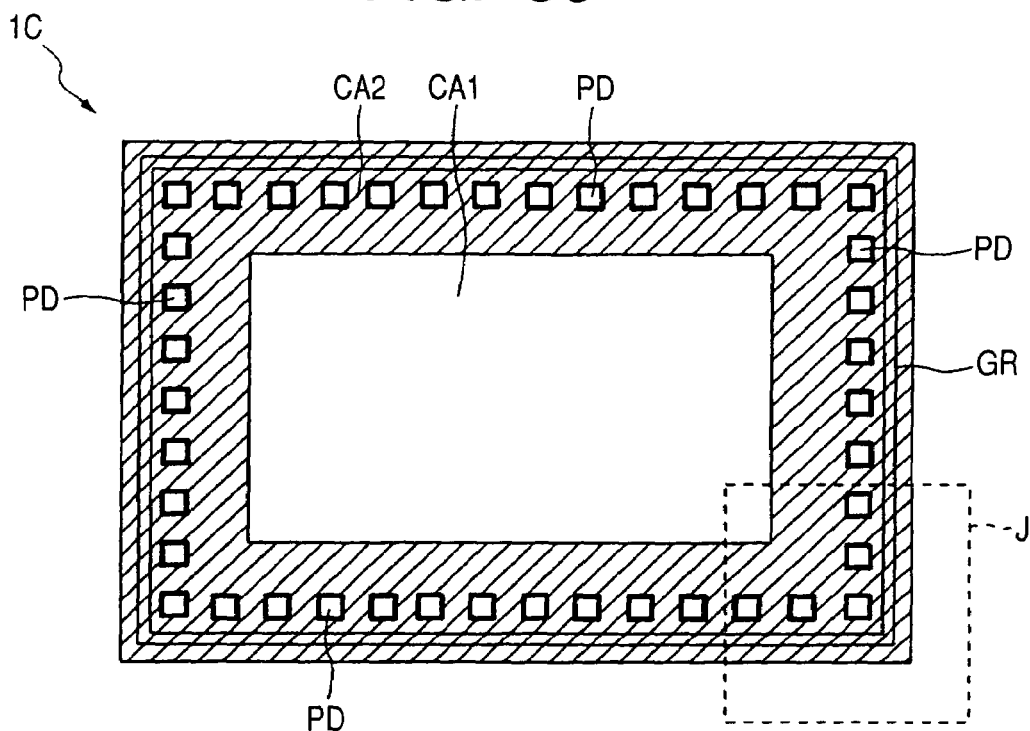
FIG. 56 is a plan view of a semiconductor chip of a semiconductor device according to another embodiment of the invention.
Figure 58:
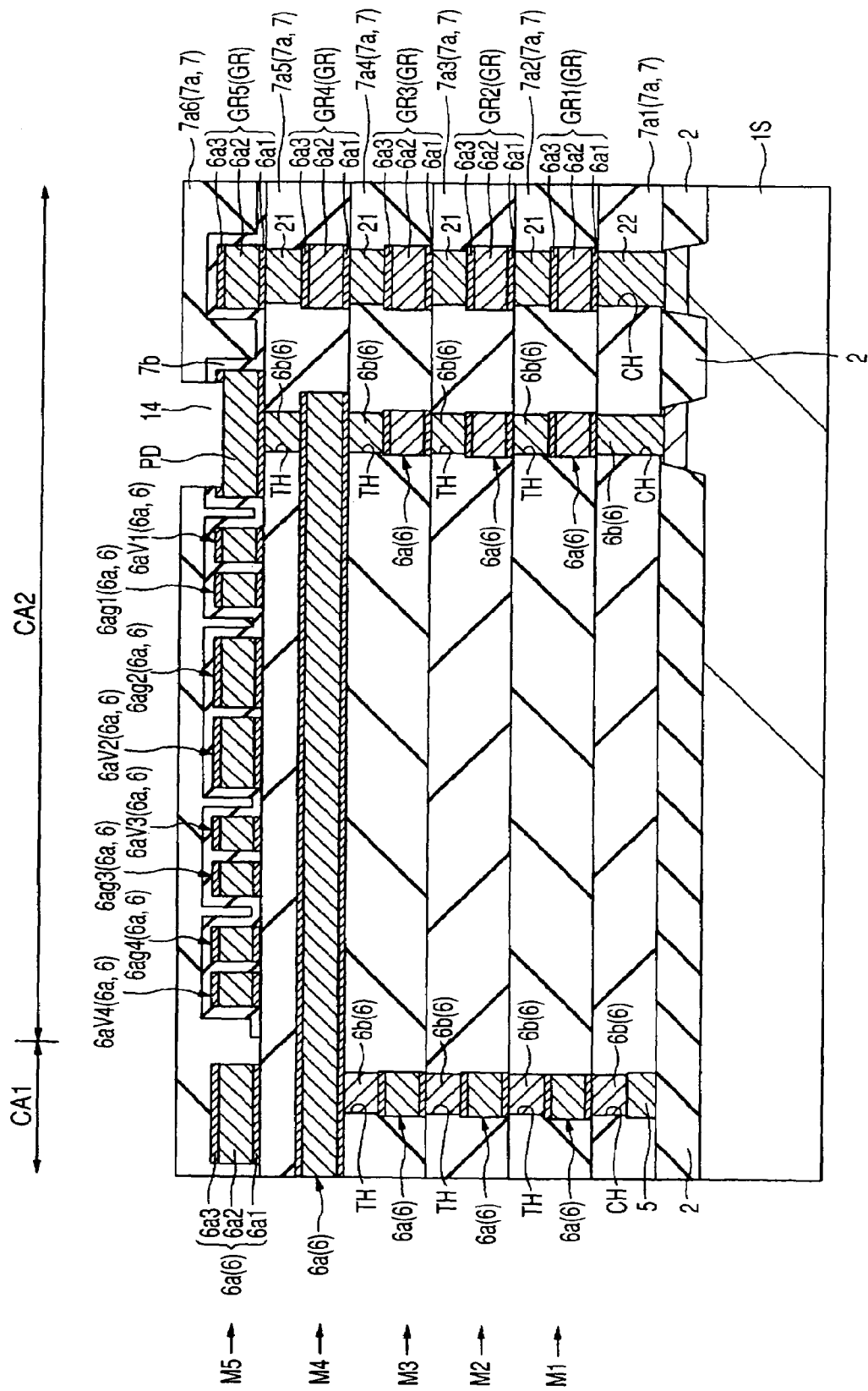
FIG. 58 is a sectional view taken along line X2-X2 in FIG. 57.
Figure 59:
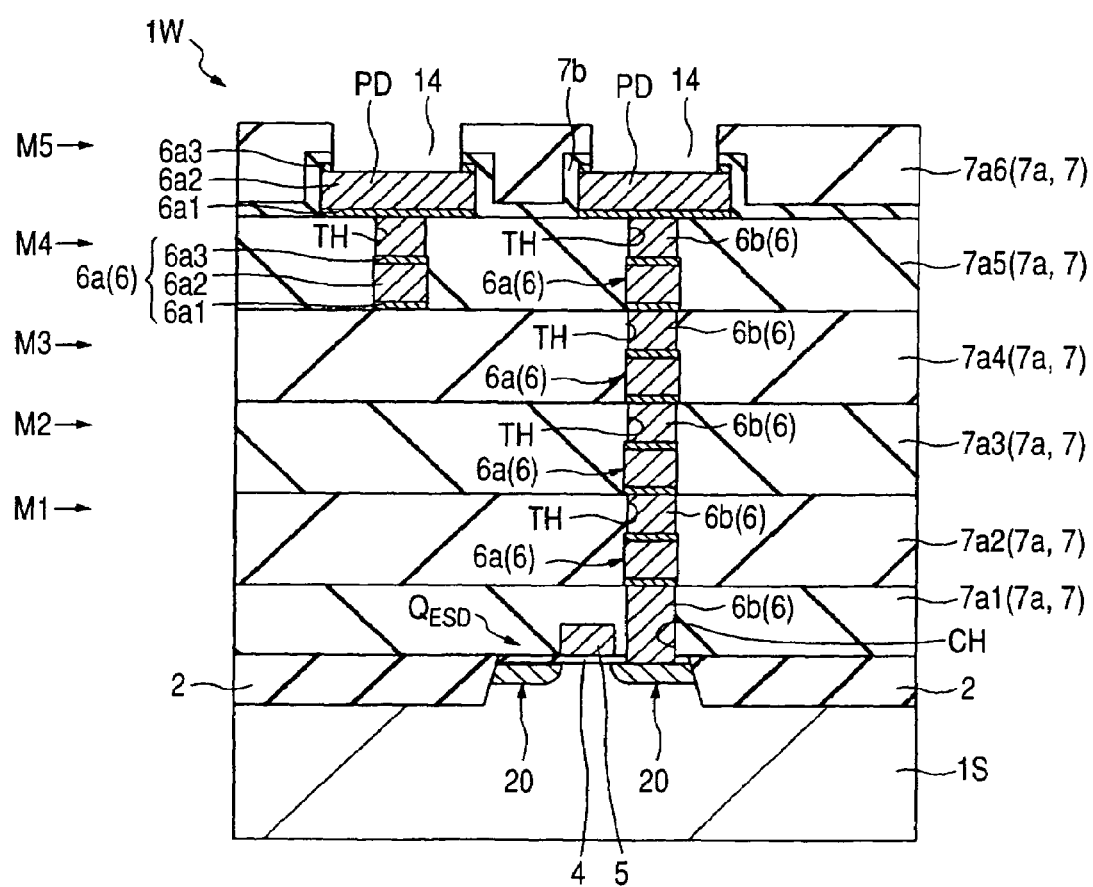
FIG. 59 is a sectional view taken along line Y1-Y1 in FIG. 57.

In Embodiment 8, an example of application of the invention to a measure for static breakage will be considered. FIG. 56 is a plan view of the overall arrangement of a semiconductor chip IV of a semiconductor device of Embodiment 8, FIG. 57 is an enlarged, plan view of region J in FIG. 56, FIG. 58 is a sectional view, taken along line X2-X2 of FIG. 57, and FIG. 59 is a sectional view, taken along line Y1-Y1 of FIG. 57.

Figure 57:
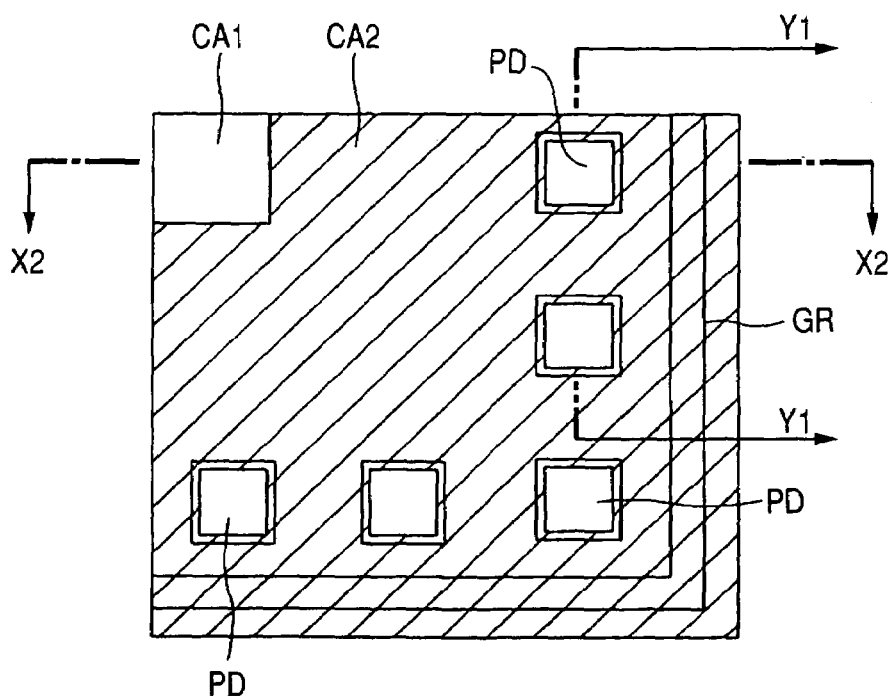
FIG. 57 is an enlarged plan view of the region J of FIG. 56.

At the center of a square planar semiconductor chip IC, a square planar internal circuit region CA1 is arranged (i.e. a non-hatched region at the center of FIG. 5 and at the left upper portion of FIG. 57). A plurality of processors, such as, for example, a DSP (digital signal processor) and the like, are arranged at the internal circuit region CA1 and the respective processors are so arranged that parallel operations can be performed, while sharing a diversity of processings at the same time. To increase the processing power by carrying out parallel operations of a multitude of instructions and data ensures a real time, high-speed operation of a desired processing, such as image processing. A peripheral circuit region CA2 is arranged from the outer periphery of the internal circuit region CA1 to the outer periphery of the semiconductor chip 1C (i.e. a hatched region of FIGS. 56 and 57).

At the peripheral circuit region CA2, there are arranged a plurality of input and output circuit cells, a plurality of cells (external terminals) PD and a guard ring GR provided therearound. The respective input and output circuit cells have, for example, aside from an input circuit, an output circuit or an input and output bi-directional circuit, various interface circuits, such as a protection circuits for preventing static breakage. The pads PD are arranged at given intervals along the outer periphery of the semiconductor chip 1C. The pads PD include pads for signals and pads for power supply. The pads PD for signals are disposed in every input and output circuit cell. The pads Pd for signals are electrically connected to the semiconductor regions 20 for source and drain of a MISQ ESD forming a protection circuit for preventing static breakage via the plug 6b and the wiring 6a of the respective wiring layers M1 to M4. The guard ring GR (GR1 to GR5) not only serves to suppress or prevent impurities and moisture from entering from the outside and also to terminate cracks of insulating films extending from the outer periphery, but also provides a path for permitting an electric charge accumulated in the wiring 6a in Embodiment 8 to escape to the substrate 1S. The guard ring GR has the same arrangement as the wiring 6a, and it is formed as a frame in a plane along the outer periphery of the semiconductor chip 1C. In section, the guard rings GR are formed in all the wiring layers M1 to M5, and they are mutually connected with one another through the conductor films 21 within the through-holes TH and also to the substrate 1S via the conductor film 22 within the contact hole CH. Wirings 6av1 to 6av4, 6ag1 t 6ag4 (6a, 6) of the uppermost wiring layer M5 in the peripheral circuit region CA2 indicate wirings for peripheral circuit power supply, respectively. The wirings 6av1 to 6av3 indicate a wiring for a high potential power supply voltage, for example, of about 3.3 V, and the wiring 6av4 indicates a wiring for a high potential power supply voltage, for example, of about 1.2 V. The wirings 6ag1 to 6ag4 indicate those wirings for a reference potential power supply voltage, for example, of 0 (zero) V. The wirings 6av1 to 6av4 and 6ag1 to 6ag4 (6a, 6) are arranged in the form of a frame to surround the internal circuit region CA1 along the outer periphery of the semiconductor chip 1C.

In Embodiment 8, the insulating film 7b for discharge is patterned by lithography and dry etching so as to cover the peripheral circuit CA2 alone, as is particularly shown as the hatched portion in FIGS. 56 and 57. The insulating film 7b is provided only in the uppermost wiring layer M5, and it is deposited in contact with and covers a plurality of wirings 6a of the peripheral circuit region CA2 of the uppermost wiring layer M5, a plurality of pads PD and the guard ring GR5. The provision of the insulating film 7b in this way permits a charge (static electricity) passing from outside of the semiconductor chip IC to a given pad PD to be dispersed via the insulating film 7b into other pads PD, the guard ring GR5 and the wirings 6a and to escape to the substrate 1S. In this manner, the static breakage of the elements formed over the substrate 1S can be suppressed or prevented. Moreover, the protection circuits for static breakage can be reduced in number and occupation area. In addition, the protection circuit per se may not be necessary. Currently, because multistage protection circuits for preventing static breakage are provided in every input and output circuit cell or the area of each protection circuit is increased, both to obtain a satisfactory protecting effect, the chip size undesirably increases. According to Embodiment 8, however, the protection circuit area can be reduced or eliminated, thus resulting in a reduction of the chip size. Using the semiconductor device of Embodiment 8, it becomes increasingly possible to facilitate the miniaturization and portability of electronic instruments. The reason why the insulating film 7b is provided only at the uppermost wiring layer M5 is that the uppermost wiring layer M5 is the nearest portion where a charge passes from outside of the semiconductor chip 1C and is most effective for eliminating the charge. It should be noted that the invention is not limited to this forming position of the insulating film 7b, but many alterations may be possible. For instance, the insulating film 7b may be provided, for example, in all the wiring layers M1 to M5, respectively, or it may be provided in more than two selected layers. The insulating film 7b is provided at the peripheral circuit CA2 alone, for the reason that the elements of the internal circuit region CA1 do not suffer any static influence. In addition, the insulating film 7b may be patterned so as to cover the pad PD alone or the pad Pd and the guard ring GR alone in contact therewith.

Figure 60:
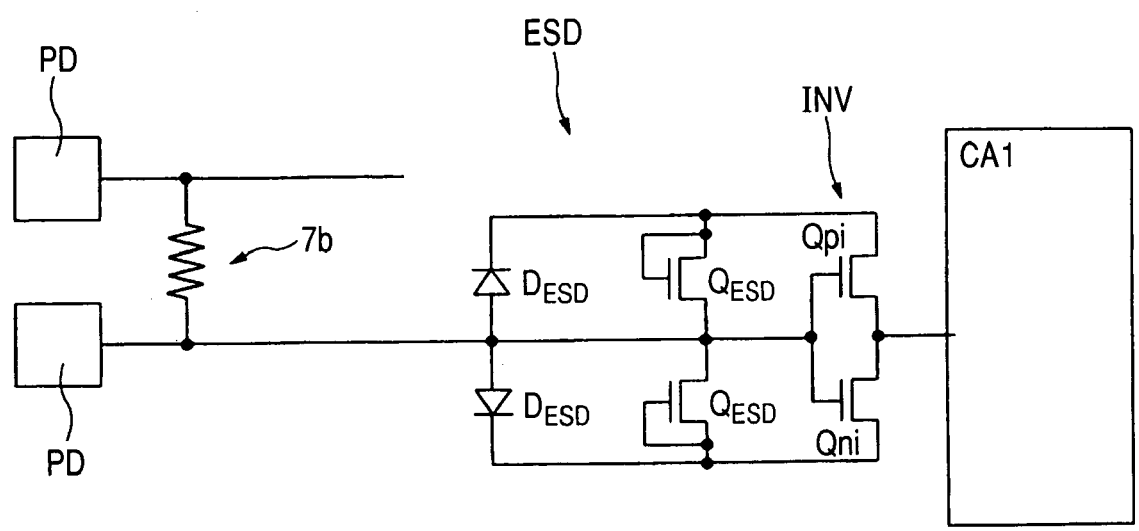
FIG. 60 is a circuit diagram of an example of an input and output circuit of a semiconductor device according to another embodiment of the invention.

FIG. 60 shows an example of a circuit arrangement of the peripheral circuit region of the semiconductor device of Embodiment 8. The pad PD is electrically connected to the protection circuit ESD for static breakage protection and to an inverter circuit INV for input circuit. The protection circuit ESD is one which protects the internal circuits from suffering from an overvoltage ascribed to static electricity, and diode DESD and MISQ ESD are exemplified as such a protection circuit ESD. The MISQ ESD in the is arranged to function similarly to a diode-connected diode. The inverter circuit INV has a pMISQpi and a nMISQni, with its output being electrically connected to the internal circuit. In Embodiment 8, the insulating film 7b is arranged as described above, so that when a high voltage (which is higher than the operation voltage of the semiconductor device) is applied between adjacent pads PD owing to the static action, the adjacent pads PD are electrically connected with each other through the insulating film 7b.

Figure 61:
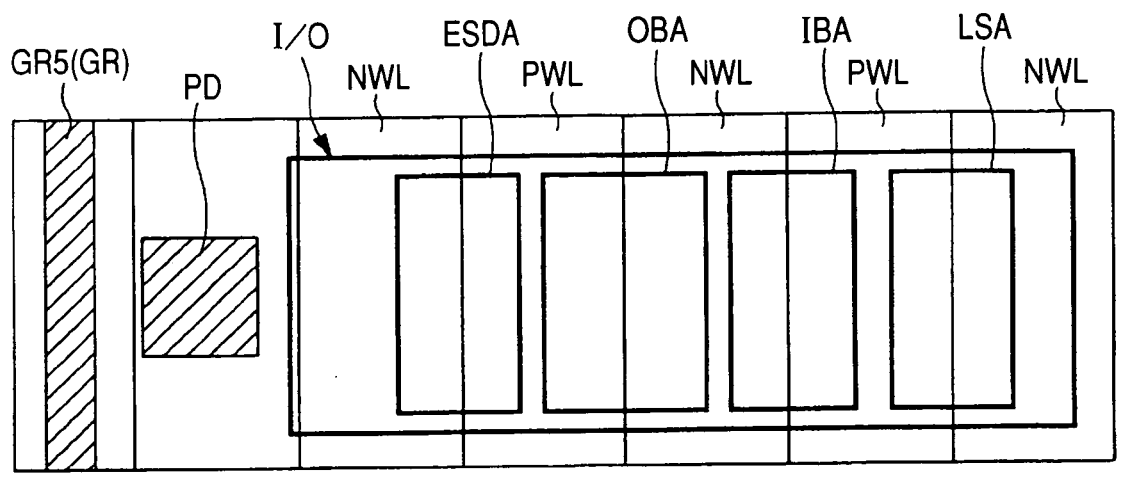
FIG. 61 is a plan view of a typical portion showing a device layout of an input and output circuit cell of a semiconductor device according to another embodiment of the invention.
Figure 62:
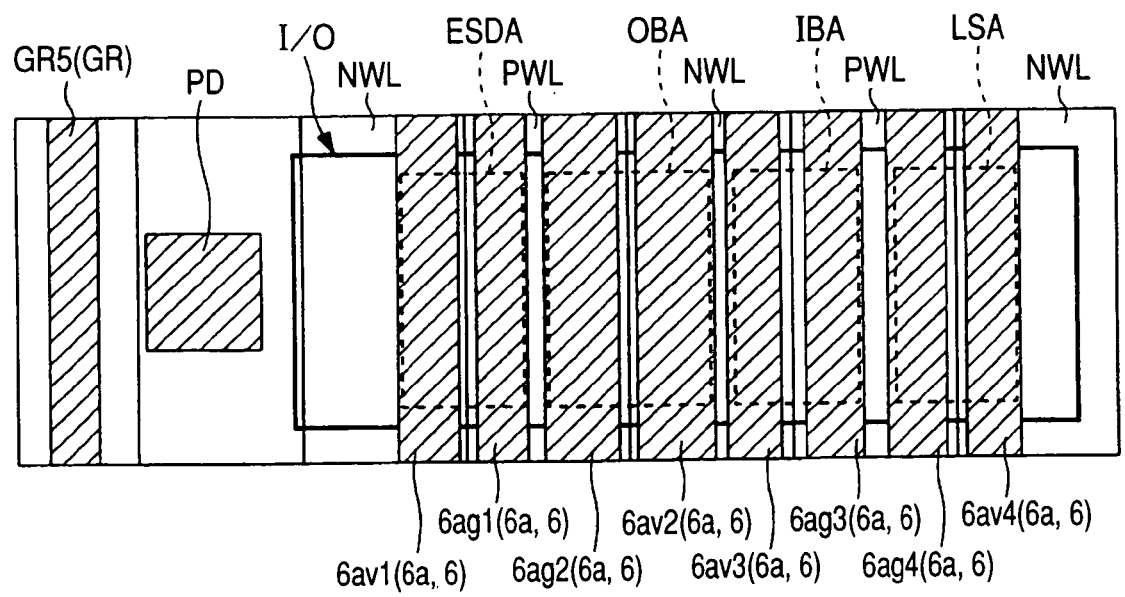
FIG. 62 is a plan view of a typical portion showing the peripheral power supply device laid out in FIG. 61.

FIG. 61 shows an example of a device layout of the input and output circuit cell I/O, and FIG. 62 is a plan view wherein wirings for a peripheral circuit power supply are added to the arrangement of FIG. 61. Reference numeral NWL in FIGS. 61 and 62 indicates an n-well, and reference numeral PWL indicates a p-well. The n-wells NWL and the p-wells PWL are arranged in the form of a frame along the peripheral circuit power supply wirings. The input and output circuit cell I/O collectively has a series of circuits necessary for an interface for internal circuits and the outside, such as an input and output buffer. The interface between the signal from the outside (e.g. 3.3 V) and an internal signal (e.g. 1.2 V) is performed through the input and output circuit cell I/O. This requires the input and output circuit cell I/O to be located in the vicinity of the pads PD. In addition, it is necessary that at least two power supply voltages be supplied to the input and output circuit cell I/O. At the protection circuit region nearest to the pad PD, the protection circuit ESD is disposed. An output circuit is arranged at a subsequent-stage output buffer circuit region OBA, and an input circuit, such as the above-mentioned inverter circuit INV or the like, is arranged at an input buffer circuit region IBA, both being operated at a power supply voltage of about 3.3 V. A level shifter circuit region LSA provided in a subsequent stage is one wherein a circuit for converting the voltage level of the input and output signal is arranged, and it is operated at power supply voltage of about 1.2 V. And, a pMIS constituting a circuit of each peripheral circuit region is arranged to the n-well NWL, and a nMIS is disposed at the p-well PWL. The power supply voltages applied to the respective circuits of the peripheral circuit region CA2 are supplied from the wirings 6av1 to 6av4 and 6ag1 to 6ag4.

Although the invention has been particularly described based on various exemplary embodiments, the invention should not be construed as limited to these embodiments, and many alterations may be possible without departing from the spirit of the invention.

For instance, the method of forming the insulating film 7b having such a structure as set out in the foregoing Embodiment 2 may be carried out in the following way. For example, a plasma is formed in an atmosphere containing a silane gas, for example, and the insulating film 7a is exposed to the atmosphere of the plasma on the surface thereof to form a silicon-rich insulating film on the surface layer of the insulating film 7a. Alternatively, a plasma may be formed in an atmosphere containing nitrogen, followed by exposing the surface of the insulating film 7a to the plasma atmosphere to form a silicon oxynitride film on the surface layer of the insulating film.

Further, although a connection structure wherein bonding wires are connected to the pads has been illustrated in connection with the foregoing Embodiments 1 to 8, the invention is not limited to this structure, but may be applied to a semiconductor device having connection structure wherein bump electrodes are connected to the pad.

Likewise, although the provision of the insulating film 7b only at the peripheral circuit region in the foregoing Embodiment 8 has been proposed, the insulating film 7b may be provided, for example, in the internal circuit region so as to permit an electric charge in the wirings in the course of manufacture to be discharged. In this case, the insulating film 7b of the peripheral, circuit region and the insulating film in the internal circuit region are separated even in the same layer. This not only allows the charge in the wiring during the course of manufacture of a semiconductor device to escape, but it also enables one to disperse a charge generated by the static action at the outside of a semiconductor chip. Because the insulating film 7b is isolated between the peripheral circuit region and the internal circuit region, an electric charge electrostatically generated at the outside of the semiconductor chip can be prevented from transmitting through the insulating film 7b.

Although applications to semiconductor devices having a MIS or a logic circuit, which are in the field of utility serving as the background of the invention made by us, have been considered, the invention should not be construed as limited thereto. For instance, the invention is applicable to semiconductor devices having memory circuits, such as, for example, a DRAM (dynamic random access memory), a SRAM (static random access memory), a flash memory (EEPROM: electrically erasable programmable read only memory) and the like, or to consolidated semiconductor devices wherein such a memory circuit as indicated above and a logic circuit are disposed on the same substrate. Alternatively, the invention may be applied to a semiconductor device having a bipolar transistor.

The effects obtained by a typical embodiment according to the invention is briefly described below.

When an insulating film having high conductivity is formed between a wiring that is electrically connected to a semiconductor substrate and a floating wiring, the charge accumulated in the floating wiring in the course of manufacture of a semiconductor device is allowed to be discharged to the electrically connected wiring. Thus, the short-circuiting failure between the wirings can be suppressed or prevented from occurring.

The effects obtained by a typical embodiment according to the invention is briefly described below.

Because an insulating film in a wiring structure of the semiconductor device has a function of permitting an electric charge accumulated in the wiring to escape, the short-circuiting failure ascribed to the discharge of the charge in the wiring can be suppressed or prevented from occurring.

The invention claimed is:

1. A method of manufacturing a semiconductor device comprising the steps of:
   (a) forming MISFETs in a semiconductor substrate;
   (b) forming a first insulating film over said MISFETs;
   (c) forming a first wiring and a second wiring over said first insulating film;
   (d) after said step (c), forming a second insulating film connected to said first and second wirings;
   (e) after said step (d), forming a third insulating film over said second insulating film;
   (f) after said step (e), cleaning a surface of said third insulating film;
   (g) after said step (f), forming a plurality of holes in said second and third insulating films; and
   (h) after said step (g), forming a third wiring over said third insulating film such that said third wiring is connected to said first and second wirings via said holes,
   wherein before said step (h), said first wiring is in a floating state and said second wiring is connected to said semiconductor substrate,
   wherein a silicon content of said second insulating film is higher than that of said third insulating film,
   wherein said step (c) comprises the steps of:
   (c1) forming a first titanium nitride film over said first insulating film;
   (c2) forming an aluminium film or aluminium alloy film over said first titanium nitride film;
   (c3) forming a second titanium nitride film over said aluminium or aluminium alloy film; and
   (c4) patterning said first titanium nitride film, said aluminium or aluminium alloy film and said second titanium nitride film, and
   wherein, in said step (d), said second insulating film is connected to said aluminium film or aluminium alloy film of said first and second wirings.

2. The method according to claim 1,
   wherein, in said step (f), an accumulated electric charge is discharged from said first wiring to said second wiring through said second insulating film.

3. The method according to claim 1, further comprising a step of polishing said third insulating film between said steps (e) and (f).

4. The method according to claim 1,
   wherein, in said step (f), a brush is used for said cleaning.

5. The method according to claim 1,
   wherein said second insulating film and said third insulating film are, respectively, formed by a chemical vapor deposition method, and
   wherein a flow rate of a silane gas used for the formation of said second insulating film is larger than a flow rate of silane gas used for the formation of said third insulating film.

6. The method according to claim 5,
   wherein said second and third insulating films are formed with a same apparatus.

7. The method according to claim 1,
   wherein said second insulating film is formed of a silicon-rich silicon oxide film.

8. The method according to claim 7,
   wherein said third insulating film is formed of a silicon oxide film.

9. The method according to claim 1,
   wherein the length of said first wiring is longer than the length of said second wiring.

10. The method according to claim 9,
    wherein the length of said first wiring is 500 μm or over.

11. The method according to claim 9,
    wherein the pitch between said first wiring and said second wiring is 0.8 μm or below.

12. The method according to claim 1,
wherein, in said step (g), said second insulating film has a function as an etching stopper film.

13. A method of manufacturing a semiconductor device comprising the steps of:
(a) forming MISFETs in a semiconductor substrate;
(b) forming a first insulating film over said MISFETs;
(c) forming a first wiring and a second wiring over said first insulating film;
(d) after said step (c), forming a second insulating film connected to said first and second wirings;
(e) after said step (d), forming a third insulating film over said second insulating film;
(f) after said step (e), cleaning a surface of said third insulating film;
(g) after said step (f), forming a plurality of holes in said second and third insulating films; and
(h) after said step (g), forming a third wiring over said third insulating film such that said third wiring is connected to said first and second wirings via said holes,
wherein before said step (h), said first wiring is in a floating state and said second wiring is connected to said semiconductor substrate,
wherein said first insulating film comprises a silicon, an oxygen and a nitrogen,
wherein said step (c) comprises the steps of:
(c1) forming a first titanium nitride film over said first insulating film;
(c2) forming an aluminium film or aluminium alloy film over said first titanium nitride film;
(c3) forming a second titanium nitride film over said aluminium film; and
(c4) patterning said first titanium nitride film, said aluminium or aluminium alloy film and said second titanium nitride film, and
wherein, in said step (d), said second insulating film is connected to said aluminium film or aluminium alloy film of said first and second wirings.

14. The method according to claim 13,
wherein, in said step (f), an accumulated electric charge is discharge from said first wiring to said second wiring through said second insulating film.

15. The method according to claim 13, further comprising a step of polishing said third insulating film between said steps (e) and (f).

16. The method according to claim 13,
wherein, in said step (f), a brush is used for said cleaning.

17. The method according to claim 13,
wherein said second insulating film is formed of a silicon oxynitride film.

18. The method according to claim 17,
wherein said third insulating film is formed of a silicon oxide film.

19. The method according to claim 13,
wherein the length of said first wiring is longer than the length of said second wiring.

20. The method according to claim 19,
wherein the length of said first wiring is 500 µm or over.

21. The method according to claim 19,
wherein the pitch between said first wiring and said second wiring is 0.8 µm or below.

22. The method according to claim 13,
wherein, in said step (g), said second insulating film has a function as an etching stopper film.

* * * * *